United States Patent
Fukae et al.

(10) Patent No.: US 10,200,007 B2
(45) Date of Patent: Feb. 5, 2019

(54) FILTER CHIP

(71) Applicant: ROHM CO., LTD., Kyoto (JP)

(72) Inventors: Keisuke Fukae, Kyoto (JP); Yasuhiro Kondo, Kyoto (JP); Katsuya Matsuura, Kyoto (JP); Hiroyuki Okada, Kyoto (JP); Junya Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 144 days.

(21) Appl. No.: 15/212,221

(22) Filed: Jul. 16, 2016

(65) Prior Publication Data
US 2017/0019083 A1    Jan. 19, 2017

(30) Foreign Application Priority Data

Jul. 17, 2015    (JP) .................................. 2015-143327
Jul. 1, 2016     (JP) .................................. 2016-131743

(51) Int. Cl.
H03H 7/06      (2006.01)
H03H 1/02      (2006.01)
H03H 1/00      (2006.01)

(52) U.S. Cl.
CPC ............... *H03H 7/06* (2013.01); *H03H 1/02* (2013.01); *H03H 2001/0085* (2013.01)

(58) Field of Classification Search
CPC ..... H03H 2001/0085; H03H 7/06; H03H 1/02
USPC ....................... 333/172, 175, 185; 361/306.3
See application file for complete search history.

(56) References Cited

U.S. PATENT DOCUMENTS

| | | | | |
|---|---|---|---|---|
| 4,476,518 A | * | 10/1984 | Tsukahara | ................ H01G 2/12 361/304 |
| 6,160,461 A | | 12/2000 | Azuma et al. | |
| 2011/0043963 A1 | * | 2/2011 | Bultitude | ................ H01G 2/16 361/321.4 |
| 2015/0042440 A1 | | 2/2015 | Tsurumi et al. | |

FOREIGN PATENT DOCUMENTS

JP    H10-322157 A    12/1998

OTHER PUBLICATIONS

On Semiconductor, "2 Channel Headset Speaker EMI Filter with ESD Protection", Semiconductor Components Industries, LLC, CSPEMI201AG/D, May, 2011.

* cited by examiner

*Primary Examiner* — Rakesh Patel
(74) *Attorney, Agent, or Firm* — Rabin & Berdo, P.C.

(57) ABSTRACT

A filter chip includes a substrate, a plurality of external terminals formed on the substrate for external connection, and a plurality of passive element forming regions provided in the regions between the plurality of external terminals in plan view when viewed along a direction normal to the surface of the substrate, the plurality of passive element forming regions including at least a resistor forming region where a resistor is formed. The resistor forming region includes a resistive conductive film formed on the substrate with one end and the other end thereof electrically connected to different ones of the external terminals, and a fuse portion integrally formed with the resistive conductive film. The fuse portion is cuttably provided to electrically connect a part of the resistive conductive film to the external terminals, or to electrically separate a part of the resistive conductive film from the external terminals.

19 Claims, 35 Drawing Sheets

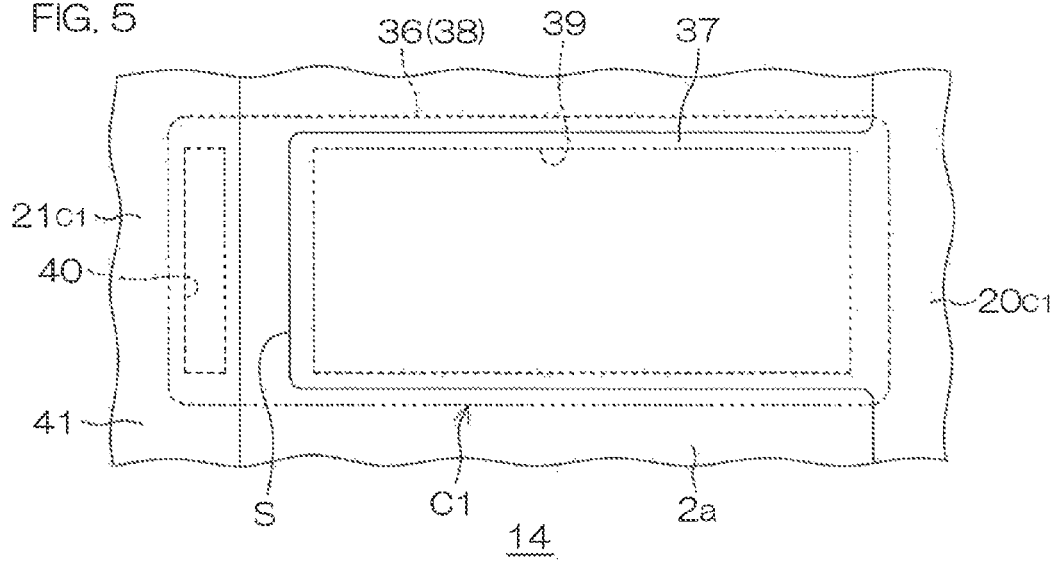
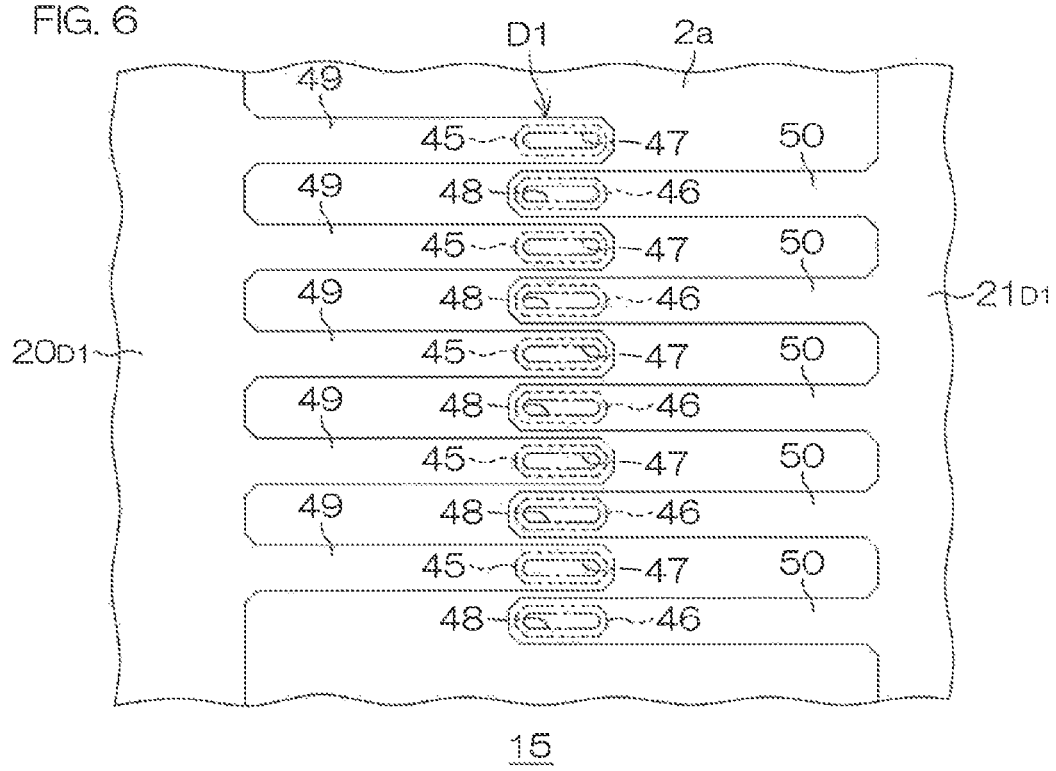

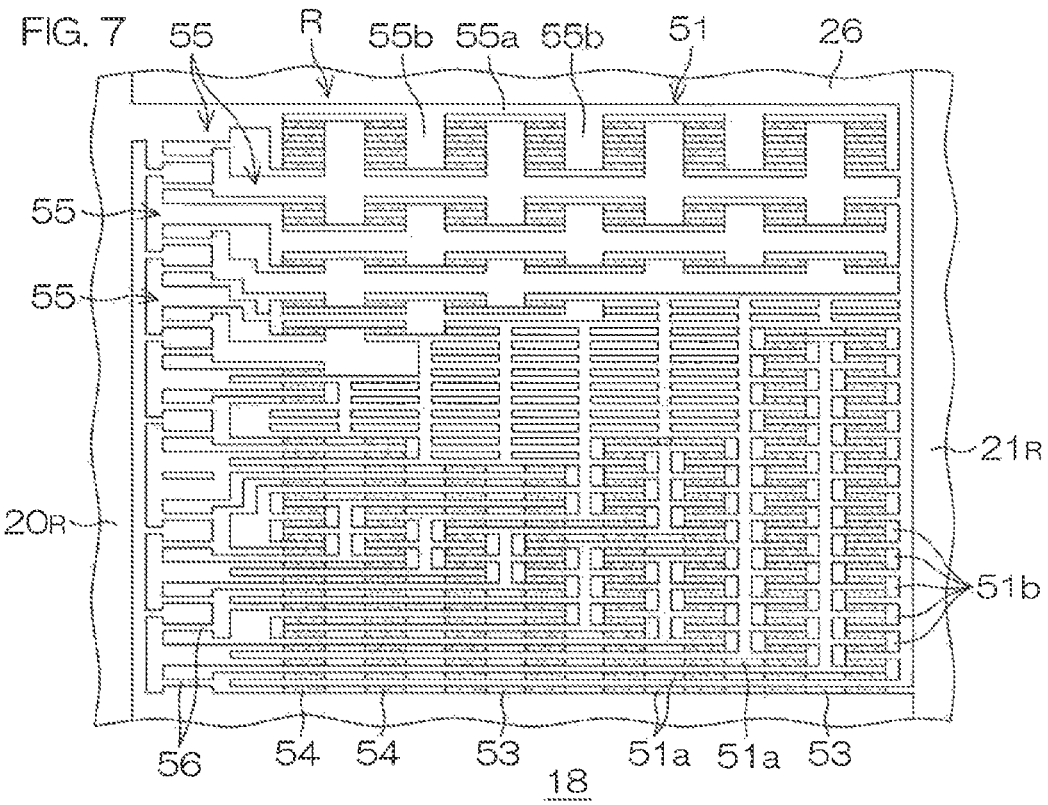
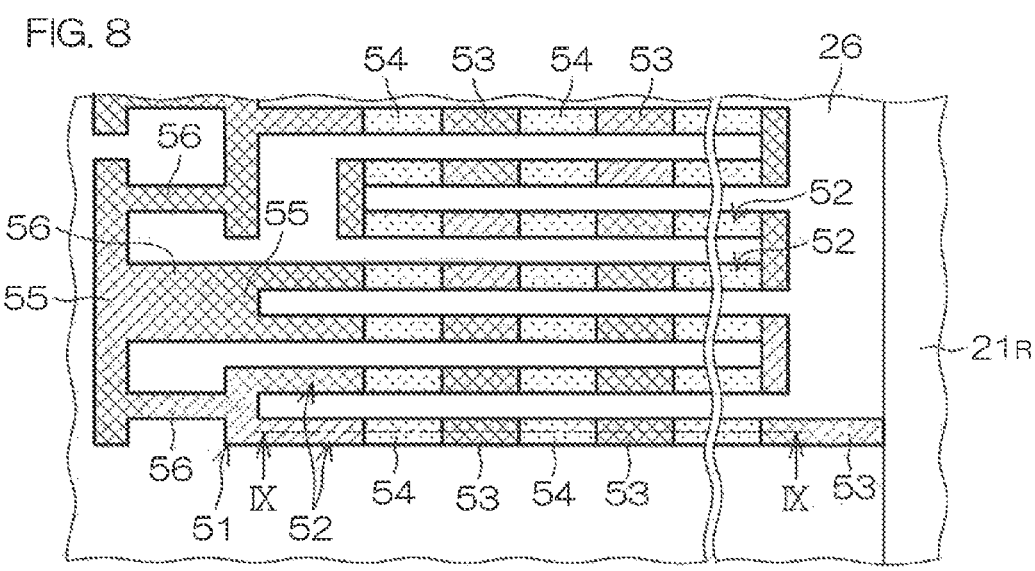

XLVI-XLVI

XLVI-XLVI

FILTER CHIP

CROSS-REFERENCE TO RELATED APPLICATIONS

This application corresponds to Patent Application No. 2015-143327 submitted to Japanese Patent Office on Jul. 17, 2015, and Patent Application No. 2016-131743 submitted to Japanese Patent Office on Jul. 1, 2016, and the entire contents of these applications are hereby incorporated by reference.

TECHNICAL FIELD

The present invention relates to a filter chip including a plurality of passive element forming regions.

BACKGROUND ART

A patent literature 1 (Japanese Unexamined Patent Application Publication 10-322157) discloses a noise filter equipped with a coil conductor, a resistive element, and a capacitor conductor.

SUMMARY OF THE INVENTION

An object of the present invention is to provide a filter chip capable of minimizing an error relative to a required element value of a passive element thereby achieving favorable frequency characteristics.

BRIEF DESCRIPTION OF THE DRAWINGS

FIG. 5 is a plan view of a capacitor forming region shown in FIG. 2.

FIG. 6 is a plan view of a diode forming region shown in FIG. 2.

FIG. 7 is a plan view of a resistor forming region shown in FIG. 2.

FIG. 8 is a plan view enlarging a portion of the resistor forming region shown in FIG. 7.

DESCRIPTION OF EMBODIMENTS

Figure 1:
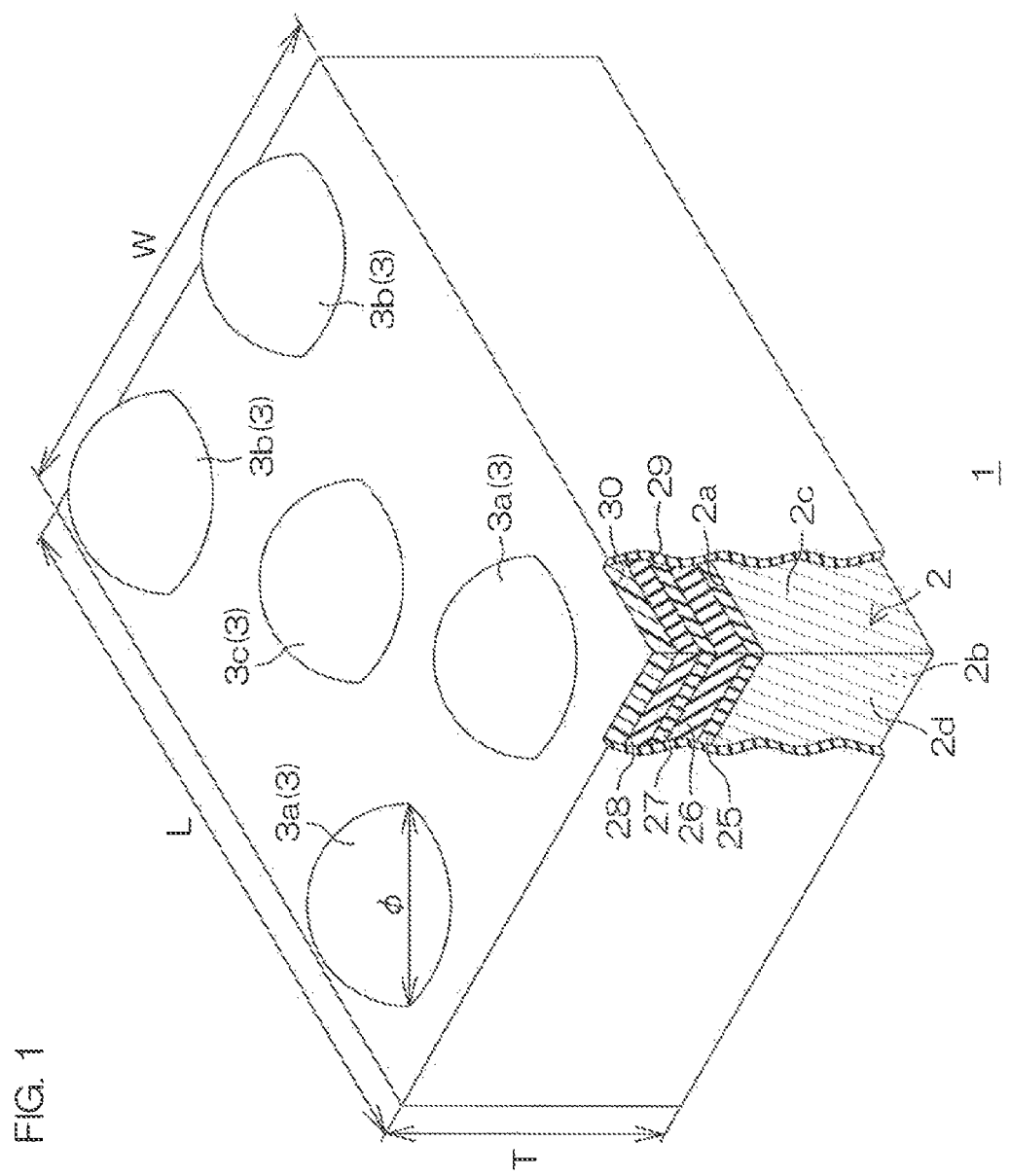
FIG. 1 is a partially notched perspective view of a filter chip according to a first embodiment of the present invention.

A filter chip according to an aspect of the present invention for achieving the above-described object includes a substrate, a plurality of external terminals formed on the substrate for external connection, and a plurality of passive element forming regions provided in the regions between the plurality of external terminals in plan view when viewed along a direction normal to the surface of the substrate, the plurality of passive element forming regions including at least a resistor forming region where a resistor is formed. The resistor forming region includes a resistive conductive film formed on the substrate with one end and the other end thereof electrically connected to different ones of the external terminals, and a fuse portion integrally formed with the resistive conductive film. The fuse portion is cuttably provided to electrically connect a part of the resistive conductive film to the external terminals, or to electrically separate a part of the resistive conductive film from the external terminals.

With this configuration, a part of the resistive conductive film is electrically connected to the external terminals or electrically separated from the external terminals, and thus the resistance value of a resistor can be adjusted. Thereby, the resistance value of a resistor can be adjusted to a desired resistance value, and thus an error relative to a required resistance value of a resistor can be minimized. As a result, a filter chip capable of achieving favorable frequency characteristics can be provided. More specifically, such a resistor, when adopted for a low-pass filter or a high-pass filter, can contribute to the suppression of insertion loss variation and so forth in the passband.

In the filter chip, the resistive conductive film may include a portion formed in a zig-zag pattern.

In the filter chip, the resistive conductive film may include a resistor film formed on the substrate, and a plurality of conductor films formed spaced apart from each other on the resistor film. In this case, a portion of the resistor film exposed between mutually adjacent conductor films constitutes a single resistive element, and the fuse portion may be provided to electrically connect at least one of a plurality of the resistive elements to the external terminals or to electrically separate at least one of the plurality of the resistive elements from the external terminals.

With this configuration, the resistance value of a resistor can be adjusted by the connection or separation of a resistive element, and thus the adjustment precision for a resistance value can be further improved. Further, by changing the shape and/or the area of the resistor film exposed between mutually adjacent conductor films, the resistance value of a resistive element can be modified or adjusted. A plurality of the resistive elements with each having the same resistance value is favorably arrayed in a matrix on the substrate. With this configuration, a resistance value can be easily adjusted to a desired resistance value by the cutting or non-cutting of a fuse portion without altering the basic design of a filter chip.

In the filter chip, the plurality of passive element forming regions may include a capacitor forming region where a capacitor is formed. The capacitor forming region may include a dielectric film, and a lower electrode and an upper electrode provided to sandwich the dielectric film and electrically connected to different external terminals. With this configuration, the upper electrode may include a plurality of electrode film portions separately formed to face the lower electrode with mutually different facing areas, and a capacitor-side fuse portion cuttably provided to electrically separate the electrode film portions from the external terminals.

With this configuration, an electrode film portion is selectively and electrically separated from the external terminal, and thus the capacitance value of a capacitor can be adjusted. Thereby, the capacitance value of a capacitor can be adjusted to a desired capacitance value, and thus an error relative to a required capacitance value of a capacitor can be minimized. For example, when the facing areas of a plurality of electrode film portions facing to a lower electrode are set to form a geometric progression, a capacitance value can be adjusted to a target capacitance value with high precision corresponding to a minimum capacitance value (a value of the first term in a geometric progression). According to a filter chip including such a capacitor, a various types of filter circuits having further favorable frequency characteristics can be achieved by combining with the above-described resistors. The above-described filter chip may constitute a low-pass filter including the above described resistor and the above described capacitor, or may constitute a high-pass filter including the above described resistor and the above described capacitor.

In the filter chip, the plurality of passive element forming regions may include a coil forming region where a coil is formed. The coil forming region may include a coil conductor formed with one end and the other end thereof electrically connected to different ones of the external terminals in a spiral shape in plan view when viewed along a direction normal to the surface of the substrate. The coil conductor may be embedded in a trench formed in the substrate in a spiral shape in plan view.

The coil forming region may include a first electrode and a second electrode electrically connected to different ones of the external terminals and formed spaced apart from each other to be electrically connected to one end and the other end of the coil conductor. The first electrode may include a plurality of extraction electrodes extracted toward a plurality of different portions of the coil conductor and connected to the plurality of different portions of the coil conductor, and a fuse portion integrally formed with the extraction electrode and cuttably provided to electrically separate the plurality of different portions of the coil conductor from each of the external terminals.

With this configuration, the number of windings of a coil can be adjusted by selectively cutting a coil side fuse portion. Thereby, the value of inductance of a coil can be adjusted to a desired value, and thus an error relative to a required value of inductance of a coil can be minimized. According to a filter chip including such a coil, a various types of filter circuits having further favorable frequency characteristics can be achieved by combining with the previously described resistors. The filter chip may constitute a low-pass filter including the resistor and the coil, or may constitute a high-pass filter including the resistor and the coil.

In the filter chip, the plurality of passive element forming regions may include a capacitor forming region where a capacitor is formed, and a coil forming region where a coil is formed. A low-pass filter including the resistor, the capacitor and the coil may be formed, or a high-pass filter including the resistor, the capacitor and the coil may be formed.

A filter chip according to another aspect of the present invention includes a substrate, a plurality of external terminals formed on the substrate for external connection, and a plurality of passive element forming regions provided in the regions between the plurality of external terminals in plan view when viewed along a direction normal to the surface of the substrate, the plurality of passive element forming regions including at least a capacitor forming region where a capacitor is formed. The capacitor forming region includes a lower electrode electrically connected to an external terminal, an upper electrode electrically connected to another external terminal different from the external terminal to which the lower electrode is connected, and a dielectric film interposed between the lower electrode and the upper electrode. The upper electrode includes a plurality of electrode film portions separately formed to face the lower electrode with mutually different facing areas, and a fuse portion cuttably provided to electrically separate the electrode film portions from the external terminals.

With this configuration, the capacitance value of a capacitor can be adjusted by selectively and electrically separating an electrode film portion from the external terminal. Thereby, the capacitance value of a capacitor can be adjusted to a desired capacitance value, and thus an error relative to a required capacitance value of a capacitor can be minimized. As a result, a filter chip capable of achieving favorable frequency characteristics can be provided. For example, such a capacitor, when adopted for a low-pass filter or a high-pass filter, can contribute to the suppression of insertion loss variation and so forth in the passband. Further, when the facing areas of a plurality of electrode film portions facing to a lower electrode are set to form a geometric progression, a capacitance value can be adjusted to a target capacitance value with high precision corresponding to a minimum capacitance value (a value of the first term in a geometric progression).

A filter chip according to still another aspect of the present invention includes a substrate, a plurality of external terminals formed on the substrate for external connection, and a plurality of passive element forming regions provided in the regions between the plurality of external terminals in plan view when viewed along a direction normal to the surface of the substrate, the plurality of passive element forming regions including at least a coil forming region where a coil is formed. The coil forming region includes a first electrode and a second electrode formed spaced apart from each other to be electrically connected to different external terminals, and a coil conductor formed in a spiral shape in plan view with one end electrically connected to the first electrode and the other end electrically connected to the second electrode. The first electrode includes a plurality of extraction electrodes extracted toward a plurality of different portions of the coil conductor and connected to the plurality of different portions of the coil conductor, and a fuse portion integrally formed with the extraction electrode and cuttably provided to electrically separate the plurality of different portions of the coil conductor from each of the external terminals.

With this configuration, the number of windings of a coil can be adjusted by selectively cutting a fuse portion. Thereby, the value of inductance of a coil can be adjusted to a desired value, and thus an error relative to a required value of inductance of a coil can be minimized. As a result, a filter chip capable of achieving favorable frequency characteristics can be provided. For example, such a coil, when adopted for a low-pass filter or a high-pass filter, can contribute to the suppression of insertion loss variation and so forth in the passband.

Hereinafter, embodiments according to the present invention will be specifically discussed with reference to the attached drawings.

First Embodiment

Figure 2:
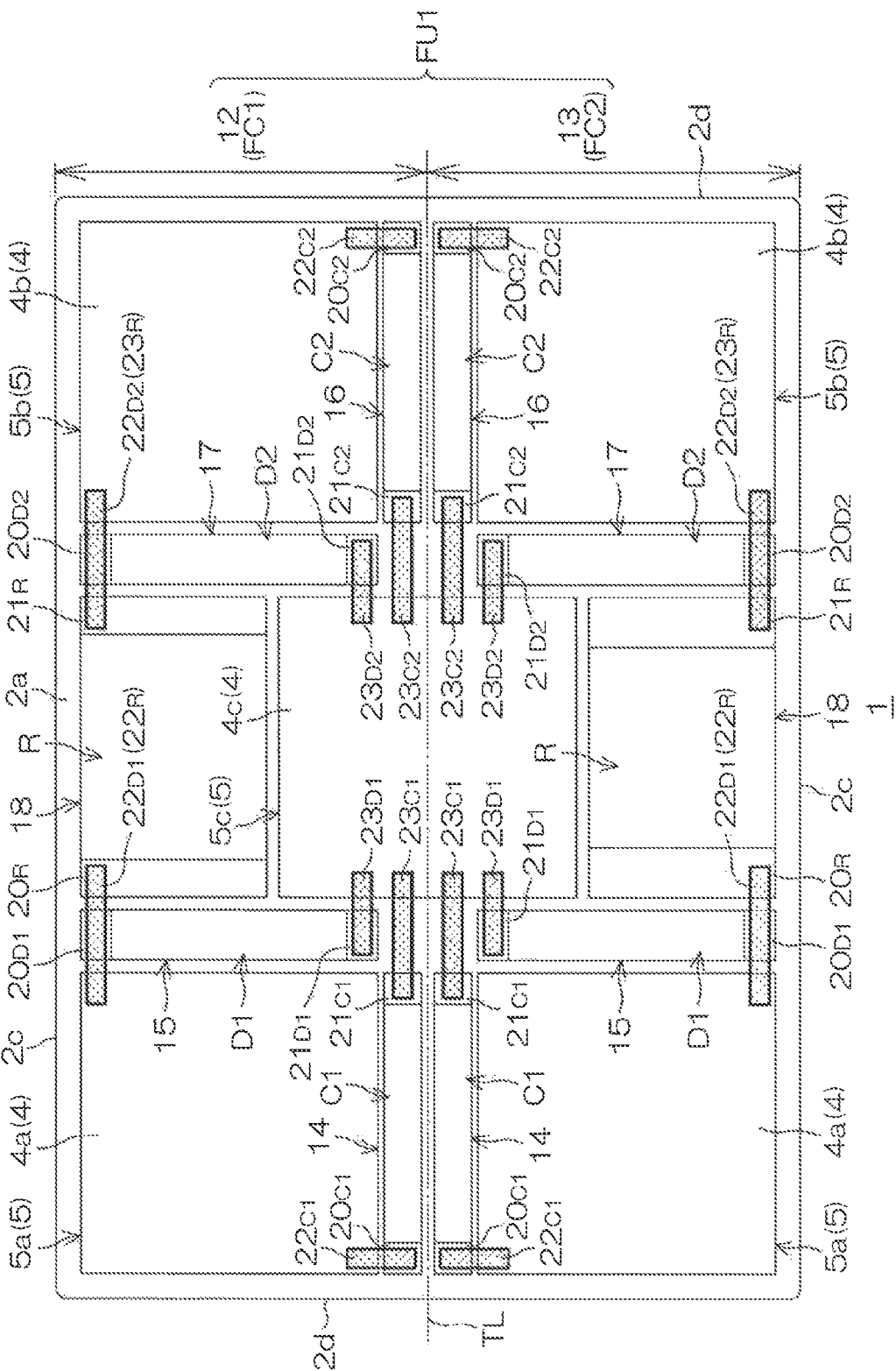
FIG. 2 is a schematic plan view of the filter chip shown in FIG. 1.

FIG. 1 is a partially notched perspective view of a filter chip 1 according to a first embodiment of the present invention. FIG. 2 is a schematic plan view of the filter chip 1 shown in FIG. 1.

Referring to FIG. 1, a filter chip 1 is formed in a substantially rectangular parallelepiped shape, and has a planar rectangular shape. A length L in the longitudinal direction of the filter chip 1 may be, for example, between 0.5 mm and 1.5 mm, inclusive (approximately 1.0 mm in this embodiment). A length W in the transversal direction of the filter chip 1 may be, for example, between 0.4 mm and 1.2 mm, inclusive (approximately 0.8 mm in this embodiment). A thickness T of the filter chip 1 may be, for example, between 0.1 mm and 0.5 mm, inclusive (approximately 0.2 mm in this embodiment).

The filter chip 1 includes a substantially rectangular parallelepiped substrate 2. The substrate 2 includes a pair of principal surfaces 2a, 2b, a pair of side surfaces 2c along the longitudinal direction, and a pair of side surfaces 2d along the transversal direction. One of the principal surfaces 2a, 2b (principal surface 2a on the upper side in FIG. 1) is defined as an element forming surface 2a. Hereinafter, the principal surface 2a is referred to as the "element forming surface 2a," and the principal surface 2b on the opposite side of the element forming surface 2a is referred to as the "rear surface 2b."

A plurality of external terminals 3 (five external terminals in this embodiment) is formed spaced apart from each other on the element forming surface 2a of the substrate 2. The plurality of external terminals 3 includes a pair of input terminals 3a, a pair of output terminals 3b, and a ground terminal 3c. The pair of input terminals 3a is formed spaced apart from each other on the side of one end of the substrate 2 (left side end in FIG. 1) in plan view when viewed along a direction normal to the element forming surface 2a of the substrate 2 (hereinafter simply referred to as "in plan view").

The pair of output terminals 3b is formed spaced apart from each other on the side of the other end of the substrate 2 (right side end in FIG. 1) in plan view. The ground terminal 3c is formed in the center of the substrate 2 in plan view. Each external terminal is formed in substantially a hemispherical shape. The diameter φ of each external terminal 3 is, for example, between 0.1 mm and 0.3 mm, inclusive (approximately 0.25 mm in this embodiment). Each external terminal 3 may be, for example, a solder ball.

Referring to FIG. 2, a pad electrode film forming region 5 on which a pad electrode film 4 is provided at a position corresponding to each external terminal 3 on the element forming surface 2a of the substrate 2. More specifically, the pad electrode film forming region 5 includes a pair of input-side pad electrode film forming regions 5a, a pair of output-side pad electrode film forming regions 5b and a ground-side pad electrode film forming region 5c. Input-side pad electrode films 4a to which the input terminals 3a are connected are formed in the pair of input-side pad electrode film forming regions 5a. Output-side pad electrode films 4b to which the output terminals 3b are connected are formed in the pair of output-side pad electrode film forming regions 5b. Ground-side pad electrode film 4c to which the ground terminal 3c is connected is formed in the ground-side pad electrode film forming region 5c.

Further, a first filter circuit forming region 12 on which a first filter circuit FC1 is formed and a second filter circuit forming region 13 on which a second filter circuit FC2 is formed are provided on the element forming surface 2a of the substrate 2. The first filter circuit forming region 12 and the second filter circuit forming region 13 are partitioned in a rectangular shape by a pair of side surfaces 2d along the transversal direction, a transversal line TL traversing the intermediate portion of the pair of side surfaces 2d, and a pair of side surfaces 2c along the longitudinal direction.

The transversal line TL traverses the ground-side pad-electrode film forming region 5c to provide the first filter circuit FC1 and the second filter circuit FC2 with a common ground-side pad electrode film 4c. That is, the ground terminal 3c provides the first filter circuit FC1 and the second filter circuit FC2 with a common ground potential. A filter unit FU1 is composed of these first filter circuit FC1 and second filter circuit FC2.

In the first filter circuit forming region 12, regions between a plurality of the pad electrode film forming regions 5 (that is, regions between the plurality of external terminals 3), a first capacitor forming region 14, a first diode forming region 15, a second capacitor forming region 16, a second diode forming region 17, and a resistor forming region 18 are provided. The first capacitor forming region 14, the second capacitor forming region 16, and the resistor forming region 18 are formed as an example of the passive element forming region according to the present invention. The configuration of the second filter circuit forming region 13 is the same as the configuration of the first filter circuit forming region 12, and therefore the description is omitted by applying the same reference numerals to corresponding elements.

A first electrode film 20 and a second electrode film 21 are formed spaced apart from each other in the first capacitor forming region 14, the first diode forming region 15, the second capacitor forming region 16, the second diode forming region 17, and the resistor forming region 18. A first connection electrode film 22 is electrically connected to the first electrode film 20, and a second connection electrode film 23 is electrically connected to the second electrode film 21.

Hereinafter, the first electrode film 20 formed in each region is referred to as "a first electrode film $20_{C1}$, $20_{C2}$, $20_{D1}$, $20_{D2}$, $20_R$," and the second electrode film 21 is referred to as "a second electrode film $21_{C1}$, $21_{C2}$, $21_{D1}$, $21_{D2}$, $21_R$." Further, the first connection electrode film 22 formed in each region is referred to as "a first connection electrode film $22_{C1}$, $22_{C2}$, $22_{D1}$, $22_{D2}$, $22_R$," and the second connection electrode film 23 is referred to as "a second connection electrode film $23_{C1}$, $23_{C2}$, $23_{D1}$, $23_{D2}$, $23_R$."

The first capacitor forming region 14 is provided in a region between the input-side pad electrode film forming regions 5a and the transversal line TL. A first capacitor C1 is formed between the first electrode film $20_{C1}$ and the second electrode film $21_{C1}$. The first capacitor C1 is electrically connected to the input-side pad electrode film 4a via the first electrode film $20_{C1}$ and the first connection electrode film $22_{C1}$, and is electrically connected to the ground-side pad electrode film 4c via the second electrode film $21_{C1}$ and the second connection electrode film $23_{C1}$.

The first diode forming region 15 is provided in a region between the input-side pad electrode film forming regions 5a and the ground-side pad electrode film forming region 5c. A first diode D1 is formed between the first electrode film $20_{D1}$ and the second electrode film $21_{D1}$. The first diode D1 is electrically connected to the input-side pad electrode film 4a via the first electrode film $20_{D1}$ and the first connection electrode film $22_{D1}$, and is electrically connected to the ground-side pad electrode film 4c via the second electrode film $21_{D1}$ and the second connection electrode film $23_{D1}$.

The second capacitor forming region 16 is provided in a region between the output-side pad electrode film forming regions 5b and the transversal line TL. A second capacitor C2 is formed between the first electrode film $20_{C2}$ and the second electrode film $21_{C2}$. The second capacitor C2 is electrically connected to the output-side pad electrode film 4b via the first electrode film $20_{C2}$ and the first connection electrode film $22_{C2}$, and is electrically connected to the ground-side pad electrode film 4c via the second electrode film $21_{C2}$ and the second connection electrode film $23_{C2}$.

The second diode forming region 17 is provided in a region between the output-side pad electrode film forming regions 5b and the ground-side pad electrode film forming region 5c. A second diode D2 is formed between the first electrode film $20_{D2}$ and the second electrode film $21_{D2}$. The second diode D2 is electrically connected to the output-side pad electrode film 4b via the first electrode film $20_{D2}$ and the first connection electrode film $22_{D2}$, and is electrically connected to the ground-side pad electrode film 4c via the second electrode film $21_{D2}$ and the second connection electrode film $23_{D2}$.

The resistor forming region 18 is provided in a region segmented by the first diode forming region 15, the second diode forming region 17, and the ground-side pad electrode film forming region 5c. A resistor R is formed between the first electrode film $20_R$ and the second electrode film $21_R$. The resistor R is electrically connected to the input-side pad electrode film 4a via the first electrode film $20_R$ and the first connection electrode film $22_R$, and is electrically connected to output-side pad electrode film 4b via the second electrode film $21_R$ and the second connection electrode film $23_R$. FIG. 2 shows an example wherein the first connection electrode film $22_R$ is integrally formed with the first connection electrode film $22_{D1}$, and the second connection electrode film $23_R$ is integrally formed with the first connection electrode film $22_{D2}$.

Figure 3:
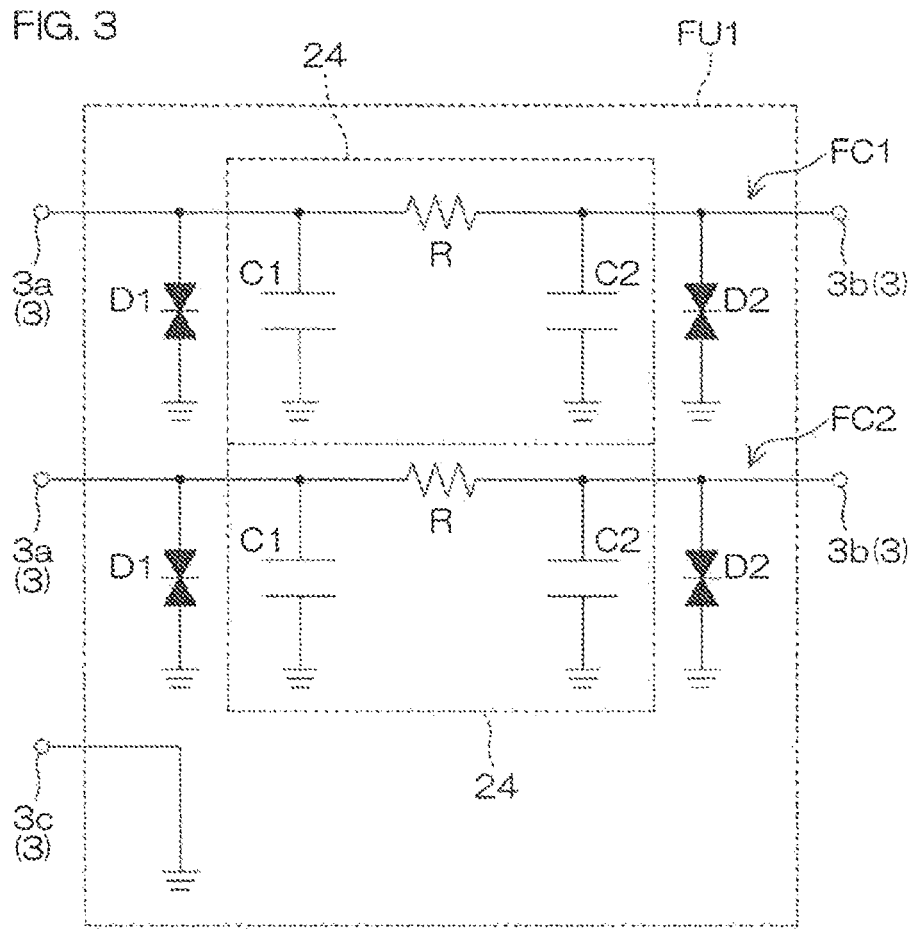
FIG. 3 is a circuit diagram of the filter chip shown in FIG. 1.

FIG. 3 is a circuit diagram of the filter chip 1 shown in FIG. 1. As shown in FIG. 3, the first filter circuit FC1 and the second filter circuit FC2 include a π type low-pass filter 24. The π type low-pass filter 24 includes a resistor R, and a first capacitor C1 and a second capacitor C2 connected in parallel with each other at both ends of the resistor R. Further, the first filter circuit FC1 and the second filter circuit FC2 include the first diode D1 and the second diode D2 connected in parallel with the π type low-pass filter 24 between the π type low-pass filter 24 and the input terminal 3a and between π type low-pass filter 24 and the output terminal 3b. The first diode D1 and the second diode D2 are bidirectional Zener diodes in this embodiment. Thus, in the filter chip 1, the single filter unit FU1 is composed of the first filter circuit FC1 and the second filter circuit FC2.

Figure 4:
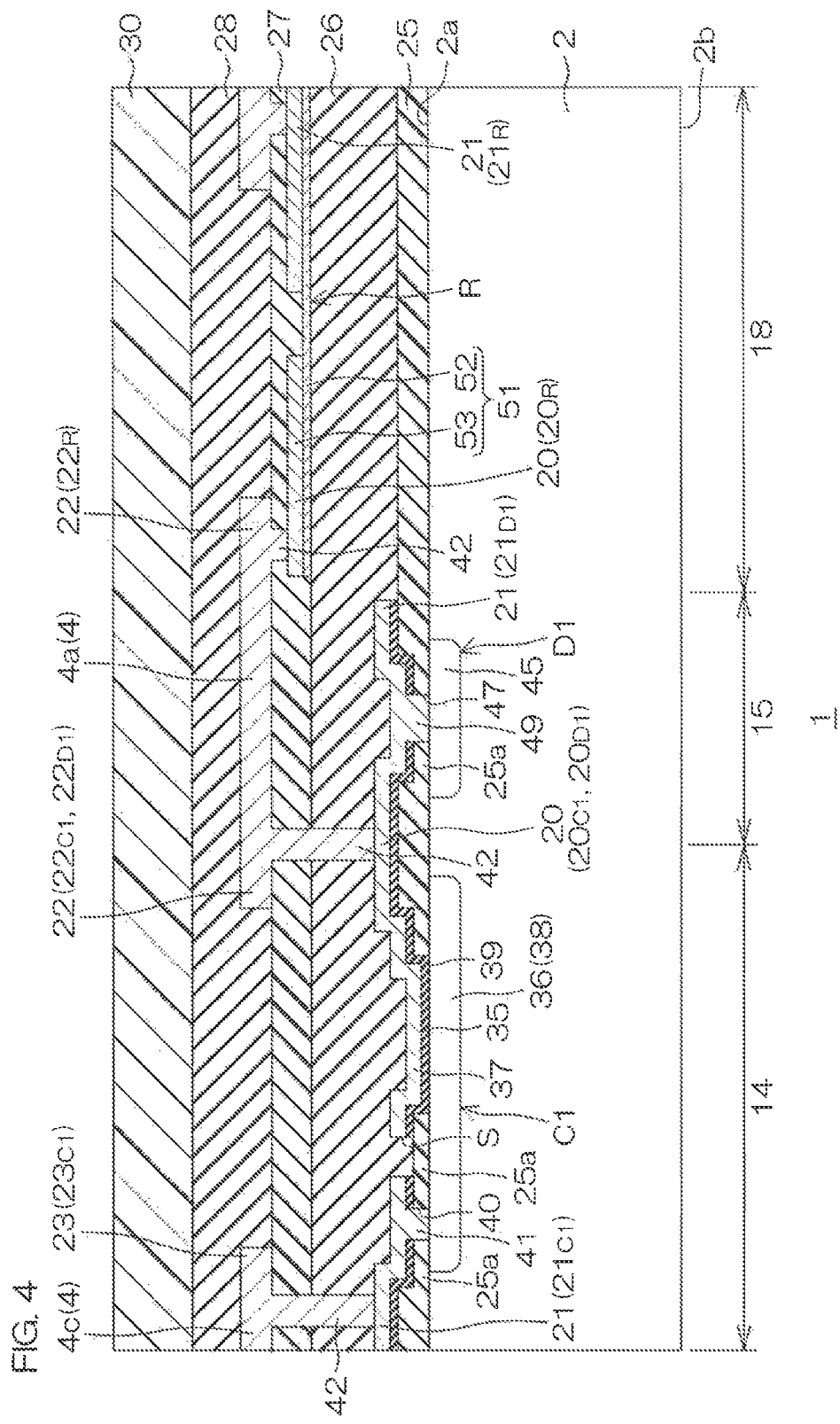
FIG. 4 is a schematic cross-sectional view of the filter chip shown in FIG. 1.

Hereinafter, the specific configuration of the filter chip 1 is described with reference to FIG. 4. FIG. 4 is a schematic cross-sectional view of the filter chip 1 shown in FIG. 1. Since the first capacitor forming region 14 and the second capacitor forming region 16 have substantially the same configuration, hereinafter the configuration of the first capacitor forming region 14 will be described as an example. Further, since the first diode forming region 15 and the second diode forming region 17 have substantially the same configuration, the configuration of the first diode forming region 15 will be described as an example.

Referring to FIG. 4, the first capacitor C1, the first diode D1, and the resistor R are formed in respectively different layers. More specifically, a laminated film with a plurality of insulating films 25-28 laminated therein and an encapsulation resin 30 that covers the laminated film. The plurality of insulating films 25-28 includes a first insulating film 25, a second insulating film 26, a third insulating film 27 and a fourth insulating film 28 formed in this order from the element forming surface 2a of the substrate 2 (see also FIG. 1). Further, although the filter chip 1 includes a fifth insulating film 29 that covers at least the side surfaces 2c, 2d as shown in FIG. 1, which is not shown in FIG. 4.

The first insulating film 25 includes a silicon oxide film, and has a thickness for example between 8000 Å and 12000 Å, inclusive (approximately 10000 Å in this embodiment). The second insulating film 26 includes a silicon oxide film with a flat surface (surface opposite the substrate 2), more specifically a flat film composed of Undoped Silica Glass (USG) or a flat film composed of Spin On Glass (SOG). The thickness of the second insulating film is, for example, between 15000 Å and 25000 Å, inclusive (approximately 20000 Å in this embodiment).

The third insulating film 27 includes a silicon nitride film, and has a thickness, for example, between 1000 Å and 5000 Å, inclusive (approximately 3000 Å in this embodiment). The fourth insulating film 28 includes a silicon nitride film, and has a thickness, for example, between 10000 Å and 15000 Å, inclusive (approximately 12000 Å in this embodiment). The fifth insulating film 29 includes a silicon nitride film. The third insulating film 27, the fourth insulating film 28 and the fifth insulating film 29 are formed as passivation films.

The first capacitor C1 and the first diode D1 are formed on the substrate 2 and the first insulating film 25. The resistor R is formed on the second insulating film 26. The pad electrode film 4, the first connection electrode film 22 and the second connection electrode film 23 are formed on the third insulating film 27. The pad electrode film 4, the first connection electrode film 22 and the second connection electrode film 23 may be composed of an electrode film integrally formed with each other.

The pad electrode film 4, the first connection electrode film 22 and the second connection electrode film 23 include a metal film containing at least either aluminum (Al) or copper (Cu). The pad electrode film 4, the first connection electrode film 22 and the second connection electrode film 23 may be an alloy film composed of, for example, AuCu, AlSiCu and so forth. The pad electrode film 4, the first connection electrode film 22 and the second connection electrode film 23 may have a thickness, for example, between 5000 Å and 12000 Å, inclusive (approximately 12000 Å in this embodiment). Further, the pad electrode film 4, the first connection electrode film 22 and the second connection electrode film 23 may be configured so that portions having the same potential are selectively formed as an integrated electrode film. Hereinafter, the specific configurations of the first capacitor forming region 14, the first diode forming region 15, and the resistor forming region 18 will be described in this order.

<First Capacitor Forming Region 14>

FIG. 5 is a plan view of a capacitor forming region 14 shown in FIG. 2.

Referring to FIG. 4 and FIG. 5, the first electrode film $20_{C1}$ and the second electrode film $21_{C1}$ are formed spaced apart from each other on the first insulating film 25 in the first capacitor forming region 14. The first capacitor C1 is formed in the region between these first electrode film $20_{C1}$ and the second electrode film $21_{C1}$. The first capacitor C1 includes a dielectric film 35 formed on the substrate 2, and a lower electrode 36 and an upper electrode 37 formed to sandwich the dielectric film 35.

More specifically, the substrate 2 has, for example, p-type impurities introduced therein. An impurity region 38 as the lower electrode 36 having n-type impurities introduced therein is formed in the surface portion of the substrate 2. The impurity region 38 is formed, for example, in a substantially rectangular shape in plan view. A thin film portion 25a is selectively formed in the first insulating film 25 to thinly cover the impurity region 38. The thickness of the thin film portion 25a is, for example, between 100 Å and 500 Å, inclusive (approximately 200 Å in this embodiment). A first opening 39 and a second opening 40 are formed spaced apart from each other to selectively expose the impurity region 38 in the thin film portion 25a of the first insulating film 25.

The first opening 39 is formed in a substantially rectangular shape in plan view to extend along the first capacitor forming region 14 (see dashed line in FIG. 5). Whereas, the second opening 40 is formed in a substantially rectangular shape in plan view to expose the impurity region 38 with an opening area smaller than the opening area of the first opening 39 (see dashed line in FIG. 5). The dielectric film 35 kept in contact with the impurity region 38, and the upper electrode 37 facing the impurity region 38 across the dielectric film 35, are formed on the substrate 2 exposed through the first opening 39. Whereas, a contact electrode 41 is formed spaced apart from the upper electrode 37 on the substrate 2 exposed through the second opening 40.

One surface and the other surface of the dielectric film 35 are formed along the element forming surface 2a of the substrate 2 exposed through the first opening 39 and the first insulating film 25, and are selectively extracted toward a region outside the first capacitor forming region 14. The dielectric film 35 includes at least either a silicon nitride film or a silicon oxide film. The dielectric film 35 may be an ONO film wherein a silicon oxide film, a silicon nitride film, and a silicon oxide film are laminated in this order. The thickness of the dielectric film 35 may be between 100 Å and 1000 Å, inclusive (approximately 500 Å in this embodiment).

The upper electrode 37 is integrally formed with the first electrode film $20_{C1}$ as an extracted portion extracted from the first electrode film $20_{C1}$, and is formed to face the impurity region 38 across the dielectric film 35 at least in the opening 39. One surface and the other surface of the upper electrode 37 are formed in a substantially rectangular shape in plan view along the element forming surface 2a of the substrate 2 exposed through the first opening 39 and the first insulating film 25.

The contact electrode 41 is integrally formed with the second electrode film $21_{C1}$ as an extracted portion extracted from the second electrode film $21_{C1}$, and is formed to be electrically connected with the impurity region 38 in the second opening 40. The contact electrode 41 is formed above the first insulating film 25 across the dielectric film 35. The contact electrode 41 is electrically separated from the upper electrode 37 by a slit S provided along each perimeter of the upper electrode 37 and the contact electrode 41.

The first electrode film $20_{C1}$ is electrically connected to the input-side pad electrode film 4a via a corresponding contact 42 and the first connection electrode film $22_{C1}$, and the second electrode film $21_{C1}$ is electrically connected to the ground-side pad electrode film 4c via a corresponding contact 42 and the second connection electrode film $23_{C1}$. The contact 42 may include a conductive material embedded in a contact hole formed to pass through the second insulating film 26 and the third insulating film 27. The contact 42 may be integrally formed using the same material as each pad electrode 4 and each connection electrode film 22, 23.

When a prescribe voltage is applied between the input terminal 3a and the output terminal 3b, charges are stored in the dielectric film 35 interposed between the lower electrode 36 (impurity region 38) and the upper electrode 37. As such, the first capacitor C1 is formed in the first capacitor forming region 14.

<First Diode Forming Region 15>

FIG. 6 is a plan view of the first diode forming region 15 shown in FIG. 2.

Referring to FIG. 4 and FIG. 6, the first electrode film $20_{D1}$ and the second electrode film $21_{D1}$ are formed spaced apart from each other on the first insulating film 25 in the first diode forming region 15. The first diode D1 is formed in the region between these first electrode film $20_{D1}$ and the second electrode film $21_{D1}$. More specifically the first diode D1 includes a plurality of first diffusion regions 45 and a plurality of second diffusion regions 46, which are formed by introducing n-type impurities into the surface portion of the substrate 2.

The first diffusion region 45 and the second diffusion region 46 have the same depth and the same n-type impurity concentration, and form a p-n junction with the substrate 2. The first diffusion region 45 and the second diffusion region 46 are arranged at the center along a direction between the first electrode film $20_{D1}$ and the second electrode film $21_{D1}$ facing each other, and are aligned along a direction orthogonal to the facing direction. The first diffusion region 45 and the second diffusion region 46 are alternately arranged spaced apart from each other.

The first insulating film 25 has the thin film portion 25a selectively formed on the first diffusion region 45 and the second diffusion region 46. The thin film portion 25a of the first insulating film 25 has a first contact hole 47 and a second contact hole 48 that selectively expose the first diffusion region 45 and the second diffusion region 46. The first contact hole 47 and the second contact hole 48 expose the first diffusion region 45 and the second diffusion region 46 at a position with a distance from the peripheral edges of the first diffusion region 45 and the second diffusion region 46 in plan view.

The first electrode film $20_{D1}$ is formed above the first insulating film 25 across the dielectric film 35, and includes a plurality of first extraction electrodes 49 extracted toward each first diffusion region 45. Each first extraction electrode 49 is extracted to cover the first diffusion region 45 with a width boarder than the width of each first diffusion region 45. That is, the first extraction electrodes 49 are formed in a comb shape in plan view.

The tip portion of each first extraction electrode 49 is formed in a substantially rectangular shape with a notched corner. The first extraction electrode 49 enters the first contact hole 47 from above the first insulating film 25, and forms an ohmic contact with the first diffusion region 45. In this embodiment, the first electrode film $20_{D1}$ formed in the first diode forming region 15 is integrally formed with the first electrode film $20_{C1}$ (upper electrode 37) formed in the first capacitor forming region 14.

The second electrode film $21_{D1}$ is formed above the first insulating film 25 across the dielectric film 35, and includes a plurality of second extraction electrodes 50 extracted toward each second diffusion region 46. Each second extraction electrode 50 is extracted to cover the second diffusion region 46 with a width boarder than the width of each second diffusion region 46. That is, the second extraction electrodes 50 are formed in a comb shape to engage with the first extraction electrodes 49 in plan view. The tip portion of each second extraction electrode 50 is formed in a substantially rectangular shape with a notched corner. The second extraction electrode 50 enters the second contact hole 48 from above the first insulating film 25, and forms an ohmic contact with the second diffusion region 46.

The first electrode film $20_{D1}$ is electrically connected to the input-side pad electrode film 4a via a corresponding contact 42 and the first connection electrode film $22_{D1}$. The second electrode film $21_{D1}$ is electrically connected to the ground-side pad electrode film 4c via a corresponding contact 42 and the second connection electrode film $23_{D1}$. The plurality of first diffusion regions 45 and the plurality of second diffusion regions 46 constitute a single bidirectional Zener diode. In this embodiment, the first diode D1 and the second diode D2 may provide the first filter circuit FC1 and the second filter circuit FC2 with electrostatic discharge (ESD) tolerance of, for example, 10 kV or more.

<Resistor Forming Region 18>

Figure 9:
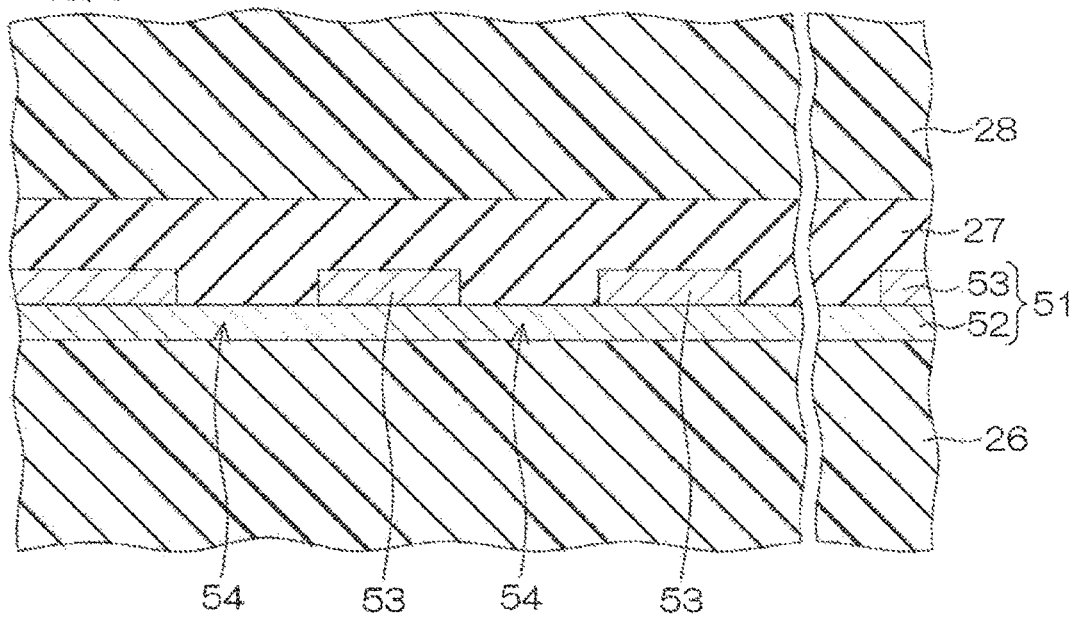
FIG. 9 is cross-sectional view taken along line IX-IX shown in FIG. 8.

FIG. 7 is a plan view of a resistor forming region 18 shown in FIG. 2. FIG. 8 is a plan view enlarging a portion of the resistor forming region 18 shown in FIG. 7. FIG. 9 is cross-sectional view taken along line IX-IX shown in FIG. 8. As shown in FIG. 4 and FIGS. 7-9, the first electrode film $20_R$ and the second electrode film $21_R$ are formed spaced apart from each other on the second insulating film 26 in the resistor forming region 18. The resistor R is formed in the region between the first electrode film $20_R$ and the second electrode film $21_R$. The resistor R is formed between the first electrode film $20_R$ and the second electrode film $21_R$, and includes a resistive conductive film 51 with one end and the other end connected to the first electrode film $20_R$ and the second electrode film $21_R$. The resistive conductive film 51 includes a portion formed in a zig-zag pattern which is formed by folding the portion over a plurality of cycles.

More specifically, the resistive conductive film 51 includes a plurality of first linear patterns 51a linearly extending spaced apart from each other along a direction between the first electrode film $20_R$ and the second electrode film $21_R$ facing each other. The resistive conductive film 51 also includes a plurality of second linear patterns 51b connected to the first linear patterns 51a, linearly extending along a direction intersecting with the facing direction (orthogonal direction). The resistive conductive film 51 is formed including the plurality of first linear patterns 51a and the plurality of second linear patterns 51b with a prescribed number of foldbacks. More specifically, the resistive conductive film 51 is formed on the second insulting film 26, including a resistor film line 52 formed in a zig-zag pattern, and a plurality of conductor films 53 laminated on the resistor film line 52.

The resistor film line 52 may include one or more metallic species selected from a group including TiN, TiON and TiSiON. The thickness of the resistor film line 52 may be, for example, between 500 Å and 3000 Å, inclusive (approximately 1000 Å in this embodiment). As shown in FIG. 9, the plurality of conductor films 53 is arranged on the resistor film line 52 with a prescribed distance therebetween.

The conductor films 53 have an electric conductivity $\rho_F$ higher than an electric conductivity $\rho_L$ of the resister film line 52 ($\rho_L < \rho_F$). The conductor film 53 contains at least either aluminum (Al) or copper (Cu). The conductor film 53 may be an alloy film such as AuCu, AlSiCu. In this embodiment, the conductor film 53 is composed of AuCu. The thickness of the conductor film 53 may be, for example, between 5000 Å and 12000 Å, inclusive (approximately 8000 Å in this embodiment).

Hereinafter, the configuration of the resistive conductive film 51 will be specifically described with reference to FIG.

Figure 10:
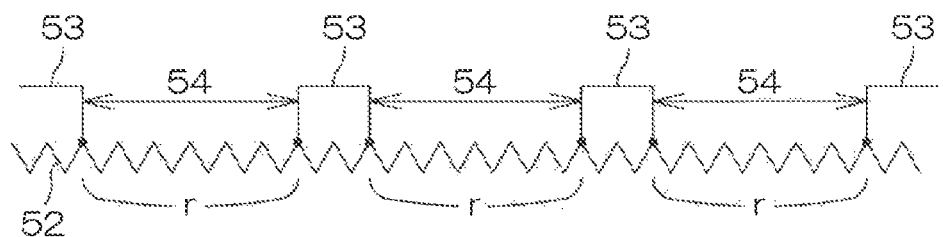
FIG. 10 is a circuit diagram corresponding to a portion shown in FIG. 9.
Figure 11:
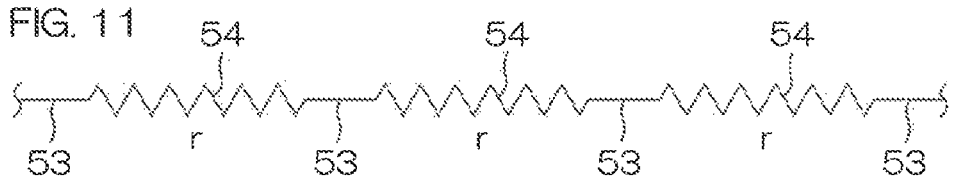
FIG. 11 is a circuit diagram simplifying FIG. 10.

10 and FIG. 11. FIG. 10 is a circuit diagram corresponding to a portion shown in FIG. 9. FIG. 11 is a circuit diagram simplifying FIG. 10.

Referring to FIG. 10, an exposed portion of the resistor film line 52 exposed between mutually adjacent conductor films 53 constitutes a single resistive element 54. Each of a plurality of resistive elements 54 has the same shape and area. That is, each resistive element 54 is formed as a unit resistor having the same resistance value r. Whereas, a portion where the conductor film 53 is arranged causes a short-circuit through the conductor film 53, and thus does not function as the resistive element 54.

A plurality of such resistive elements is formed in the resistor film line 52. The plurality of the resistive elements is arrayed spaced apart from each other in a matrix along the direction between the first electrode film $20_R$ and the second electrode film $21_R$ facing each other and along the direction orthogonal to the facing direction. In this embodiment, eight resistive elements 54 are arrayed along the facing direction, and forty-four resistive elements 54 are arrayed along a direction orthogonal to the facing direction as shown in FIG. 8. That is, a total of 352 resistive elements 54 are formed.

A group of series resistors wherein 1-64 resistive elements 54 are connected in series is formed on each resistor film line 52. The resistance value of each resistor film line 52 is determined by a synthesized resistor of a plurality of resistive elements formed on the resistor film line 52. As such, each resistor film line 52 is formed as a unit resistor having a plurality of types of resistance values, and thus the resistance value of the resistor R is determined by a synthesized resistor of a plurality of resistor film lines 52.

The resistive conductive film 51 also includes a connection conductor film 55 integrally formed with the plurality of conductor films 53, and a fuse portion 56 formed on the second insulating film 26 to be integrally connected to the connection conductor film 55. That is, the plurality of conductor films 53 is electrically connected to the first electrode film $20_R$ via the connection conductor film 55 and the fuse portion 56.

The connection conductor film 55 includes a plurality of first linear patterns 55a linearly extending along a direction between the first electrode film $20_R$ and the second electrode film $21_R$ facing each other, and a plurality of second linear patterns 55b connected to the first linear patterns 55a, linearly extending along a direction intersecting with the facing direction (orthogonal direction). The connection conductor film 55 is composed of the same material as that of the conductor film 53.

The fuse portion 56 is formed to be integrally connected to the connection conductor film 55 between the first electrode film 20 and the connection conductor film 55. The fuse portion 56 is cuttably (fusibly) provided to electrically connect at least one of the plurality of resistive elements 54 to the first electrode film $20_R$ and the second electrode film $21_R$, or to electrically separate at least one of the plurality of resistive elements 54 from the first electrode film $20_R$ and the second electrode film $21_R$. The fuse portion 56 is cut (melted) using, for example, laser light.

The fuse portion 56 is formed to linearly extend along a line between the first electrode film $20_R$ and the second electrode film $21_R$ facing each other. The fuse portion 56 is formed to be thinner than the connection conductor film 55. The fuse portion 56 is formed on the same layer with the same material. The fuse portion 56 may be composed of a portion of the resistive element (resistor film line 52) and a portion of the conductor film 53 on the resistor film line 52.

The input-side pad electrode film 4a is electrically connected to the first electrode film $20_R$ via the contact 42 and the first connection electrode film $22_R$. The previously-described second connection electrode film $23_R$ is electrically connected to the second electrode film $21_R$ via the contact 42 and the second connection electrode film $23_R$.

Figure 12:
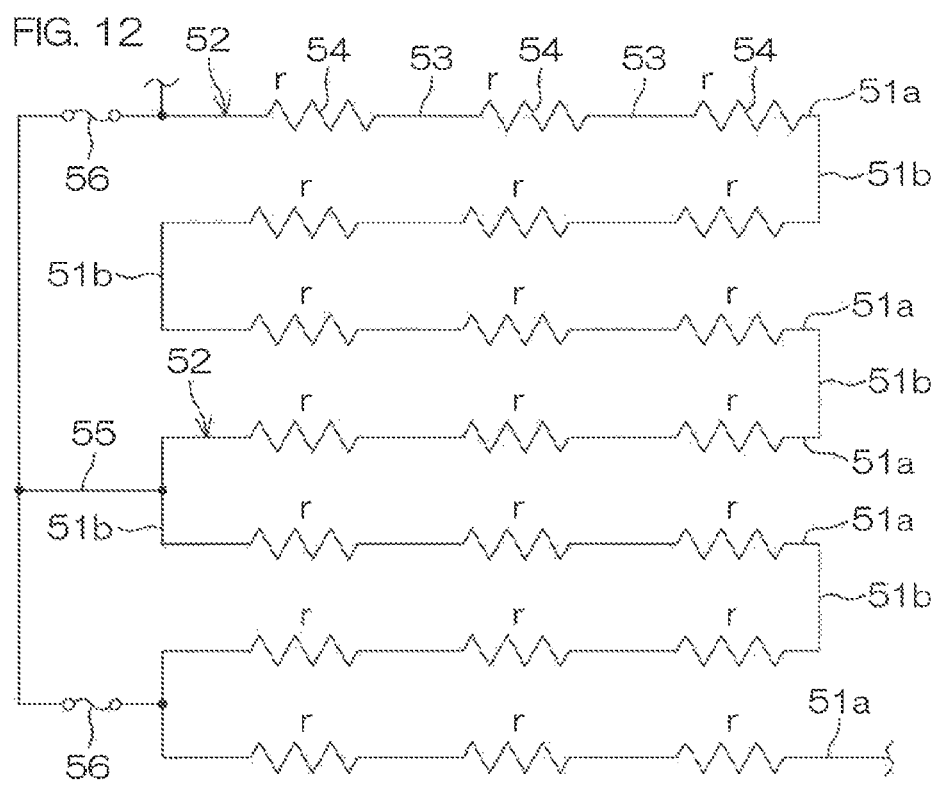
FIG. 12 is a view applying the circuit diagram shown in FIG. 11 to FIG. 8.

FIG. 12 is a view applying the circuit diagram shown in FIG. 11 to FIG. 8. Referring to FIG. 12, when the fuse portion 56 is connected the resistive element 54 (resister film line 52) is short-circuited by the conductor film 53 and the connection conductor film 55. For example, when a voltage is applied between the first electrode film 20 and the second electrode film 21, a current flowing in the connection conductor film 55 by-passes the resistor film line 52 and the resistive element 54, and flows in the conductor film 53 and the connection conductor film 55. That is, when the fuse portion 56 is connected to the connection conductor film 55, the resistive element 54 is electrically separated from the first electrode film 20 and the second electrode film 21, and thus the resistance value does not increase.

Figure 14:
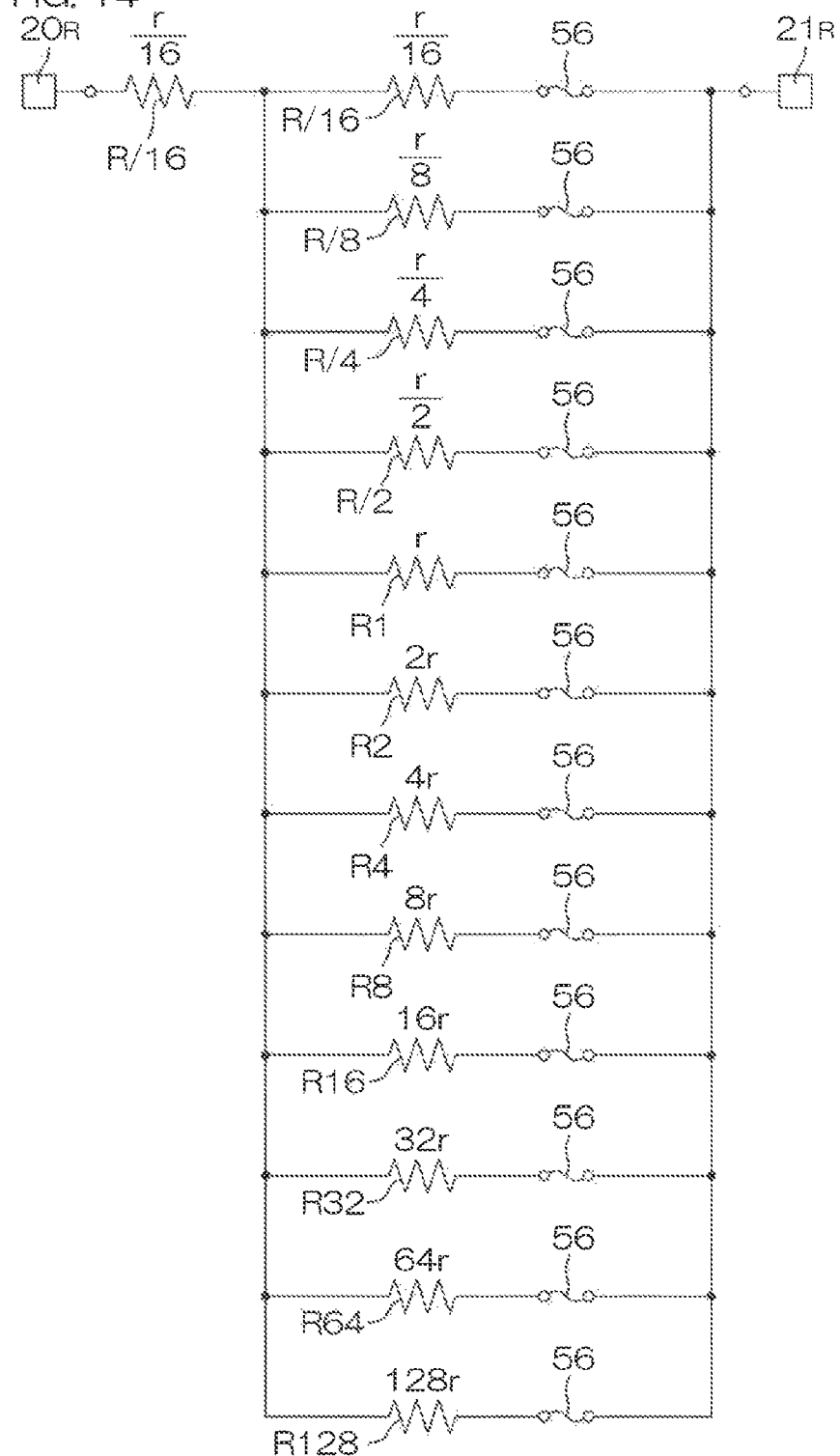
FIG. 14 is a circuit diagram illustrating another example of the resistive conductive film.
Figure 15:
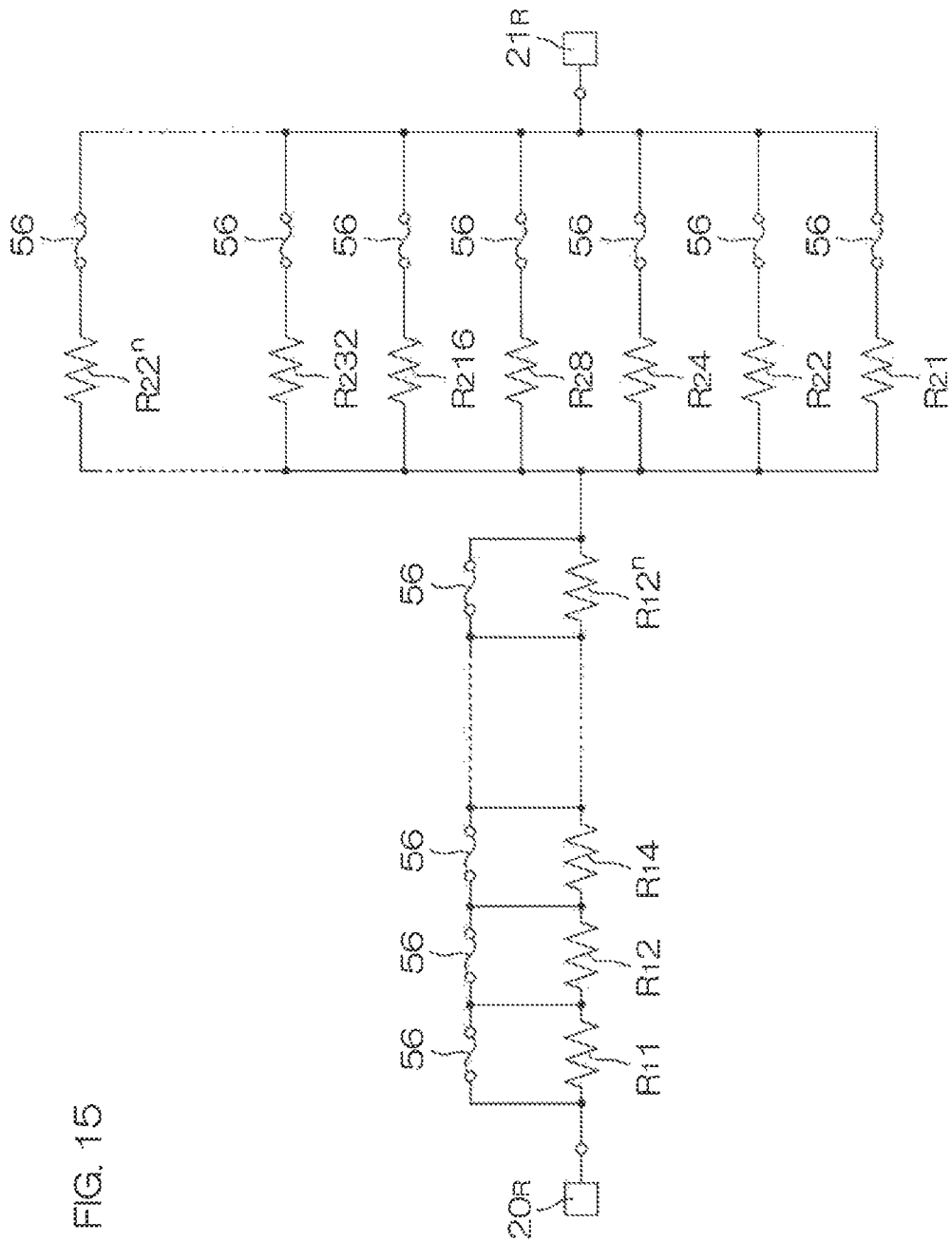
FIG. 15 is a circuit diagram illustrating still another example of the resistive conductive film.

Whereas, the fuse portion 56 is cut (melted), the resistive element 54 (resistor film line 52) is electrically connected between the first electrode film $20_R$ and the second electrode film $21_R$. Therefore, a voltage is applied between the first electrode film $20_R$ and the second electrode film $21_R$, a current path in which a current flows through the resistive element 54 (resister film line 52) is formed. That is, when the fuse portion 56 is cut (melted), the resistance value of the resistor R increases. By using such a resistive conductive film 51, various types of resistor circuits can be achieved as shown in FIGS. 13-15.

Figure 13:
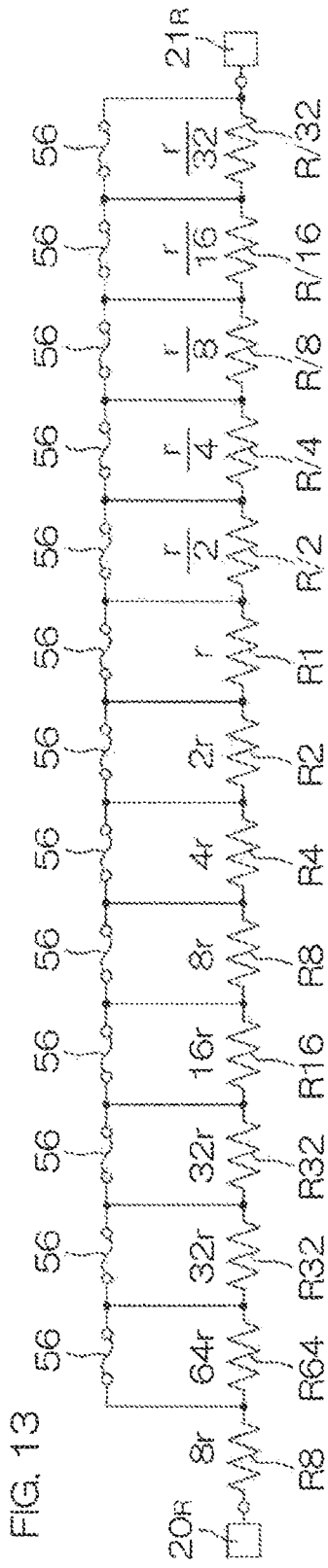
FIG. 13 is a circuit diagram illustrating an example of a resistive conductive film.

FIG. 13 is a circuit diagram illustrating an example of a resistive conductive film 51. The resistor R includes a reference resistor circuit R8, and a series circuit of resistor R for serially connecting a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32.

Each of the reference resistor circuit R8 and the resistor circuits R64-R2 includes serially connected resistive elements 54 of the same number as the number each noted at the end (R64 includes 64 resistive elements 54). Each of the resistor circuits R/2-R/32 includes parallely connected resistive elements 54 of the same number as the number thereof noted at the end (R/32 includes 32 resistive elements 54). The fuse portion 56 is parallely connected for each of the resistor circuits 64—R/32 except for the reference resistor circuit R8.

when the fuse portion 56 is not melted, the resistor circuits 64-R/32 except for the reference resistor circuit R8 are short-circuited by the fuse portion 56. Thus, a current flows in the fuse portion 56 so as to by-pass the resistor circuits 64-R/32 after flowing through the reference resistor circuit R8. Eight resistive elements 54 are serially connected in the reference resistor circuit R8. Provided that the resistance value r of a single resistive element 54 is, for example, 8Ω, the resistance value of the resistor R is 64Ω. As such, by selectively fusing the fuse portions 56, the resistance value of the resistor R can be adjusted as a whole digitally and precisely to obtain any resistance value.

FIG. 14 is a circuit diagram illustrating another example of the resistive conductive film 51. The resistor R includes a reference resistor circuit R/16, and a parallel circuit including 12 types of resistor circuits serially connected to the reference resistor circuit R/16 that are a resistor circuits R/16, R/8, R/4, R/2, R1, R2, R4, R8, R16, R32, R64, and R128. The fuse portions 56 are serially connected to each of the 12 types of resistor circuits R/16-R128 except for the reference resistor circuit R/16. Even in this configuration, by selectively fusing the fuse portions 56, the resistance value of the resistor R can be adjusted digitally and precisely to obtain any resistance value.

FIG. 15 is a circuit diagram illustrating still another example of the resistive conductive film 51. The resistor R includes a plurality of serially connected serial resistor circuits $R_1 2^n$ (n=0, 1, 2 . . . ) and a plurality of parallely connected parallel resistor circuits $R_2 2^n$ (n=0, 1, 2 . . . ). The serial resistor circuits $R_1 2^n$ and the parallel resistor circuits $R_2 2^n$ are connected in series. The fuse portions 56 are parallely connected to the serial resistor circuits $R_1 2^n$ for each resistor circuit similarly to the circuit shown in FIG. 13.

The fuse portions 56 are serially connected to the parallel resistor circuits $R_2 2^n$ for each resistor circuit similarly to the circuit shown in FIG. 14. According to this circuit, a high resistor circuit (for example, a resistor circuit of 1 kΩ or more) can be formed on the side of the serial resistor circuits $R_1 2^n$ and a low resistor circuit (for example, a resistor circuit of 1 kΩ or less) can be formed on the side of the parallel resistor circuits $R_2 2^n$. As such, the resistor R including a resistor circuit with a wide range of a few ohms to a few thousand ohms can be easily obtained.

Thus, the filter chip 1 includes a single filter unit FU1 composed of the first filter circuit FC1 and the second filter circuit FC2 (also see FIG. 3). The filter unit FU1 includes the resistor R with an adjustable resistance value. The measuring results of the resistance value of the filter chip 1 are shown in a table 1 below:

TABLE 1

| | Target resistance value of resistor R | Actual resistance value of resistor R | Error of resistance value |
| --- | --- | --- | --- |
| Filter chip 1 | 10 Ω | 9.9 Ω-10.1 Ω | ±1% or less |
| Filter chip of reference example | 10 Ω | 9.7 Ω-10.3 Ω | ±10%-±30% |

As shown in a table 1, the resistance value of the resistor R in the filter chip 1, when actually measured, represented values between 9.9Ω and 10.1Ω, inclusive, and thus the resistance value of the resistor R could be adjusted with an error of ±1% or less with reference to the target resistance value of 10Ω. That is, it was found that the resistance value for the resistor R could be achieved with a tolerance of ±1% or less according to the filter chip 1.

As a reference example, we, inventors measure the resistance value of a filter chip including a resistor R with so-called a solid shape wherein a linear resistive conductive film 51 connects between the first electrode film $20_R$ and the second electrode film $21_R$. The resistance value of the filter chip according to the reference example, when actually measured, represented values between 9.7Ω and 10.3Ω, inclusive, and thus the error of the resistance value was ±10%-±30%. As such, it was found that the adjustment precision for the resistance value of the resistor R had significantly improved in the filter chip 1 according to this embodiment.

Figure 16:
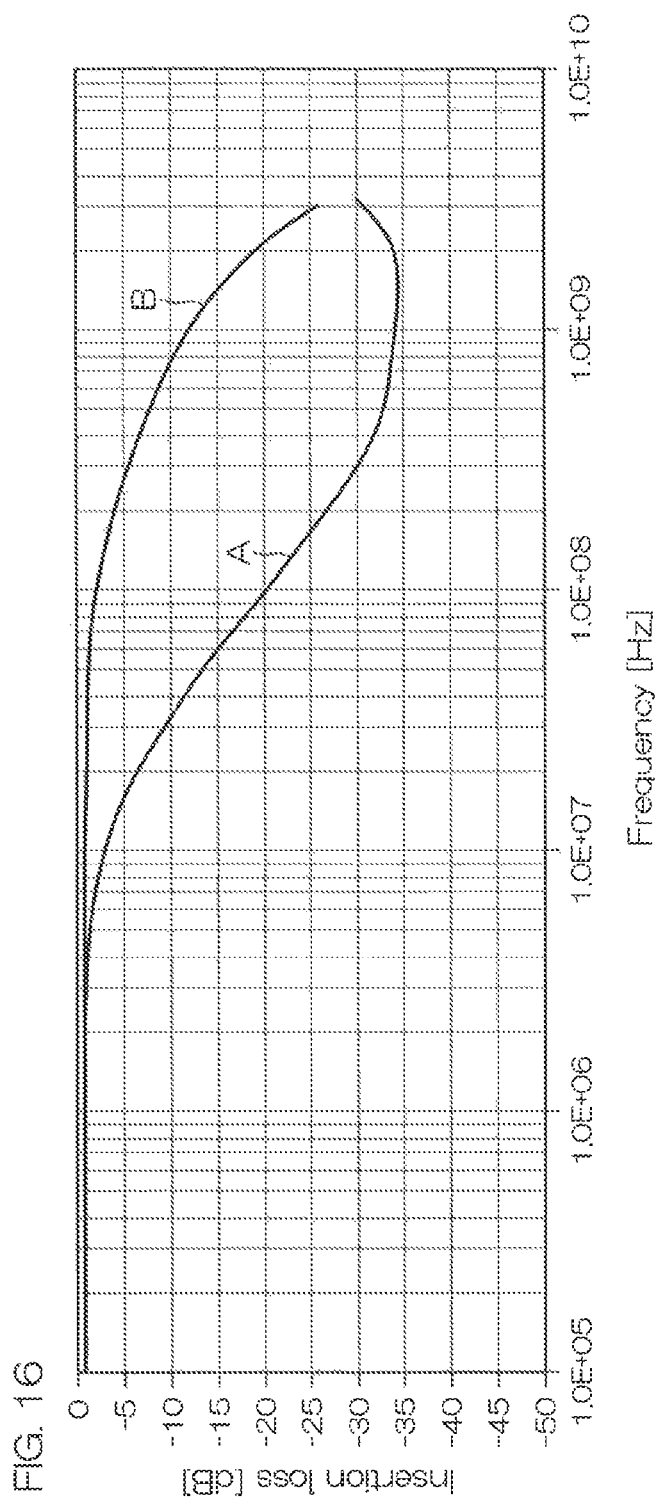
FIG. 16 is a graph illustrating frequency characteristics of the filter chip shown in FIG. 1.

The measuring results of the frequency characteristics of the filter chip 1 measured in an experiment are shown in FIG. 16. FIG. 16 is a graph illustrating the frequency characteristics of the filter chip 1 shown in FIG. 1. The horizontal axis shown in FIG. 16 represents frequencies (Hz), and the vertical axis represents insertion losses (dB). In this experiment, two filter chips 1 were prepared to measure each frequency characteristic as shown in a below-described table 2. One filter chip 1 has a first capacitor C1 and a second capacitor C2 with each having a capacitance value of 100 pF. The other filter chip 1 has a first capacitor C1 and a second capacitor C2 with each having a capacitance value of 10 pF.

Hereinafter, the filter chip 1 with a high capacitance value is referred to as a filter chip 1A, and the filter chip 1 with a low capacitance value is referred to as a filter chip 1B. In FIG. 16, a graph A shows the frequency characteristics of the filter chip 1A, and a graph B shows the frequency characteristics of the filter chip 1B.

TABLE 2

| | Resistance value of resistor R | Capacitance values of first capacitor C1 and second capacitor C2 | Capacitance values of first diode D1 and second diode D2 | Theoretical insertion loss at passband |
| --- | --- | --- | --- | --- |
| Filter chip 1A | 10 Ω | 100 pF | 9 pF | −0.83 dB |
| Filter chip 1A | 10 Ω | 10 pF | t | −0.83 dB |

Referring to the table 2 and the graph A shown in FIG. 16, in filter chip 1A, a theoretical insertion loss at a passband is −0.83 dB while the actual insertion loss at the passband was −0.82 dB. Thus, it was confirmed that the insertion loss variation at the passband decreased in the filter chip 1A. Further, it was found that the filter chip 1A has favorable attenuation characteristics since an increase in insertion loss is limited at high frequencies in the graph A.

Referring to the table 2 and the graph B shown in FIG. 16, in filter chip 1B, a theoretical insertion loss at a passband is −0.83 dB while the actual insertion loss at the passband was −0.82 dB. Thus, it was confirmed that the insertion loss variation at the passband decreased also in the filter chip 1B. Further, it was found that the filter chip 1B has favorable attenuation characteristics since an increase in insertion loss is almost nothing at high frequencies in the graph B.

Thus, in this embodiment, the resistance value of the resistor R can be adjusted by electrically connecting or separating at least one of the resistive elements 54 to and from the input terminal 3a and the output terminal 3b. As such, the resistance value of the resistor R can be adjusted to a desired resistance value, to thereby minimize an error relative to a required resistance value of the resistor R. In particular, the resistance value of the resistor R can be adjusted via a plurality of resistive elements 54 with mutually same resistance values in this embodiment, and thus the adjustment precision of the resistance value can be further improved. Thereby, in this embodiment, a target resistance value of the resistor R can be adjusted within the error range of ±1%. As a result, a filter chip 1 capable of achieving favorable frequency characteristics as shown in FIG. 16 can be provided.

Further, in this embodiment, the resistive conductive film 51 includes a portion formed in a zig-zag pattern. As such, by adjusting the number of foldbacks in the portion formed in a zig-zag pattern, the value of parasite inductance in the resistive conductive film 51 can be adjusted. Thereby, by cutting the fuse portion 56, the value of parasite inductance can also be adjusted to a desired value.

<Manufacturing Method>

FIGS. 17-23 are cross-sectional views illustrating an example of a method for manufacturing the filter chip 1 shown in FIG. 1. FIGS. 17-23 are cross-sectional views illustrating regions corresponding to the previously described region shown in FIG. 4.

Figure 17:
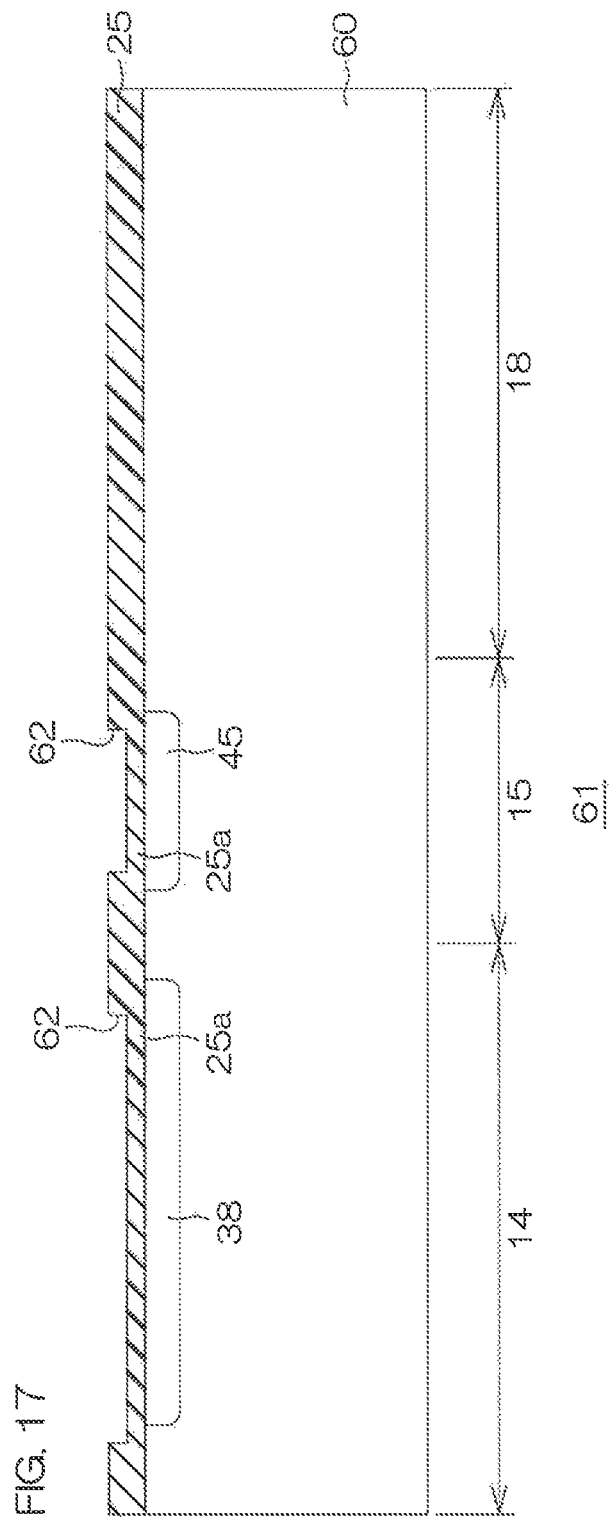
FIGS. 17-23 are cross-sectional views illustrating a method for manufacturing the filter chip shown in FIG. 1.

When forming the filter chip 1, first provided is, for example, a disc-shaped base substrate 60 as shown in FIG. 17. The base substrate 60 is provided with chip forming regions 61 made into the filter chips 1, arranged, for example, in a matrix, and formed in a substantially rectangular shape in plan view. The first capacitor forming region 14, the first diode forming region 15, the second capacitor forming region 16, the second diode forming region 17 and the resistor forming region 18 are provided in the chip forming region 61 (also see FIG. 2). After any required processes are carried out for the base substrate 60, the base substrate 60 is cut along the chip forming regions 61 and diced into the filter chips 1.

More specifically, the first insulating film 25 is formed on the surface of the base substrate 60. The first insulating film 25 may be a silicon nitride film formed, for example, by thermal oxidation. Next, openings 62 are formed in the first insulating film 25 in the first capacitor forming region 15 and the first diode forming region 16 to selectively expose the surface of the base substrate 60 by wet etching with resist masks (not shown).

A thin insulating film is formed on the surface of the base substrate 60 exposed through the openings 62 as the thin film portion 25a of the first insulating film 25. This thin insulating film may be formed, for example, by thermal oxidation. Next, n-type impurities pass through the thin film portion 25a, and are introduced into the surface portion of the base substrate 60. The n-type impurities are diffused in the surface portion of the base substrate 60 by drive-in. Thereby, an impurity region 38, a first diffusion region 45 and a second diffusion region 46 (see FIG. 6) are formed in the surface portion of the base substrate 60.

Figure 18:
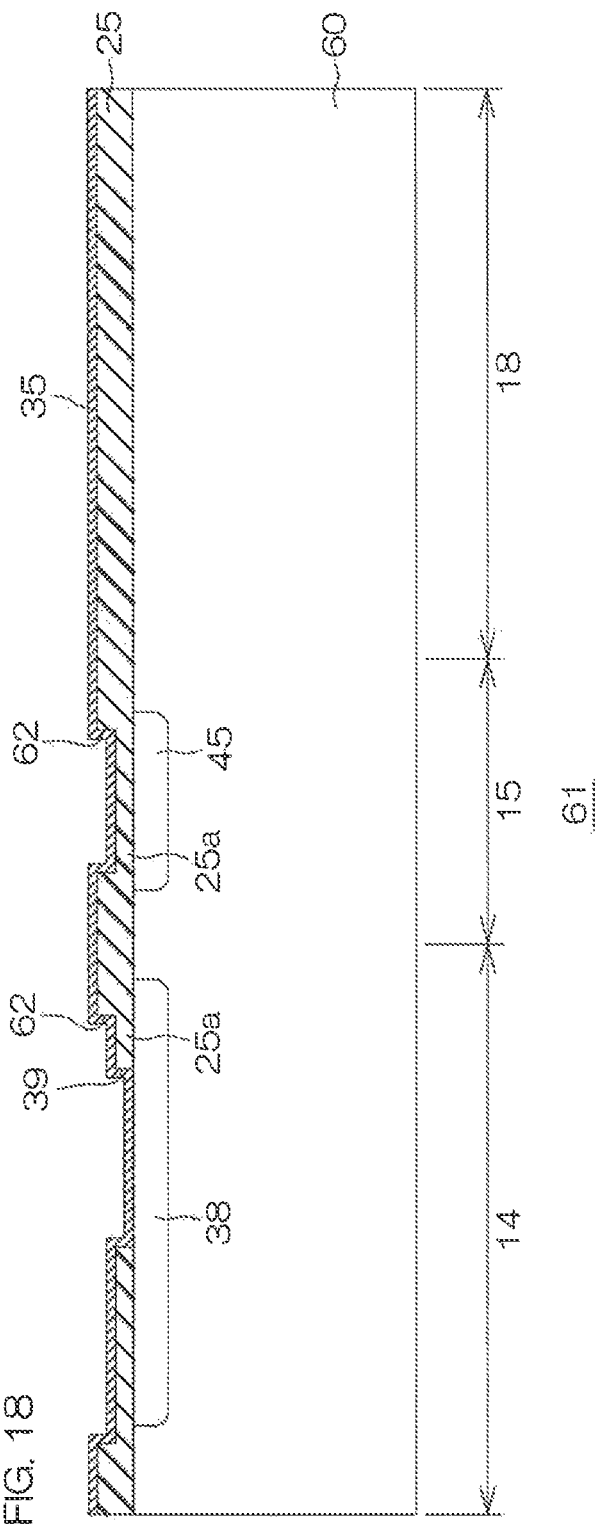

Next, as shown in FIG. 18, a first opening 39 is formed in the thin film portion 25a by wet etching with resist masks (not shown). Then, the dielectric film 35 composed of a silicon nitride film is formed along the surface of the base substrate 60 exposed through the first opening 39 and the surface of the first insulating film 25 using, for example, chemical vapor deposition (CVD).

Figure 19:
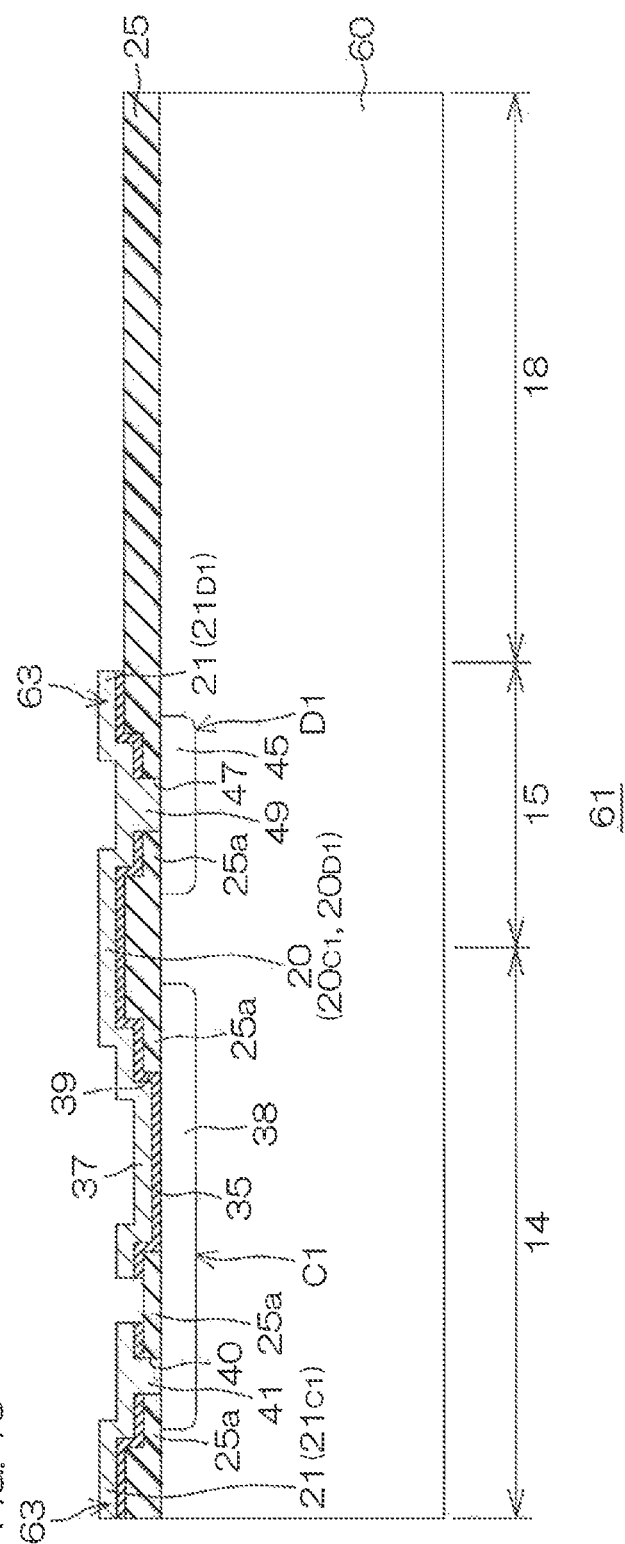

Next, as shown in FIG. 19, unnecessary portions of the dielectric film 35 are removed by dry etching with resist masks (not shown). Next, by dry etching with resist masks (not shown), the thin film portion 25a is selectively removed, and a second opening 40, the first contact hole 47 and the second contact hole 48 (see FIG. 6) are formed. The dry etching may be, for example, Reactive Ion Etching (RIE).

A first metal film 63 including AlSiCu alloy is formed on the first insulating film 25. The first metal film 63 is patterned into a prescribed shape by dry etching with resist masks (not shown). The dry etching may be RIE. Thereby, the first electrode films $20_{C1}$, $20_{C2}$, $C20_{D1}$, $20_{D2}$, and the second electrode films $21_{C1}$ $21_{C2}$, $21_{D1}$, $21_{D2}$ are formed, while the first capacitor C1, the second capacitor C2, the first diode D1, and the second diode D2 are formed.

Figure 20:
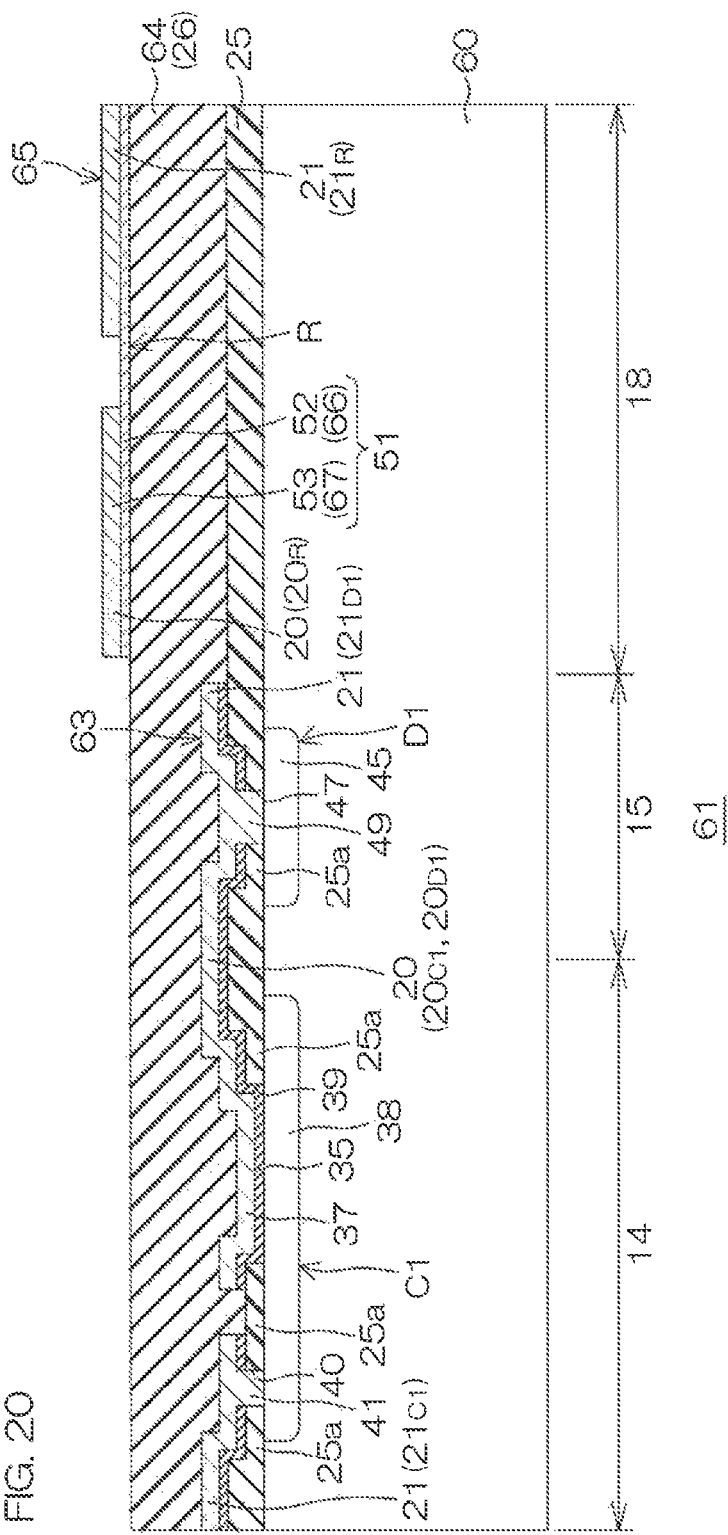

Next, as shown in FIG. 20, a thick USG film 64 is formed on the first insulating film 25, for example by CVD method. Next, the surface of the USG film 64 is planarized, for example by Chemical Mechanical Polishing (CMP). The thickness of the USG film 64 may be, for example, 20000 Å after planarization. Thus, the second insulating film 26 with a planarized surface is formed on the first insulating film 25. The second insulating film 26 may be formed by repeating several times the formation of the USG film 64 and the planarization process using CMP method until the second insulation film 26 has a prescribed thickness. Also, the second insulating film 26 having a planarized surface may be formed by forming an SOG film in place of the USG film 64 or adding the SOG film to the USG film 64.

In the forming process of the SOG film, an inorganic solvent including $SiO_2$, or an organic solvent including $SiO_2$ is applied onto the base substrate 60 with the base substrate 60 rotating at a prescribed rotation speed. The solvent applied to the base substrate 60 is effected by a centrifugal force due to the rotation of the base substrate 60, and is spread over the whole surface of the substrate 60. Thereby, a solvent film with a substantially even thickness is formed on the surface of the base substrate 60. Thereafter, a heat treatment is applied to the solvent film, the solvent film is cured (vitrification). In this way, the second insulating film 26 having a flat surface is formed.

Next, the resistor R is formed on the second insulating film 26. In the formation process of the resistor R, first, a resistor film 66 composed of TiON as a portion of a second metal film 65 is formed on the second insulating film 26, for example by sputtering. Then, a conductor film 67 composed of AlCu as a portion of the second metal film 65 is formed on the resistor film 66, for example by sputtering. Then, the resistor film 66 and the conductor film 67 are patterned by dry etching with resist masks (not shown). The dry etching may be RIE.

Next, the conductor film 67 covering the resistor film line 52 is selectively patterned by wet etching with resist masks (not shown). Thereby, the plurality of conductor films 53 is formed on the resistor film line 52 with a prescribed distance. Thus, the first electrode film $20_R$, the second electrode film $21_R$, and the resistive conductive film 51 are formed. The resistive conductive film 51 includes the resistor film line 52, the conductor film 53, the connection conductor film 55 and the fuse portion 56 (see FIG. 7 and FIG. 8).

Figure 21:
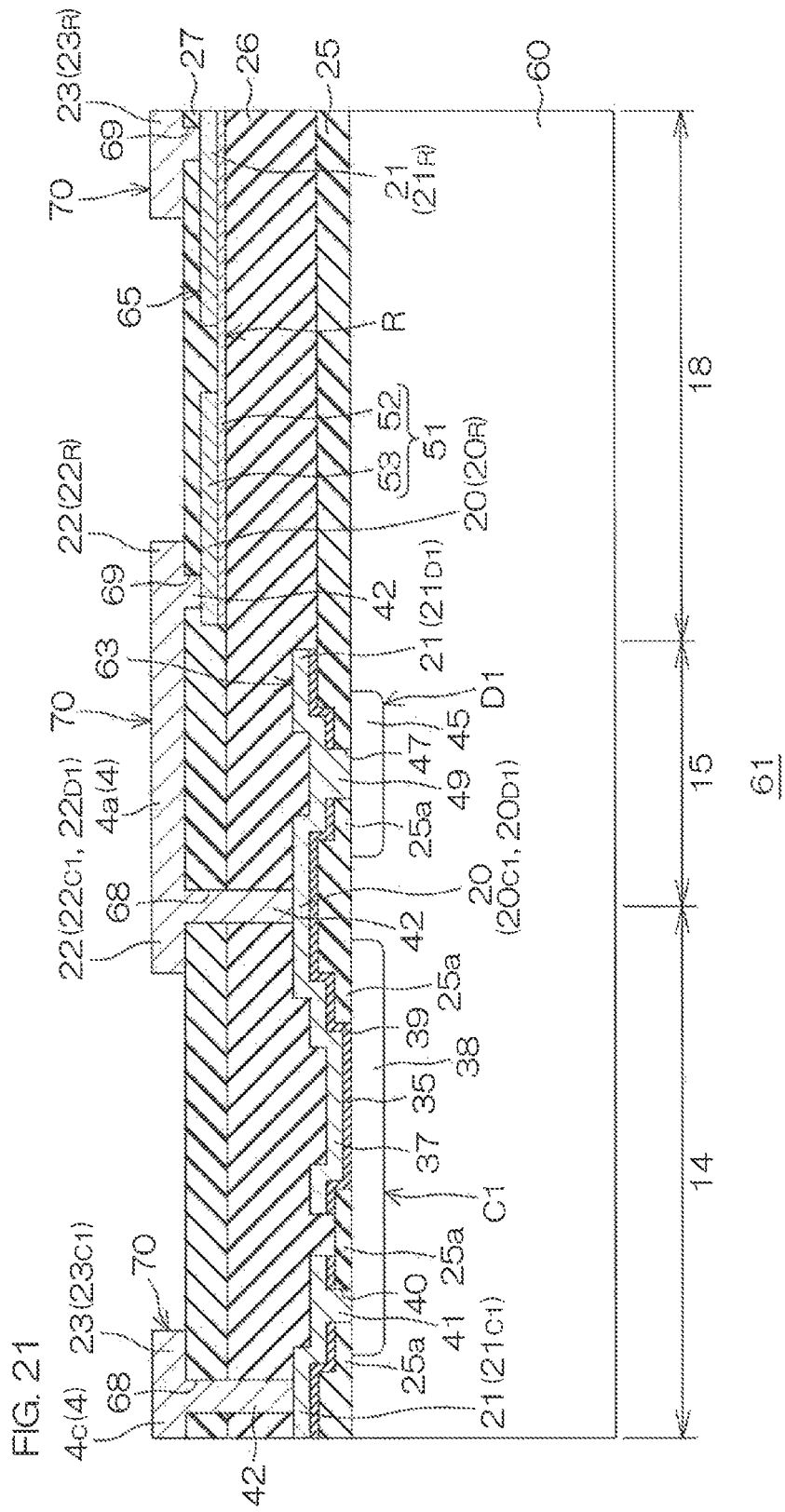

Next, as shown in FIG. 21, the third insulating film 27 composed of a silicon nitride film is formed on the second insulating film 26, for example by CVD method. Then, unnecessary portions of the second insulating film 26 and the third insulating film 27 are removed by dry etching with resist masks (not shown). Thereby, formed are a contact hole 68 that passes through the second insulating film 26 and the third insulating film 27 for selectively exposing the first metal film 63, and a contact hole 69 that passes through the third insulating film 27 for selectively exposing the second metal film 65.

A third metal film 70 composed of ALCu electrode film is formed on the third insulating film 27 to cover the third insulating film 27 by filling the contact holes 68, 69, for example, by sputtering. The third metal film 70 is patterned in a prescribed shape by wet etching with resist masks (not shown). Thereby, each pad electrode film 4 and each connection electrode film 22, 23 are formed.

Figure 22:
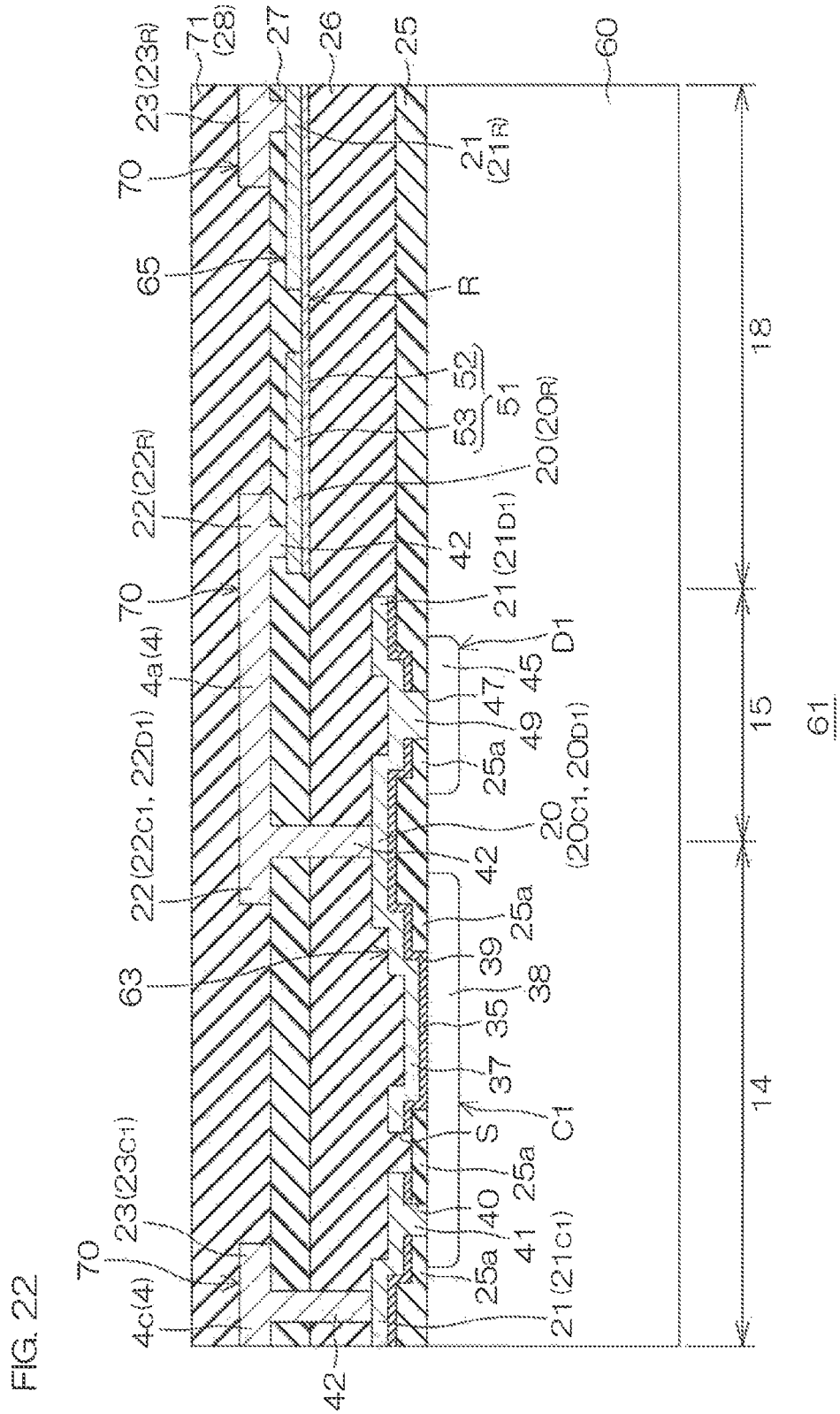

Next, as shown in FIG. 22, a cover film 71 is formed to cover the entire region of the third insulating film 27, for example, by CVD method. The cover film 71 may be composed of a silicon nitride film. Then, the cover film 71 is selectively etched so as to expose a portion of the first electrode film $20_R$ and a portion of the second electrode film $21_R$ in the resistor forming region 18. Then, the probe of a resistor measuring device is brought into contact with the first electrode film $20_R$ and the second electrode film $21_R$ to measure the resistance of the resistor R.

Next, laser light is radiated through the cover film 71 to fuse an arbitrary fuse portion 56 (see FIG. 7 and FIG. 8). Meanwhile, other regions except for the portions exposing the first electrode film 20 and the second electrode film 21 are covered with the cover film 71, and thus connection failures such as short-circuit and so forth caused by fragments generated and adhered to other regions during fusing can be suppressed. Then, a silicon nitride film is repeatedly formed on the third insulating film 27, for example, by CVD method, thereby increasing the thickness of the cover film 71. Thus, the fourth insulating film 28 is formed on the third insulating film 27.

Figure 23:
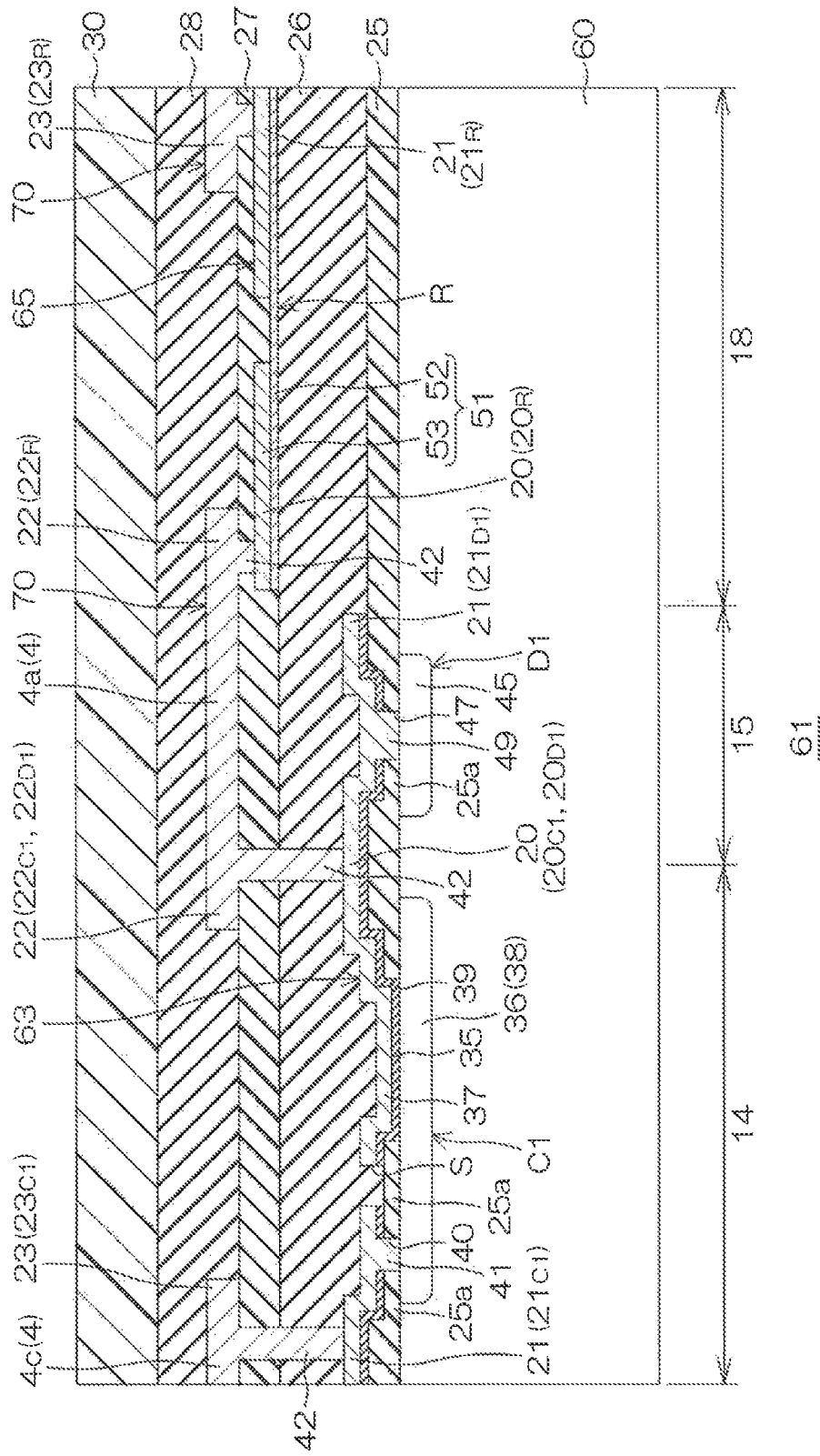

Next, as shown in FIG. 23, a photosensitive polyimide is applied onto the fourth insulating film 28 to form a sealing resin 30. The sealing resin 30 is exposed in a pattern corresponding to each pad electrode film 4 (also see FIG. 2), and then developed. Thereby openings corresponding to each pad electrode film 4 are formed in the sealing resin 30. Thereafter, heat treatment is applied to cure the sealing resin 30 as necessary. Next, unnecessary portions of the third insulating film 27 are removed by dry etching with the sealing resin 30 as a mask. Thereby, openings for exposing each pad electrode film 4 are formed in the third insulating film 27. Next, the external terminals 3 (see FIG. 1) are connected to each pad electrode film 4.

Next, the base substrate 60 is selectively half etched to a prescribed depth from the front side toward the rear side, for example, by plasma etching. By this plasma etching, a groove partitioning a shape for forming the filter chip 1 in plan view is formed in the base substrate 60. Then, the fifth insulating film 29 (see FIG. 1) is formed on the inner surface of the groove, for example, by CVD method. Thereafter, the rear surface of the base substrate 60 is ground to communicate with the groove, for example, by CMP method. Thereby, each filter chip 1 is diced out from the base substrate 60.

Second Embodiment

Figure 24:
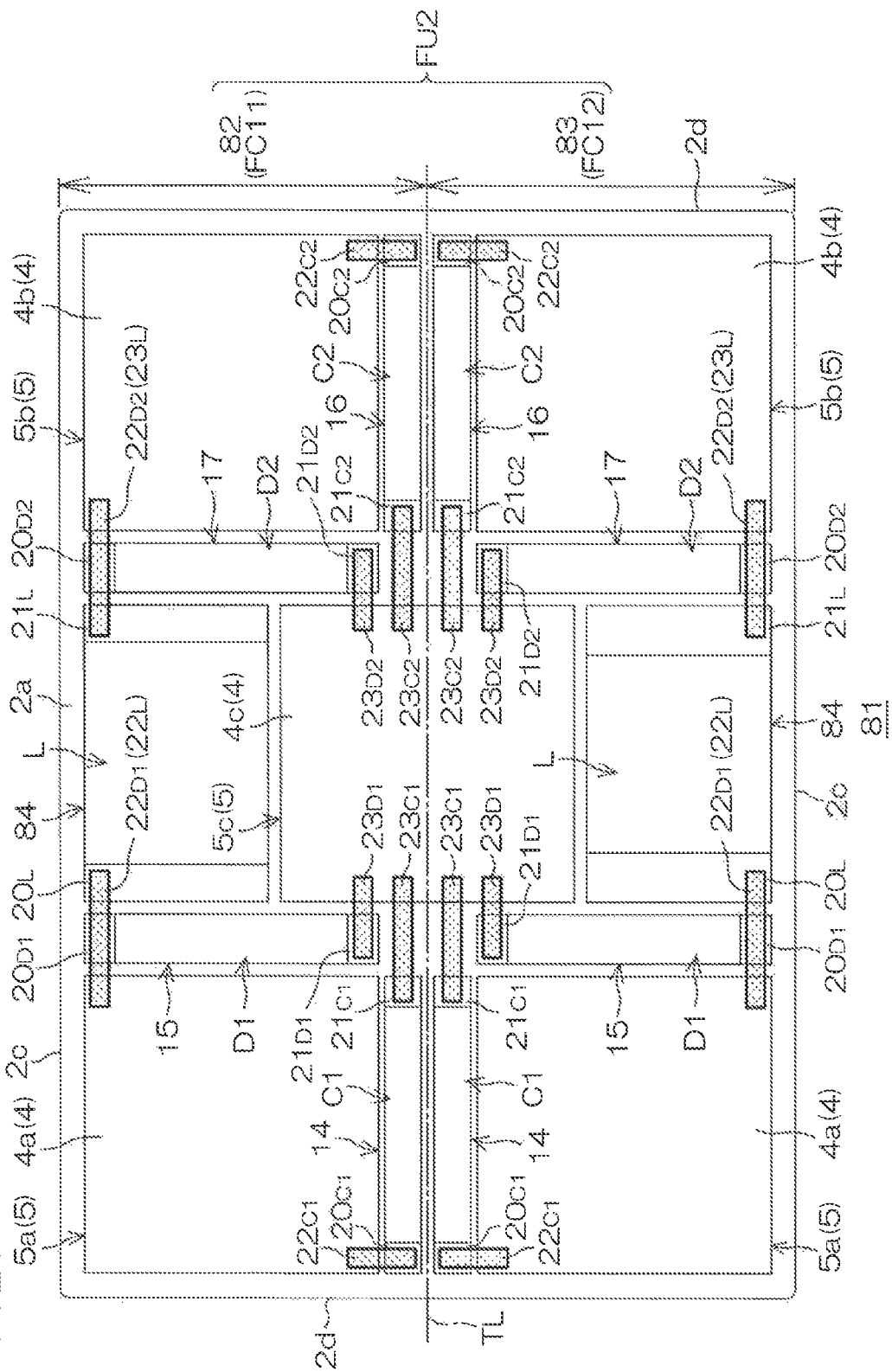
FIG. 24 is a schematic plan view of a filter chip according to a second embodiment of the present invention.
Figure 25:
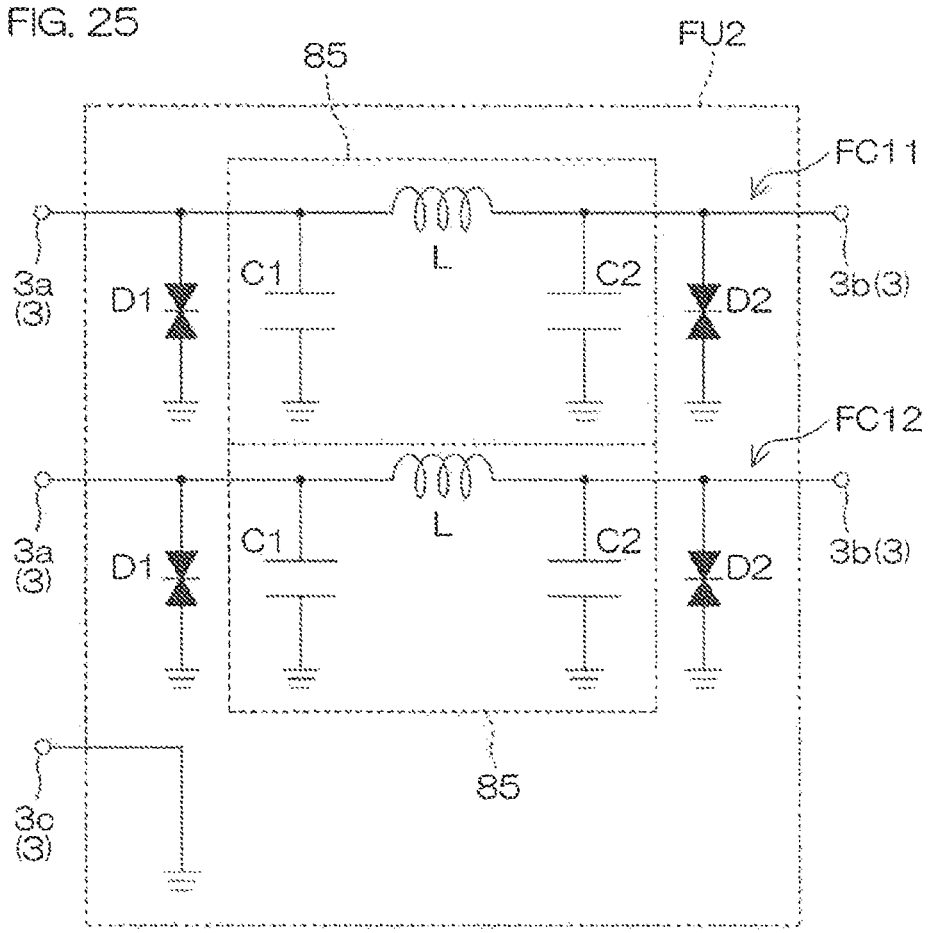
FIG. 25 is a circuit diagram of the filter chip shown in FIG. 24.

FIG. 24 is a schematic plan view of a filter chip 81 according to a second embodiment of the present invention. FIG. 25 is a circuit diagram of the filter chip 81 shown in FIG. 24. FIGS. 24, 25 correspond to previously described FIGS. 2, 3. The same reference numerals are applied to parts in FIGS. 24, 25 corresponding to the parts illustrated in the previously described FIGS. 2, 3, and the descriptions are omitted.

The filter chip 81 includes a first filter circuit forming region 82 including a first filter circuit FC11 and a second filter circuit forming region 83 including a second filter circuit FC12. A single filter unit FU2 is composed of the first filter circuit FC11 and the second filter circuit FC12. The first filter circuit forming region 82 and the second filter circuit forming region 83 may include a coil forming region 84 where a coil L is formed in place of the above-described resistor forming region 18. In this embodiment, the first capacitor forming region 14, the second capacitor forming region 16 and the coil forming region 84 are formed as examples of the passive element forming regions according to the present invention.

A first electrode film $20_L$ and a second electrode film $21_L$ are formed spaced apart from each other in place of the previously-described first electrode film $20_R$ and the second electrode film $21_R$ in the coil forming region 84. The coil L is electrically connected to the input-side pad electrode film 4a via the first electrode film $20_L$ and the first connection electrode film $22_L$, and is electrically connected to the output-side pad electrode film 4b via the second electrode film $21_L$ and the second connection electrode film $23_L$. FIG. 24 shows an example where the first connection electrode film $22_L$ is an electrode film integrally formed with the first connection electrode film $22_{D1}$, and the second connection electrode film $23_L$ is an electrode film integrally formed with the first connection electrode film $22_{D2}$.

Referring to FIG. 25, the first filter circuit FC11 and the second filter circuit FC12 include a π type low pas filter 85. The π type low pas filter 85 includes the coil L and the first capacitor C1 and the second capacitor C2 connected in parallel at both ends of the coil L. Thus, in the filter chip 81, the single filter unit FU2 is composed of the first filter circuit FC11 and the second filter circuit FC12. Hereinafter, the specific configuration of the coil forming region 84 is described with reference to FIG. 26 and FIG. 27.

<Coil Forming Region 84>

Figure 26:
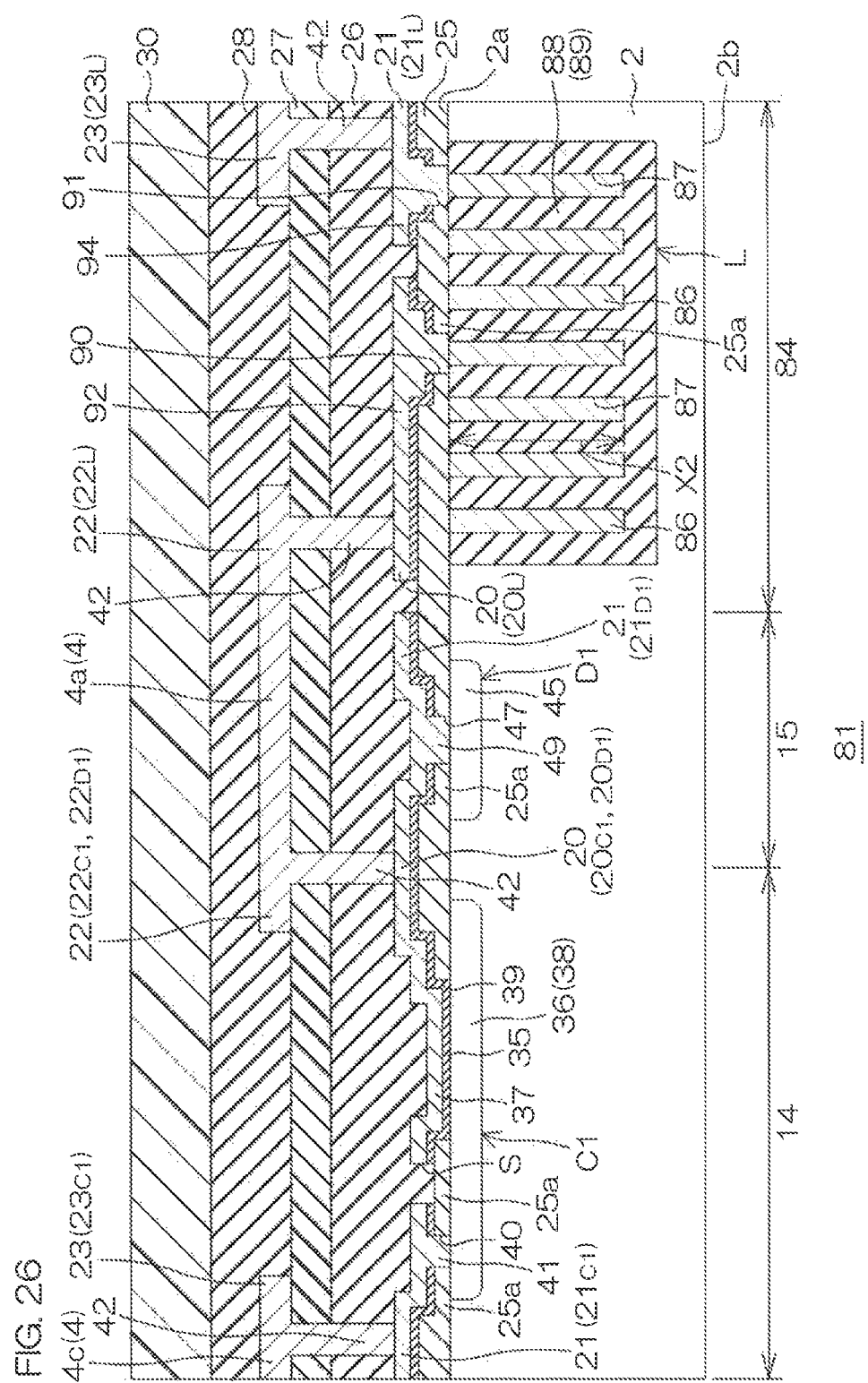
FIG. 26 is a cross-sectional view of the filter chip shown in FIG. 24.
Figure 27:
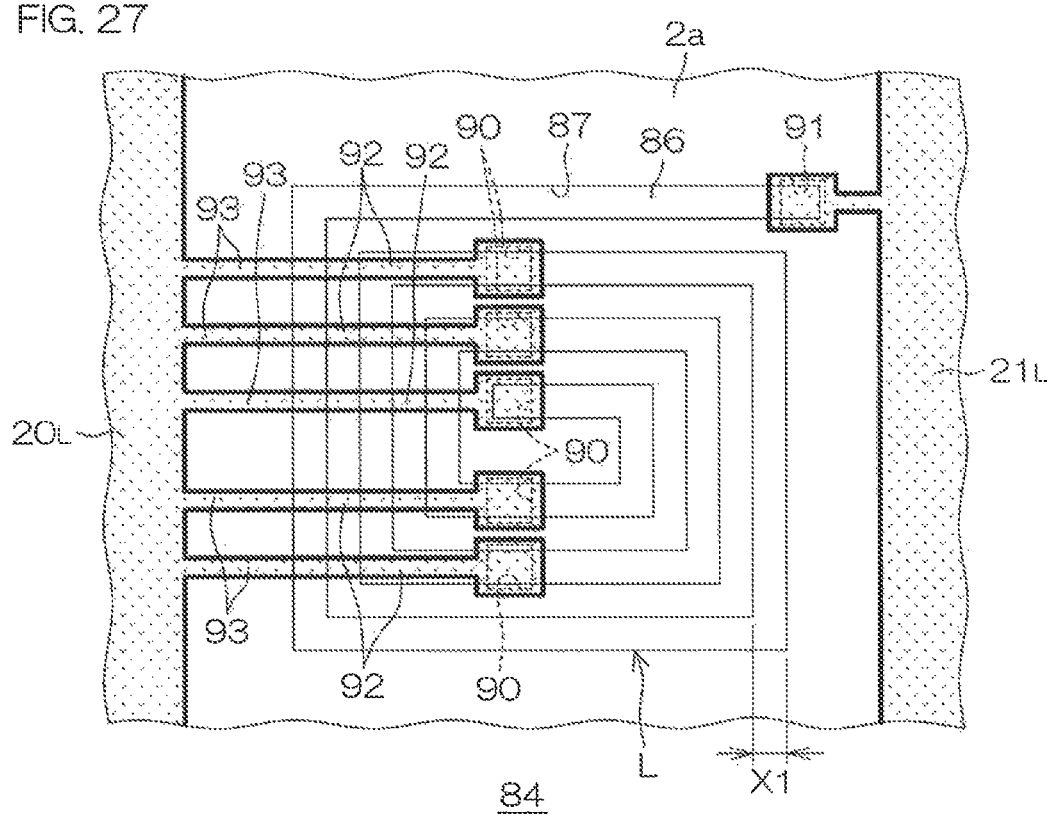
FIG. 27 is a plan view of the coil forming region shown in FIG. 24.

FIG. 26 is a cross-sectional view of the filter chip 81 shown in FIG. 24. FIG. 27 is a plan view of the coil forming region 84 shown in FIG. 24. FIG. 26 corresponds to the previously-described FIG. 4. In FIG. 26, the same reference numerals are applied to parts corresponding to the parts shown in the previously-described FIG. 4 and so forth, and descriptions are omitted.

Referring to FIG. 26 and FIG. 27, the first electrode film $20_L$ and the second electrode film $21_L$ are formed spaced apart from each other on the first insulating film 25 in the coil forming region 84. The coil L is formed in the region between the first electrode film $20_L$ and the second electrode film $21_L$. More specifically, the coil L includes a coil conductor 86 formed in a spiral shape in plan view. The coil conductor 86 is formed in a rectangular spiral shape in plan view, and has a plurality of linear portions respectively parallel to each side surface 2c, 2d of the substrate 2. The coil conductor 86 may be formed in a circular spiral shape in plan view or in a polygonal spiral shape in plan view other than a rectangular shape, such as an octagonal spiral shape in plan view.

The coil conductor 86, more specifically, is embedded in a trench 87 formed in a spiral shape in plan view, etched to a prescribed depth from the element forming surface 2a of the substrate 2. The cross-section of the trench 87 is formed in an elongated rectangular shape in the thickness direction of the substrate 2 in relation to a cross-section in a direction orthogonal to the spiral direction of the trench 87. A width X1 of the trench 87 may be, for example, between 3 μm and 10 μm, inclusive. Further, a depth X2 of the trench 87 may be, for example, between 10 μm and 100 μm, inclusive. An inner-surface insulating film 88 is formed on the inner surface of the trench 87 in the substrate 2. The inner-surface insulating film 88 contains, for example, silicon oxide. In this embodiment, an entire wall sandwiched between the trenches 87 is formed as the inner-surface insulating film 88, thereby forming an insulator portion 89.

The coil conductor 86 may include a tungsten (W) film. Further, the coil conductor 86 may be a laminated film including a titanium nitride (Tin) film and a tungsten film. In this case, the titanium nitride (Tin) film is formed along the inner wall surface of the trench 87. The thickness of the titanium nitride (Tin) film may be, for example, between 300 Å and 500 Å, inclusive. Meanwhile, the tungsten film is formed to fill a concave space partitioned by the titanium nitride film in the trench 87.

The thin film portion 25a is selectively formed on the first insulating film 25 in the coil forming region 84. A plurality of input-side contact holes is formed in the thin film portion 25a of the first insulating film 25, for selectively exposing different portions of the coil conductor 86 spirally shaped in plan view as end parts near the first electrode film $20_L$. Further, an output-side contact hole 91 is formed in the thin film portion 25a of the first insulating film 25 for exposing an end part of the coil L near the second electrode film $21_L$.

The first electrode film $20_L$ integrally includes a plurality of first extraction electrodes 92 extracted toward each input-side contact holes 90, and fuse portions 93 integrally formed with the first extraction electrodes 92, cuttably (fusibly) provided to electrically separate the coil conductor 86 from the first electrode film $20_L$. Each first extraction electrode 92 enters each input-side contact hole 90 from above the first insulating film 25, and is electrically connected to the coil conductor 86 in the input-side contact hole 90.

Meanwhile the second electrode film $21_L$ integrally includes a second extraction electrode 94 extracted toward the output-side contact hole 91. The second extraction electrode 94 enters the output-side contact hole 91 from above the first insulating film 25, and is electrically connected to the coil conductor 86 in the output-side contact hole 91.

The first electrode film $20_L$ and the second electrode film $21_L$ are formed of the same material as the first electrode film $20_{C1, D1}$ and the second electrode film $21_{C2, D2}$ in the first capacitor forming region 14 and the first diode forming region 15. The input-side pad electrode film 4a is electrically connected to the first electrode film $20_L$ via the first connection electrode film $22_L$ and the contact 42, and the output-side pad electrode film 4b is electrically connected to the second electrode film $21_L$ via the second connection electrode film $23_L$ and the contact 42.

Figure 28:
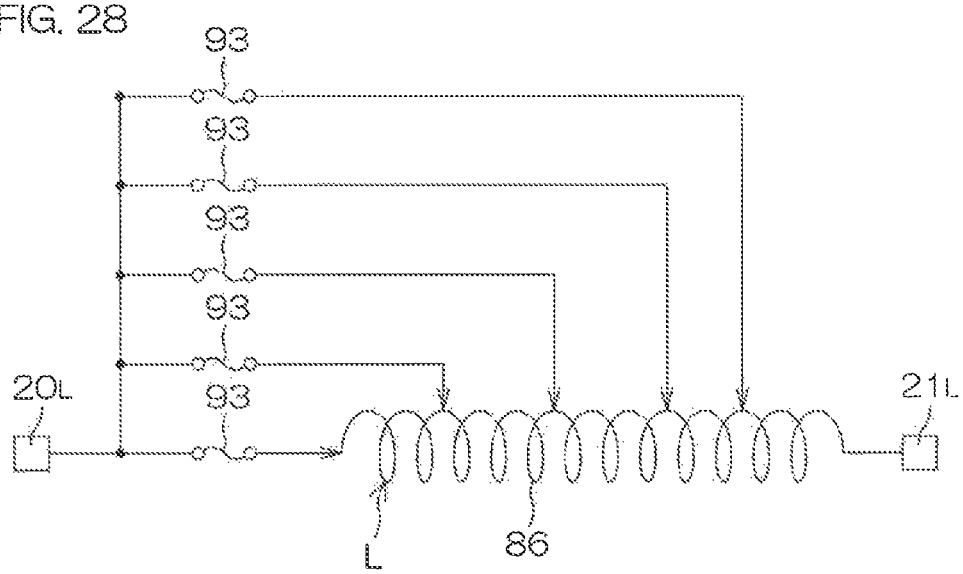
FIG. 28 is a circuit diagram illustrating the configuration of the coil shown in FIG. 27.

FIG. 28 is a circuit diagram illustrating the configuration of the coil L shown in FIG. 27. Referring to FIG. 28, by cutting other fuse portions 93 except for one fuse portion 93 selected, the number of windings of the coil L may be adjusted. Thereby, the inductance value of the coil L can be adjusted to a desired inductance value.

As described above, in this embodiment, the number of windings of the coil L can be adjusted by selectively cutting the fuse portions 93. As such, the inductance value of the coil L can be adjusted to a desired inductance value, an error relative to a required inductance value of the coil L can be minimized.

Further, as a parameter representing the performance (quality) of the coil L, Q value (quality factor) of the coil L is used. The higher is Q value, the smaller loss becomes to provide excellent characteristics as a high frequency inductance. The Q value of the coil L is represented by the following expression:

$$Q=2\pi f L/R_L \quad (1)$$

In the above expression (1), f represents the frequency of a current flowing in the coil L; L represents the inductance of the coil L; and $R_L$ represents the internal resistance of the coil L. The coil L is configured so that the coil conductor 86 is embedded in the trench 87 formed in the substrate 2 to have a spiral shape in plan view. As such, the coil L can have a large cross-sectional area compared to a case where the coil L is formed of the coil conductor 86 on the element forming surface 2a of the substrate 2, and thus the internal resistance $R_L$ of the coil L can be reduced. Thereby, the Q value of the coil L can be improved. As a result, a filter chip 81 achieving favorable frequency characteristics can be provided.

In order to form a filter chip as described above, a trench 87 spirally shaped in plan view is formed in the base substrate 60, for example, by etching with a resist mask prior to a step (the step shown in FIG. 17) of forming the first insulating film 25 on the base substrate 60. Next, an inner-surface insulating film 88 (insulator portion 89) is formed on the inner surface of the trench 87, for example, by thermal oxidation. Next, a coil conductor 86 covering the element forming surface 2a of the substrate 2 is formed by filling the trench 87, for example, by sputtering.

Next, the unnecessary portions of the coil conductor 86 are etched back. Thereby, the coil conductor 86 is embedded in the trench 87. Then, the first insulating film 25, the first metal film 63, and so forth are formed sequentially. Next, the first metal film 63 is patterned to form the first electrode film $20_L$ and the second electrode film $21_L$. Next, after going through the same steps as the previously described cutting steps (FIG. 22) of the fuse portions 56, the inductance value is adjusted by selectively cutting the fuse portions 93. In this way, the coil L is formed. Thereafter, the filter chip 81 is formed by going through the same steps as the steps for the filter chip 1.

Third Embodiment

Figure 29:
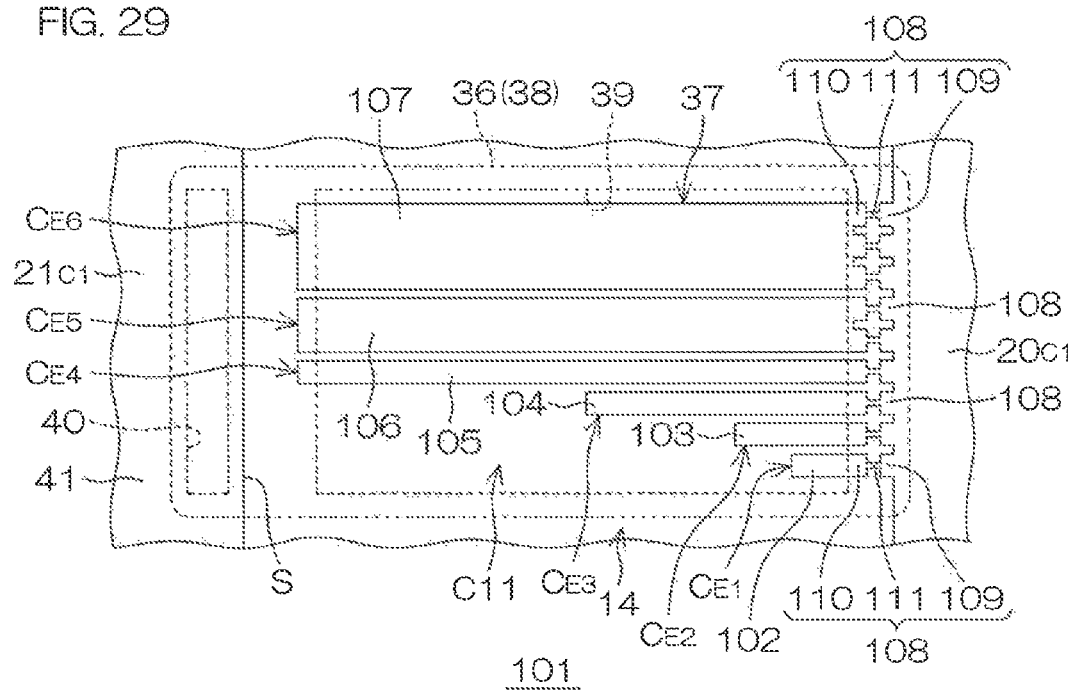
FIG. 29 is a plan view illustrating a capacitor forming region of the filter chip according to a third embodiment of the present invention.

FIG. 29 is a plan view illustrating a first capacitor forming region 14 of a filter chip 101 according to a third embodiment of the present invention. FIG. 29 corresponds to the previously mentioned FIG. 5. In FIG. 29, the same reference numerals are applied to the parts corresponding to the parts shown in the previously mentioned FIG. 5 and so forth, and descriptions are omitted. The configuration of the second capacitor forming region 16 in the filter chip 101 is substantially the same as the configuration of the first capacitor forming region 14, and thus, hereinafter, only the configuration of the first capacitor forming region 14 is described.

As shown in FIG. 29, a first capacitor C11 is formed in the first capacitor forming region 14 in the filter chip 101. The first capacitor C11 includes an upper electrode 37 divided into two or more (six in this embodiment) electrode film portions 102-107, and fuse portions 108 integrally formed with each electrode film portion 102-107. Each electrode film portion 102-107 is formed in a rectangular shape in plan view, elongated in a belt-like shape from a first electrode film $20_{C1}$ to a second electrode film $21_{C1}$.

Respective electrode film portions 102-107 face the impurity region 38 across the dielectric film 35 with mutually different facing areas. The facing areas of the respective electrode film portions 102-107 may form a geometric progression with geometric ratio of 1 or more. This embodiment shows an example where the facing areas of the respective electrode film portion 102-107 are 1:2:4:8:16:32 (geometric progression with geometric ration of 2). These electrode film portions 102-107 constitute a plurality of capacitor elements $C_{E1}$-$C_{E2}$.

The fuse portions 108 are provided between the respective electrode film portions 102-107 and the first electrode film $20_{C1}$, electrically connecting the respective electrode film portions 102-107 with the first electrode film $20_{C1}$. The fuse portions 108 integrally include a first wide-width portions 109 connected to the first electrode film $20_{C1}$, a second wide-width portions 110 connected to the electrode film portions 102-107, and a narrow-width portions 111 connected to the first wide-width portions 109 and the second wide-width portions 110. The narrow-width portions 111 is formed to be narrower than the first wide-width portions 109 and the second wide-width portions 110. By selectively cutting (fusing) the narrow-width portions 111, the electrode film portions 102-107 can be electrically separated from the first electrode film $20_{C1}$ and the second electrode film $21_{C1}$.

Figure 30:
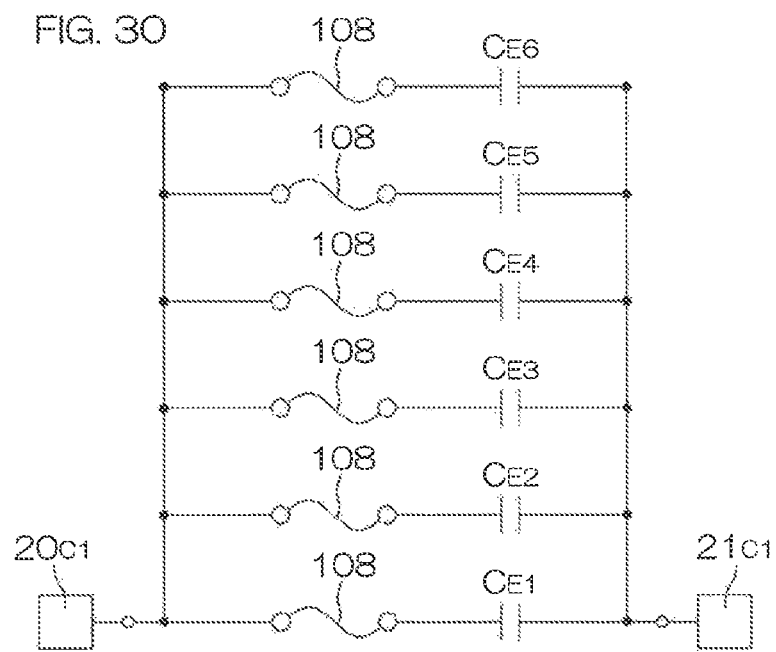
FIG. 30 is a circuit diagram illustrating the configuration of the capacitor shown in FIG. 29.

FIG. 30 is a circuit diagram illustrating the configuration of the first capacitor C11 shown in FIG. 29. As shown in FIG. 30, a plurality of capacitor elements $C_{E1}$-$C_{E6}$ is connected in parallel between the first electrode film $20_{C1}$ and the second electrode film $21_{C1}$. The fuse portions 108 are serially connected with respective capacitor elements $C_{E1}$-$C_{E6}$. In a state where all of the fuse portions are not cut, the capacitance value of the first capacitor C11 is equal to the value of the synthesized capacitance of the entire capacitor elements $C_{E1}$-$C_{E6}$. Whereas, in a state where the fuse portions 108 are selectively cut (melted), the capacitance value of the first capacitor C11 decreases by the capacitance value of the capacitor elements $C_{E1}$-$C_{E6}$ cut off.

As described above, by selectively and electrically separating the electrode film portions 102-107 from the external terminal 3, the capacitance value of the first capacitor C11 can be adjusted. Particularly, in this embodiment, the facing areas of the plurality of the electrode film portions 102-107 facing the lower electrode 36 are provided to form a geometric progression, and thus a capacitance value can be adjusted to a target capacitance value with the accuracy corresponding to the minimum capacitance value (the value of the first term of geometric progression).

Thereby, the capacitance value of the first capacitor C11 can be adjusted to a desired capacitance value, and thus an error relative to a required capacitance value of the first capacitor C11 can be minimized. As a result, the filter chip 101 having favorable frequency characteristics can be provided. Such a filter chip 101 can be formed, for example, only by changing the layout of masks used in patterning the first metal film 63 in FIG. 19 and adding the same steps as the cutting steps of the above-described fuse portions 56.

As above, a plurality of embodiments according to the present invention is described, however, the present invention can also be put into practice in still other embodiments.

Figure 31:
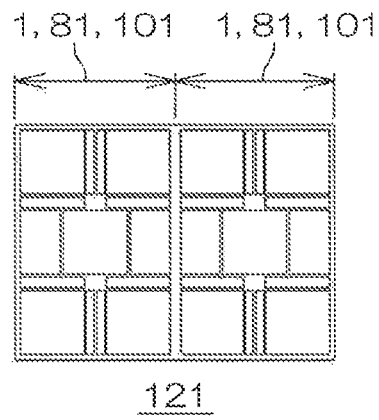
FIG. 31 is a plan view of a filter chip according to a first variation.

For example, each of the previously described embodiments describes an example where the filter chip 1, 81, 101 includes a single filter unit, FU1, FU2. However, the filter chip 1, 81, 101 may include two or more filter units. In this case, as shown in FIG. 31, a filter chip 121 including two filter units FU1, FU2 may be adopted, which is composed of two filter chips 1, 81, 101 with the longitudinal side surfaces 2c jointly formed. Of course, a filter chip including the two filter units FU1, FU2 may be adopted, composed of two filter chips 1 with the transversal side surfaces 2d jointly formed.

Figure 32:
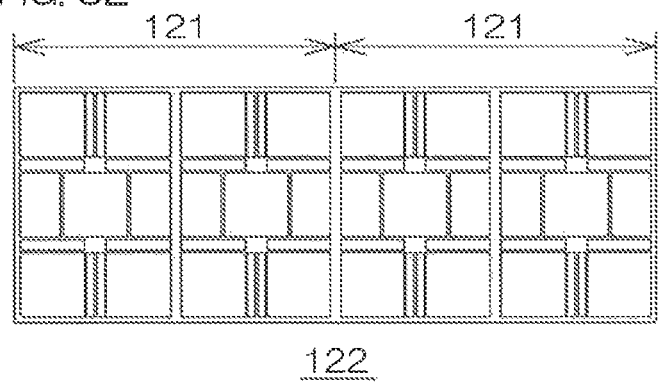
FIG. 32 is a plan view of a filter chip according to a second variation.

Further, as shown in FIG. 32, a filter chip 122 may be adopted, which includes four filter units FU1, FU2, composed of the two filter chips 121 with the transversal side surfaces thereof jointly formed. Further, as shown FIG. 33, a filter chip 123 may be adopted, which includes four filter units FU1, FU2, composed of the two filter chips 121 with the longitudinal side surfaces thereof jointly formed.

Each filter chip 1, 81, 101, 121, 122, 123 with different sizes shown in FIG. 1 and FIGS. 31-33 can be concurrently manufactured in the same steps as the steps shown in the previously described FIGS. 17-23. That is, it is enough to adjust the number of the chip manufacturing regions 61 partitioned by the groove when half etching the base substrate 60 by plasma etching. Thereby, each filter chip 1, 81, 101, 121, 122, 123 with different sizes shown in FIG. 1 and FIGS. 31-33 can be concurrently manufactured after undergoing the rear-surface grinding of the base substrate 60.

Further, in the previously described first embodiment, an example where the resistor R is formed on the second insulating film 26 is described. However, the resistor R may be formed on the substrate 2, having contact with the substrate 2, or may be formed on the first insulating film 25, having contact with the first insulating film 25.

Further, in the previously described second embodiment, an example where the coil L includes the coil conductor 86 embedded in the trench 87 is described. However, the coil conductor 86 may be formed on the substrate 2, having contact with the substrate 2, or may be formed on the first insulating film 25, having contact with the first insulating film 25. The coil conductor 86 may be formed on the second insulating film 26, having contact with the second insulating film 26.

Further, in each previously described embodiment, an example where the first capacitors C1, C11 and the second capacitor C2 include the impurity region 38 as the lower electrode 36 is described. However, the first capacitors C1, and the second capacitor C2 may include the lower electrode 36 composed of a metal film in place of the impurity region 38. The lower electrode 36 may be formed, for example, of the same material as the upper electrode 37.

In this case, the first capacitors C1, C11 and the second capacitor C2 may be formed on the first insulating film 25, having contact with the first insulating film 25, or may be formed on the second insulating film 26, having contact with the second insulating film 26 without having contact with the substrate 2. Further, in this case, in the first capacitors C1, C11 and the second capacitor C2, the lower electrode 36 including a plurality of electrode film portions similarly to the upper electrode 37 shown in FIG. 29 may be formed.

Further, in the previously described first embodiment, an example is described, where the first filter circuit FC1 and the second filter circuit FC2 include the π type low-pass filter 24 formed by parallely connecting the first capacitor C1 and the second capacitor C2 at both ends of the resistor R. However, the π type high-pass filter may be formed by parallely connecting each resistor R at both ends of a single capacitor C1(C2).

Further, in the previously described second embodiment, an example is described, where the first filter circuit FC11 and the second filter circuit FC12 include the π type low-pass filter 85 formed by parallely connecting the first capacitor C1 and the second capacitor C2 at both ends of the resistor R. However, the π type high-pass filter may be formed by parallely connecting each coil L at both ends of a single capacitor C1(C2).

Further, the filter circuits applied to each filter chip 1, 81, 101, 121, 122, 123 are not limited to the first filter circuits FC1, FC11 and the second filter circuits FC2, FC12 including the π type low-pass filters 24, 85 or the π type high-pass filters. A various types of filter circuits as shown in FIGS. 34-37 may be applied to each filter chip 1, 81, 101, 121, 122, 123. FIGS. 34-37 are circuit diagrams illustrating an example of a filter circuit applied to each filter chip 1, 81, 101, 121, 122, 123.

Each filter circuit 131-134 shown in FIGS. 34-37 includes a filter having a first passive element 135, a second passive element 136, and a third passive element 137. Here, "passive elements" represent the above-described resistor R, the capacitors C1, C2, C11, and the coil L. At least two types or more passive elements selected from a group including the resistor R, the capacitors C1, C2, C11, and the coil L are applied to the first passive element 135, the second passive element 136, and the third passive element 137.

Figure 34:
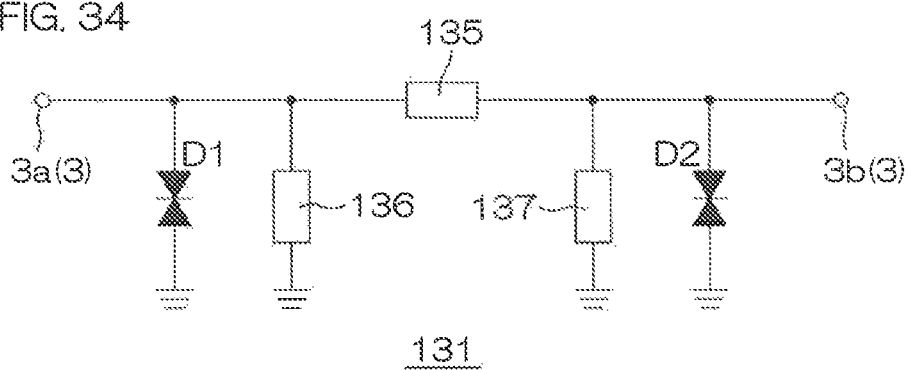
FIG. 34 is a circuit diagram illustrating an example of a filter circuit.

In a filter circuit 131 shown in FIG. 34, a π type low-pass filter or a π type high-pass filter may be formed where the second passive element 136 and the third passive element 137 are parallely connected at both ends of the first passive element 135.

Figure 35:
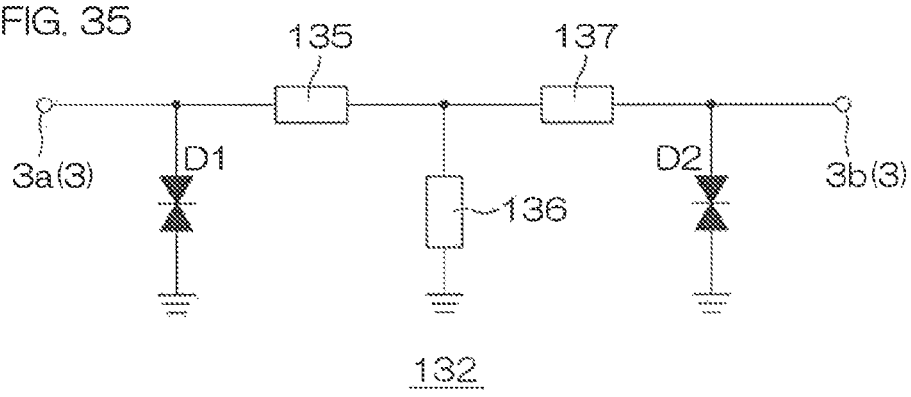
FIG. 35 is a circuit diagram illustrating an example of a filter circuit.

In a filter circuit 132 shown in FIG. 35, a T type low-pass filter or a T type high-pass filter may be formed where the second passive element 136 is parallely connected to the connecting part between the first passive element 135 and the third passive element 137.

Figure 36:
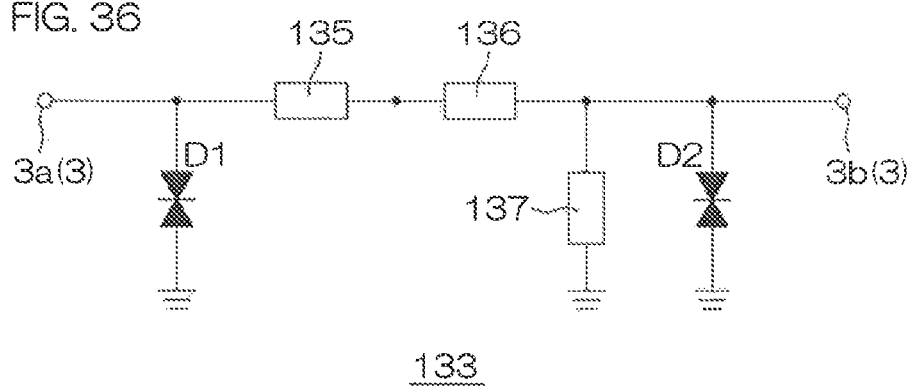
FIG. 36 is a circuit diagram illustrating an example of a filter circuit.

In a filter circuit 133 shown in FIG. 36, an L type low-pass filter or an L type high-pass filter may be formed where the third passive element 137 is parallely connected to a series circuit including the first passive element 135 and the second passive element 136. Of course, in the filter circuit 133, the L type low-pass filter or the L type high-pass filter may be formed by parallely connecting the third passive element 137 only to the first passive element 135 in place of the series circuit composed of the first passive element 135 and the second passive element 136.

Figure 37:
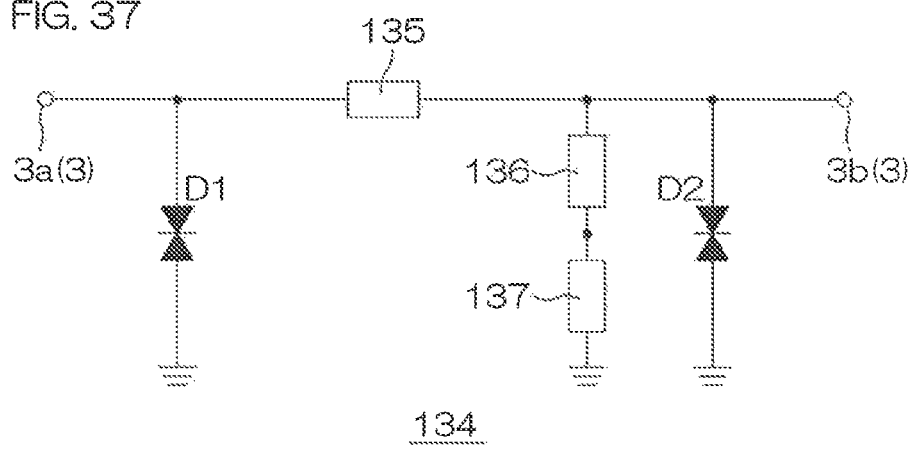
FIG. 37 is a circuit diagram illustrating an example of a filter circuit.

In a filter circuit 134 shown in FIG. 37, the L type low-pass filter or the L type high-pass filter may be achieved where a series circuit including the second passive element 136 and the third passive element 137 is parallely connected to the first passive element 135.

Of course, in FIGS. 34-37, a series circuit formed by a plurality of passive elements, a parallel circuit formed by a plurality of passive elements, or a circuit network combined by these series circuits and parallel circuits may be applied to the first passive element 135, the second passive element 136 and the third passive element 137. That is, a filter chip including a band-pass filter that passes only frequencies in a prescribed frequency range, or a band-stop filter that attenuates those in a prescribed range to very low levels may be created by including a series circuit and a parallel circuit composed of a plurality of passive elements.

Figure 33:
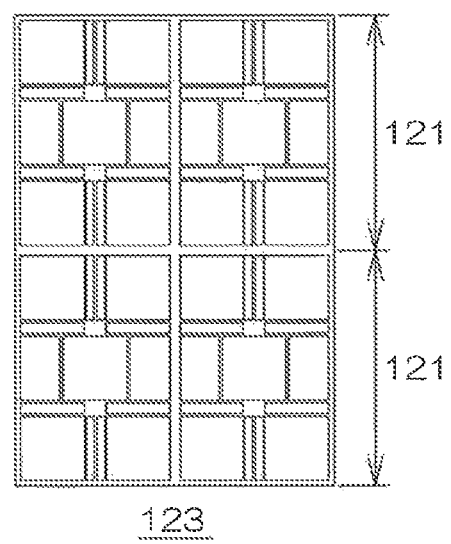
FIG. 33 is a plan view of a filter chip according to a third variation.

Further in each previously described embodiment, the substrate 2 may be a silicon substrate (semiconductor substrate). A silicon substrate facilitates machining (trench formation, cutting of a base substrate 60) compared to a ceramic substrate. For example, a silicon substrate facilitates the dicing of filter chips from the base substrate 60 by plasma etching. Particularly, plasma etching facilitates the dicing of filter chips of various sizes as shown in FIGS. 31-33 from a single base substrate 60 while miniaturizing the chip size.

The previously described filter chip 1, 81, 101 121, 122, 123 may be incorporated into an electronic device and a mobile terminal such as mobile electronic devices, for example, as a filter for a power circuit, a high-frequency circuit, a digital circuit and so forth. In this case, the electronic device may include a housing storing a circuit assembly having filter chip 1, 81, 101 121, 122, 123 mounted thereon.

Figure 38:
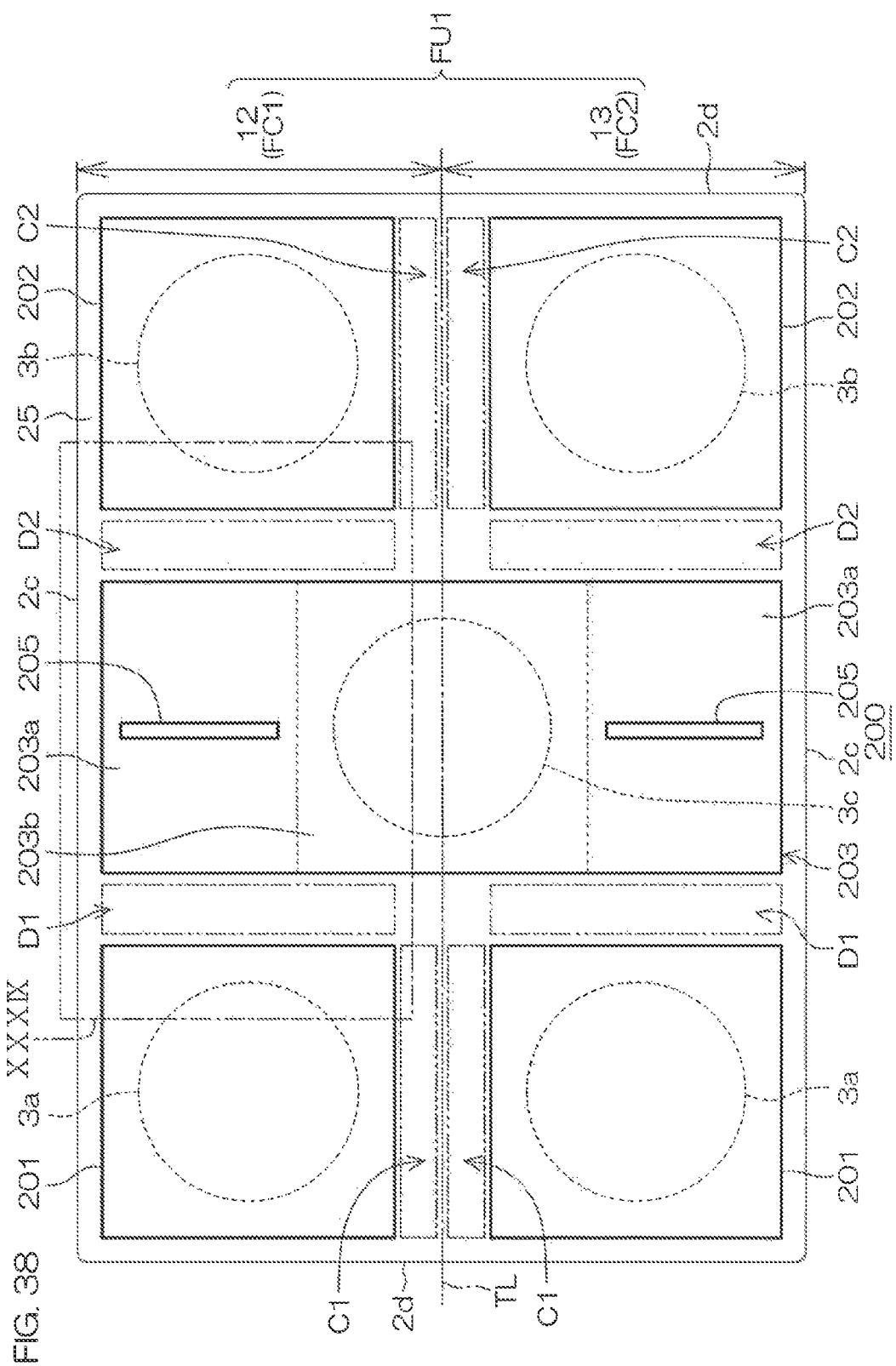
FIG. 38 is a schematic plan view illustrating the configuration on a first insulating film of a filter chip according to a fourth variation.
Figure 39:
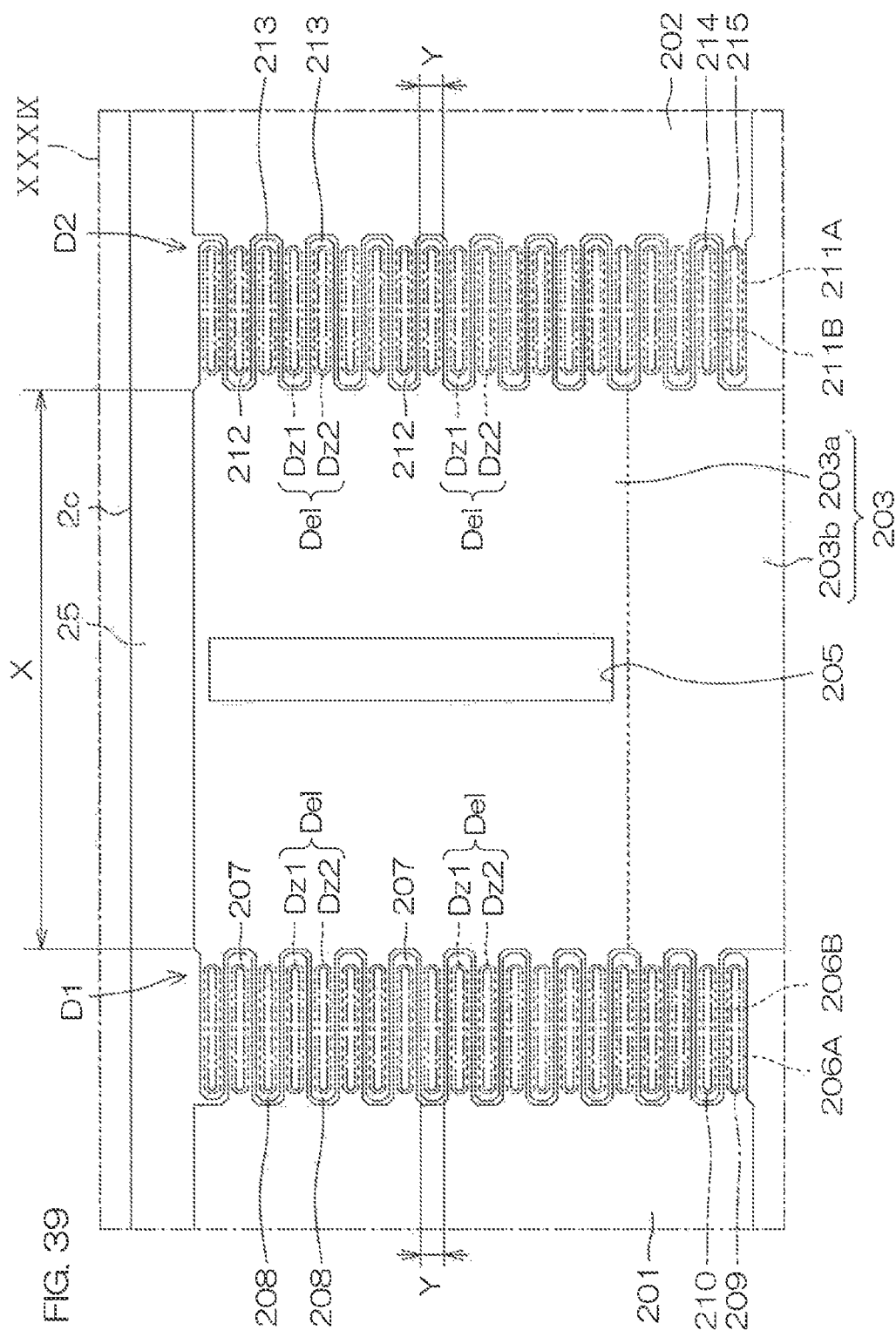
FIG. 39 is an enlarged view of a region surrounded by dashed-dotted lines XXXIX in FIG. 38.

FIG. 38 is a schematic plan view illustrating the configuration on a first insulating film 25 of a filter chip 200 according to a fourth variation. FIG. 39 is an enlarged view of a region surrounded by dashed-dotted lines XXXIX in FIG. 38. In FIGS. 38, 39, the same reference numerals are applied to the configuration corresponding to the configuration described in the first embodiment, and the description is omitted.

Referring to FIG. 38, a filter chip 200 according to this variation is a chip part including the filter unit FU1 that has the first filter circuit FC1 and the second filter circuit FC2 similarly to the previously described first embodiment.

In the filter chip 200 according to this variation, a pair of first input electrode films 201 (first electrode film) electrically connected to the pair of input terminals 3a, a pair of first output electrode films 202 (second electrode film) electrically connected to the pair of output terminals 3b, and a first ground electrode film 203 (reference potential electrode film) electrically connected to the ground terminals 3c are formed on the first insulating film 25 that is formed on the substrate 2. The pair of first input electrode films 201 is respectively disposed right below the pair of input terminals 3a; the pair of first output electrode films 202 is respectively disposed right below the pair of output terminals 3b; and the first ground electrode film 203 is disposed right below the ground terminal 3c.

The pair of first input electrode films 201 in this variation is formed in a rectangular shape in plan view having four sides parallel to the longitudinal side surfaces 2c and the transversal side surfaces 2d of the substrate 2, and is formed spaced apart along the transversal side surface 2d at one end of the substrate 2 (left side end in FIG. 38). The first output electrode films 202 is formed in a rectangular shape in plan view having four sides parallel to the longitudinal side surfaces 2c and the transversal side surfaces 2d of the substrate 2, and is formed spaced apart along the transversal side surface 2d at the other end of the substrate 2 (right side end in FIG. 38).

The first input electrode films 201 and the first output electrode films 202 are formed spaced apart from each other along the longitudinal side surface 2c of the substrate 2, facing each other along the element forming surface 2a.

Hereinafter, a direction along which the first input electrode films 201 and the first output electrode films 202 face each other is simply referred to as "facing direction," and a direction orthogonal to the facing direction is simply referred to as "orthogonal direction." The facing direction is also a direction along the longitudinal side surface 2c of the substrate 2, and the orthogonal is also a direction along the transversal side surface 2d of the substrate 2.

The first ground electrode film 203, in this variation, includes a first portion 203a arranged in a region between the first input electrode films 201 and the first output electrode films 202 so as to cover the region between the first input electrode films 201 and the first output electrode films 202. The first ground electrode film 203 also includes a second portion 203b arranged displaced from the first portion 203a in a direction orthogonal to the facing direction so as to cover a region outside the region between the first input electrode film 201 and the first output electrode film 202. In this embodiment, the first portion 203a of the first ground electrode film 203 is formed as an extraction portion extracted from the second portion 203b of the first ground electrode film 203 between the first input electrode films 201 and the first output electrode films 202.

More specifically, the second portion 203b of the first ground electrode film 203 is positioned in the region right below the ground terminal 3c, that is, in the center region of the substrate 2, and is formed in a rectangular shape in plan view having four sides parallel to the longitudinal side surface 2c and the transversal side surface 2d. The second portion 203b of the first ground electrode film 203 has a portion facing a portion of the first input electrode films 201 and a portion of the first output electrode films 202 along the facing direction. The first portion 203a of the first ground electrode film 203 is extracted from the second portion 203b toward the region between the first input electrode film 201 and the first output electrode film 202 along the orthogonal direction, and is formed in a rectangular shape in plan view. In this embodiment, the first portion 203a is a single electrode film extracted from the second portion 203b.

The first portion 203a of the first ground electrode film 203 is formed spaced apart from the the first input electrode film 201 and the first output electrode film 202, and faces the first input electrode film 201 and the first output electrode film 202 along the facing direction. The width in the longitudinal direction of the first portion 203a of the first ground electrode film 203 is substantially the same as the width in the longitudinal direction of the second portion 203b of the first ground electrode film 203, thereby the entire first ground electrode film 203 is formed in a rectangular shape in plan view.

A removal region 205 rectangularly shaped in plan view, from which a portion of the electrode material of the first portion 203a is removed, is selectively formed in the first portion 203a of the first ground electrode film 203. In this variation, the removal region 205 includes an opening extending along the orthogonal direction at the center in the width direction of the first portion 203a. A ratio of the area that the removal region 205 occupies in the first portion 203a of the first ground electrode film 203 is smaller than a ratio of the area that the region outside the removal region 205 occupies in the first portion 203a of the first ground electrode film 203. The specific function of this removal region 205 will be described later.

In the filter chip 200 according to this variation, similarly to the first embodiment, the first filter circuit forming region 12 and the second filter circuit forming region 13 are provided having the transversal line TL interposed therebetween, the transversal line TL traversing each intermediate portion of a pair of side surfaces 2d along the transversal direction. The configurations of the first filter circuit forming region 12 and the configurations of the second filter circuit forming region 13 are substantially same. Hereinafter, the configurations of the first filter circuit forming region 12 are described as an example, and the description of the configurations of the second filter circuit forming region 13 is omitted by putting the same reference numeral as that of the configuration of the first filter circuit forming region 12 to each configuration of the second filter circuit forming region 13.

Referring to FIG. 39, the previously described first diode D1 is formed in the surface part of the substrate 2 between the first input electrode film 201 and the first ground electrode film 203 and is electrically connected to the first input electrode film 201 and the first ground electrode film 203. Further, the previously described second diode D2 is formed in the surface part of the substrate 2 between the first output electrode film 202 and the first ground electrode film 203 and is electrically connected to the first output electrode film 202 and the first ground electrode film 203. Similarly to the previously described first embodiment, both the first diode D1 and the second diode D2 form an overvoltage protection circuit for protecting the π type low-pass filter 24 from an overvoltage in the first filter circuit FC1 (also see FIG. 3 and so forth).

In this variation, the first diode D1 is formed in the region where a part of the second portion 203b of the first ground electrode film 203 and a part of the first input electrode film 201 face each other and in the region where a part of the first portion 203a of the first ground electrode film 203 and a part of the first input electrode film 201 face each other between the first input electrode film 201 and the first ground electrode film 203.

The first diode D1 includes the substrate 2 as a diffusion region including p-type impurities (first impurity region), and a plurality of n-type diffusion regions 206A, 206B (second impurity region) including n-type impurities formed in the surface part in the substrate 2. The plurality of n-type diffusion regions 206A, 206B is formed spaced apart from each other in the orthogonal direction. The plurality of n-type diffusion regions 206A, 206B includes a plurality of first diffusion regions 206A electrically connected to the first input electrode film 201 (input terminal 3a), and a plurality of second diffusion regions 206B electrically connected to the first ground electrode film 203 (ground terminal 3c). The plurality of first diffusion regions 206A and the plurality of second diffusion regions 206B are alternately arranged along the orthogonal direction.

Both the plurality of n-type diffusion regions 206A, 206B are formed in a belt-like shape in plan view, extending along the facing direction between the first input electrode film 201 and the first output electrode film 202, between the first input electrode film 201 and the first ground electrode film 203. The plurality of n-type diffusion regions 206A, 206B is respectively formed to have substantially the same depth and substantially the same impurity concentration. Further, the plurality of n-type diffusion regions 206A, 206B is respectively formed in substantially the same shape in plan view.

That is, the widths of the plurality of n-type diffusion regions 206A, 206B are set equal to each other along the facing direction, and set equal to each other also along the orthogonal direction. The plurality of n-type diffusion regions 206A, 206B is the configuration element corresponding to the first plurality of diffusion regions 45 and the second plurality of diffusion regions 46.

The first input electrode film 201 includes a plurality of first belt-like portions 207 extracted toward the first ground electrode film 203 to cover the plurality of first diffusion regions 206A one by one. Further the first ground electrode film 203 includes a plurality of second belt-like portions 208 extracted toward the first input electrode film 201 to cover the plurality of second diffusion regions 206B one by one. The first belt-like portions 207 of the first input electrode film 201 and the second belt-like portions 208 of the first ground electrode film 203 are formed in comb-like shapes to engage with each other.

Each first belt-like portion 207 of the first input electrode film 201 is formed in a rectangular shape in plan view, having a corner-notched tip, and is electrically connected to the first diffusion region 206A via the first contact hole 209 formed in the first insulating film 25. Further, each second belt-like portion 208 of the first ground electrode film 203 is formed in a rectangular shape in plan view, having a corner-notched tip, and is electrically connected to the first diffusion region 206A via the second contact hole 210 formed in the first insulating film 25.

Thus, the first diode D1 includes a single bidirectional Zener diode integrally including a plurality of bidirectional Zener diode elements De1 formed along the orthogonal direction. More specifically, the bidirectional Zener diode elements De1 includes a first Zener diode Dz1 and a second Zener diode Dz2 formed adjacent to each other in the orthogonal direction. The first Zener diode Dz1 is formed by a p-n junction between the substrate 2 and the first diffusion region 206A. The second Zener diode Dz2 is formed by a p-n junction between the substrate 2 and the second diffusion region 206B. The first Zener diode Dz1 and the second Zener diode Dz2 are electrically connected to each other via the substrate 2.

Meanwhile, in this variation, the second diode D2 is formed in the region where a part of the second portion 203b of the first ground electrode film 203 and a part of the first output electrode film 202 face each other and in the region where a part of the first portion 203a of the first ground electrode film 203 and a part of the first output electrode film 202 face each other between the first output electrode film 202 and the first ground electrode film 203.

The first diode D2 includes the substrate 2 as a p-type diffusion region, and a plurality of n-type diffusion regions 211A, 211B including n-type impurities formed in the surface part in the substrate 2. The plurality of n-type diffusion regions 211A, 211B is formed spaced apart from each other in the orthogonal direction. The plurality of n-type diffusion regions 211A, 211B includes a plurality of first diffusion regions 211A electrically connected to the first output electrode film 202 (output terminal 3a), and a plurality of second diffusion regions 211B electrically connected to the first ground electrode film 203 (ground terminal 3c). The plurality of first diffusion regions 211A and the plurality of second diffusion regions 211B are alternately arranged along the orthogonal direction. The plurality of n-type diffusion regions 211A, 211B is respectively formed to have substantially the same configuration with the plurality of n-type diffusion regions 206A, 206B in relation to the previously described first diode D1.

The first output electrode film 202 includes a plurality of first belt-like portions 212 extracted toward the first ground electrode film 203 to cover the plurality of first diffusion regions 211A one by one. Further the first ground electrode film 203 includes a plurality of second belt-like portions 213 extracted toward the first output electrode film 202 to cover the plurality of second diffusion regions 211B one by one. The first belt-like portions 212 of the first output electrode film 202 and the second belt-like portions 213 of the first ground electrode film 203 are formed in comb-like shapes to engage with each other.

Each first belt-like portion 212 of the first output electrode film 202 is formed in a rectangular shape in plan view, having a corner-notched tip, and is electrically connected to the first diffusion region 211A via the first contact hole 214 formed in the first insulating film 25. Further, each second belt-like portion 213 of the first ground electrode film 203 is formed in a rectangular shape in plan view, having a corner-notched tip, and is electrically connected to the first diffusion region 211A via the second contact hole 215 formed in the first insulating film 25.

Thus, similarly to the previously described first diode D1, the second diode D2 includes a single bidirectional Zener diode integrally including a plurality of bidirectional Zener diode elements De1 formed along the orthogonal direction. More specifically, the bidirectional Zener diode elements De1 includes a first Zener diode Dz1 and a second Zener diode Dz2 formed adjacent to each other in the orthogonal direction. The first Zener diode Dz1 is formed by a p-n junction between the substrate 2 and the first diffusion region 211A. The second Zener diode Dz2 is formed by a p-n junction between the substrate 2 and the second diffusion region 211B. The first Zener diode Dz1 and the second Zener diode Dz2 are electrically connected to each other via the substrate 2.

The first belt-like portion 207 of the first input electrode film 201, the first belt-like portion 212 of the first output electrode film 202, and the second belt-like portions 208, 213 of the first ground electrode film 203 are also configuration elements corresponding to the first extraction electrode 49 and the second extraction electrode 50 in relation to the previously described first embodiment. Further, the first contact holes 209, 214 and the second contact hole 210, 215 are also configuration elements corresponding to the first contact hole 47 and the second contact hole 48 in relation to the previously described first embodiment. Although not shown here, similarly to the previously described first embodiment, the first insulating film 25 has the thin film portion 25a (see FIG. 4) in the portion where the first contact holes 209 and the second contact hole 210 are formed.

In the filter chip 200 according to this variation, the relatively wide first portion 203a of the first ground electrode film 203 is arranged in the region between the first input electrode film 201 and the first output electrode film 202. In the filter chip 200 according to this variation, the concentration of electric field in the first ground electrode film 203 is suppressed by such a configuration, and thus each electrostatic discharge tolerance of the first diode D1 and the second diode D2 can be improved. A filter chip 220 having a first ground electrode film 203 different in shape from the first ground electrode film 203 of the filter chip 200 according to this variation, is prepared as shown in FIG. 40 to compare each electrostatic discharge tolerance of the first diode D1 and the second diode D2 of the filter chip 200 according to this variation with the electrostatic discharge tolerance of the diode in the filter chip 220.

Figure 40:
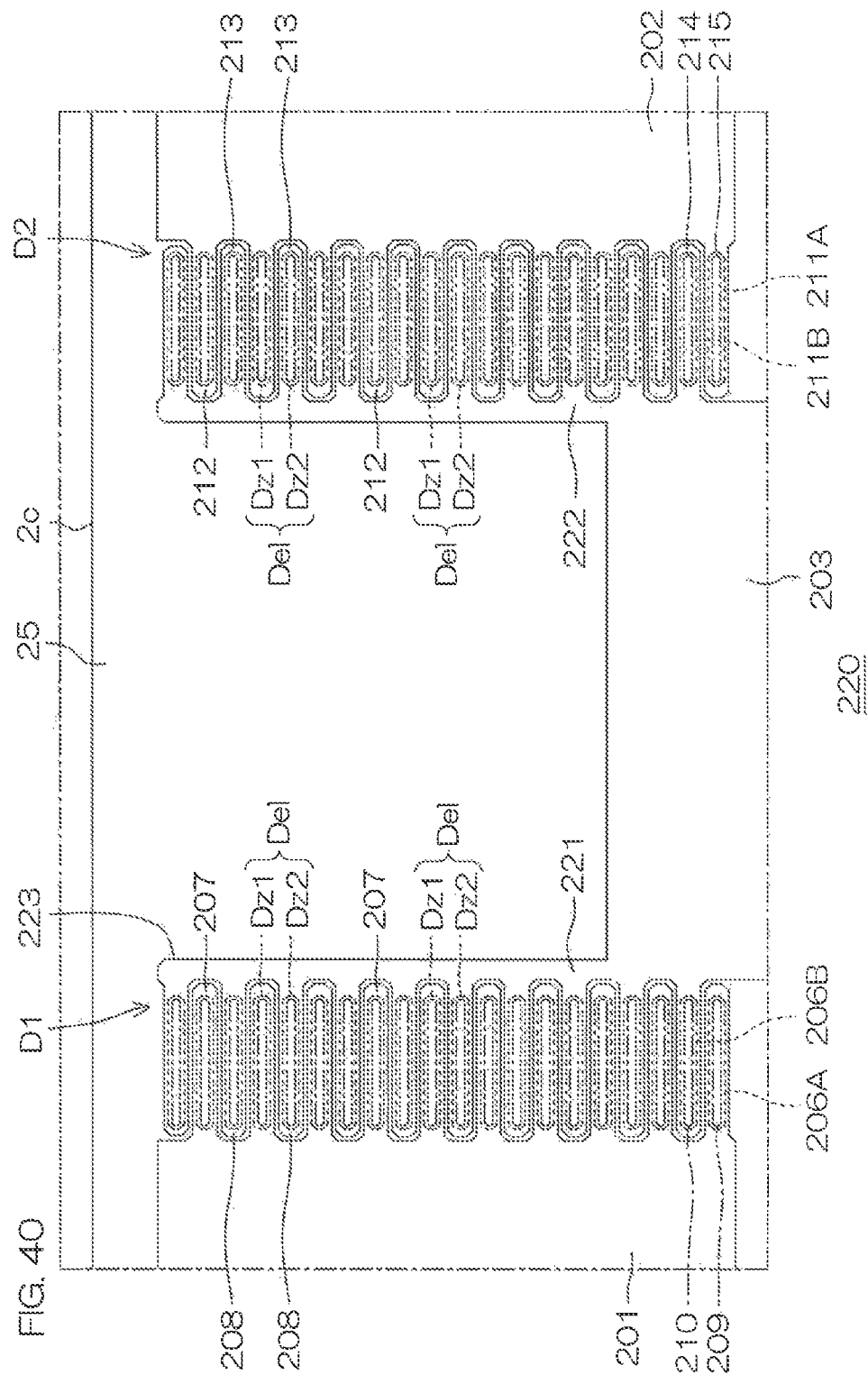
FIG. 40 is an enlarged view of a region corresponding to FIG. 39, and a plan view illustrating a first ground electrode film in a filter chip according to a reference example.

FIG. 40 is an enlarged view of a region corresponding to FIG. 39, and a plan view illustrating the first ground electrode film 203 in the filter chip 220 according to a reference example. In the filter chip 220 according to the reference example, the first ground electrode film 203 includes a first extraction portion 221 and a second extraction portion 222 extracted from the second portion 203b instead of the first portion 203a in the region between the first input electrode film 201 and the first output electrode film 202.

The first extraction portion 221 is extracted from the end of the second portion 203b near the first input electrode film 201 in a belt-like shape along the orthogonal direction. The width of the first extraction portion 221 along the facing direction is set to a value smaller than the width of one of second belt-like portions 208 in the first ground electrode film 203 along the orthogonal direction. Whereas, the second extraction portion 222 is extracted from the end of the second portion 203b near the first output electrode film 202 in a belt-like shape along the orthogonal direction. The width of the second extraction portion 222 along the facing direction is set to a value smaller than the width of one of second belt-like portions 213 in the first ground electrode film 203 along the orthogonal direction.

In the filter chip 220 according to the reference example, the first diode D1 is formed in the surface part of the substrate 2 between the first input electrode film 201 and the first extraction portion 221 to electrically connecting the first input electrode film 201 and the first extraction portion 221. Further, the second diode D2 is formed in the surface part of the substrate 2 between the first output electrode film 202 and the second extraction portion 222 to electrically connecting the first output electrode film 202 and the second extraction portion 222.

A relatively wide free space 223 formed in a rectangular shape in plan view is partitioned by the second portion 203b of the first ground electrode film 203, the first extraction portion 221 and the second extraction portion 222 in the region between the first input electrode film 201 and the first output electrode film 202. A ratio of the area occupied by the free space 223 in plan view in the region between the first input electrode film 201 and the first output electrode film 202 is larger than a ratio of the area occupied by the first ground electrode film 203 in plan view in the region between the first input electrode film 201 and the first output electrode film 202. Other configurations in the filter chip 220 according to the reference example is the same as those in the filter chip 200 according to this variation, and thus the description is omitted.

Figure 41:
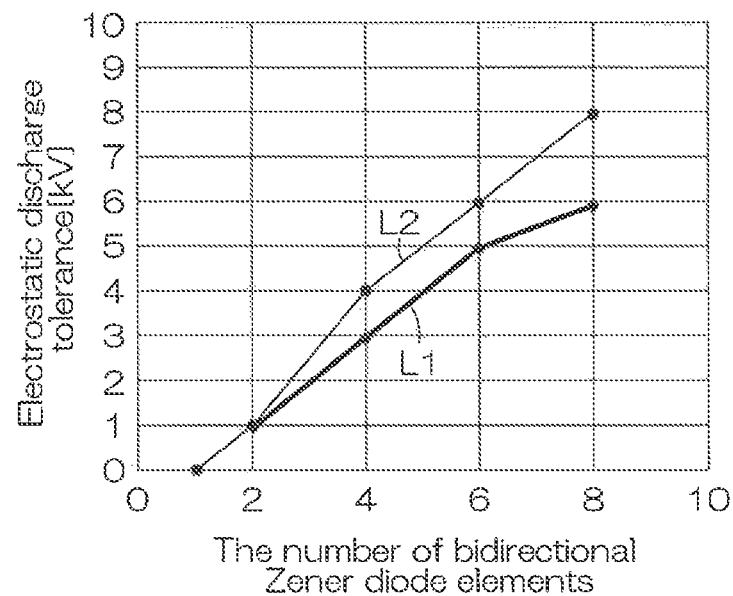
FIG. 41 is a graph illustrating simulation results of the electrostatic discharge tolerance of a first diode when changing the number of bidirectional Zener diode elements in the filter chip according to the fourth variation and the filter chip according to the reference example.

FIG. 41 is a graph illustrating simulation results of the electrostatic discharge tolerance of the first diode D1 when changing the number of bidirectional Zener diode elements De1 in the filter chip 200 according to this variation and the filter chip 220 according to the reference example. Although FIG. 41 shows the simulation results of the electrostatic discharge tolerance of the first diode D1, it should be added that the results can also be applied to the second diode D2.

In FIG. 41, the vertical axis represents electrostatic discharge tolerances, and the horizontal axis represents the number of the bidirectional Zener diode elements De1. FIG. 41 shows two lines L1, L2. The line L1 represents the relationship between the number of the bidirectional Zener diode elements De1 and electrostatic discharge tolerances of the filter chip 220 according to the reference example. The line L2 represents the relationship between the number of the bidirectional Zener diode elements De1 and electrostatic discharge tolerances of the filter chip 200 according to this variation.

With reference to the Lines L1, L2, it can be seen that the electrostatic discharge tolerance can be improved by increasing the number of the bidirectional Zener diode elements De1. It can also be seen that the filter chip 200 according to this variation can achieve an electrostatic discharge tolerance higher than the electrostatic discharge tolerance of the filter chip 220 according to the reference example.

This can be explained for the following reasons. That is, with reference to FIG. 40, in the case of the filter chip 220 according to the reference example, the width of the first extraction portion 221 along the facing direction and the width of the second extraction portion 222 along the facing direction are set to values smaller than the width of the second portion 203b of the first ground electrode film 203 along the facing direction, and smaller than the width of the second belt-like portions 208, 213 of the first ground electrode film 203 along the orthogonal direction. As such, when currents separately flowing in the plurality of second belt-like portions 208 are joined together at the first extraction portion 221, current density sharply increases at the first extraction portion 221. Further, when currents separately flowing in the plurality of second belt-like portions 213 are joined together at the second extraction portion 222, current density sharply increases at the second extraction portion 222.

As a result, electric field concentration takes place at the first extraction portion 221 and/or the second extraction portion 222 and the electrostatic discharge tolerance decreases. Such electric field concentration most likely takes place particularly at the joint between the second portion 203b of the first ground electrode film 203 and the first extraction portion 221, and at the joint between the second portion 203b of the first ground electrode film 203 and the second extraction portion 222.

As such, as shown in the filter chip 200 according to this variation, by securing a relatively wide current path with the first portion 203a having a relatively wide width, currents can be prevented from concentrating locally at the ground electrode film 203. Thereby, electric field concentration can be prevented from taking place at the joints of the first portion 203a and the second portion 203b of the first ground electrode film 203, thus, the electrostatic discharge tolerance can be improved.

With reference to FIG. 39, the dimensions of the first ground electrode film 203 of the filter chip 200 according to this variation is specifically described. In the first ground electrode film 203 according to this variation, a width X of the first portion 203a along the facing direction is preferably set to a value greater than at least a width Y of the second belt-like portions 208, 213 along the orthogonal direction.

More specifically, the width X of the first portion 203a along the facing direction is preferably set to a value at least greater than a total value of the width Y in the orthogonal direction of the plurality of second belt-like portions 208 disposed between the first portion 203a and the first input electrode film 201, or to a value greater than a total value of the width Y in the orthogonal direction of the plurality of second belt-like portions 213 disposed between the first portion 203a and the first output electrode film 202.

Furthermore specifically, the width X of the first portion 203a along the facing direction is preferably set to a value greater than a total value of the width Y in the orthogonal direction of the plurality of second belt-like portions 208 disposed between the first portion 203a and the first input electrode film 201, and the width Y in the orthogonal direction of the plurality of second belt-like portions 213 disposed between the first portion 203a and the first output electrode film 202.

In this way, by forming the first portion 203a wherein the width X in the facing direction is set to a value at least greater than the width Y of respective second belt-like portions 208, 213 in the orthogonal direction, current density can be effectively prevented from sharply increasing at the first portion 203a when currents following in the plurality of second belt-like portions 208, 213 are joined together at the first portion 203a. Thereby, electric field concentration can be effectively prevented from taking place at the junctions of the first portion 203a and the second portion 203b of the first ground electrode film 203, and thus the electrostatic discharge tolerance can be effectively improved.

Although this variation shows an example where the first portion 203a of the first ground electrode film 203 is composed of a single electrode film, the first portion 203a of the first ground electrode film 203 may be divided into a plurality of electrode film portions by the previously described removal region 205 and so forth. In this case, provided that the width of each electrode film portion along the facing direction is set to X, the width X of each electrode film portion is preferably set to a value greater than the width Y of the second belt-like portions 208, 213 along the orthogonal direction, or to a value greater than the total value of width Y of the plurality of the second belt-like portions 208, 213 along the orthogonal direction, as in the case of the previously described width X of the first portion 203a.

Figure 42:
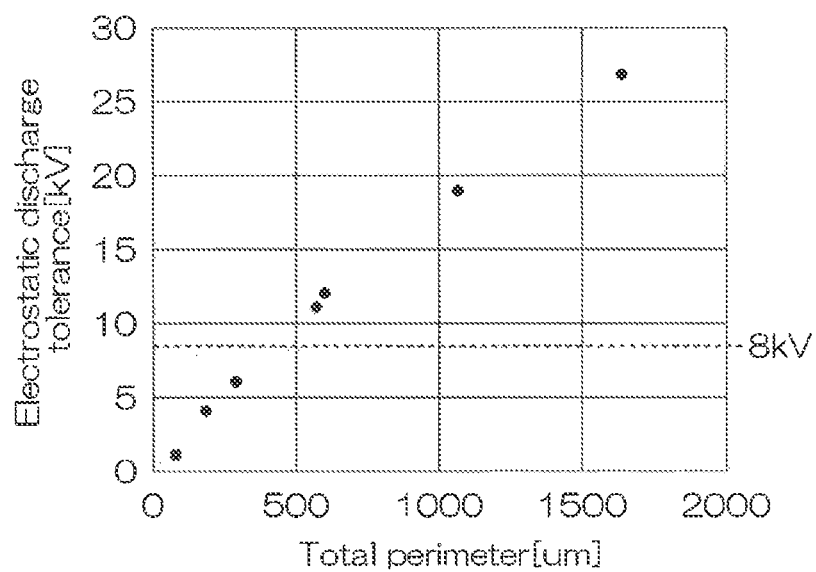
FIG. 42 is a graph illustrating simulation results of the electrostatic discharge tolerance of the first diode when changing a total perimeter of a plurality of diffusion regions in the filter chip according to the fourth variation.

In this variation, FIG. 42 shows a change in electrostatic discharge tolerance of the first diode D1 when the total perimeter of the plurality of n-type diffusion regions 206A, 206B is made to vary in the first diode D1. FIG. 42 is a graph illustrating simulation results of the electrostatic discharge tolerance of the first diode D1 when changing the total perimeter of the plurality of n-type diffusion regions 206A, 206B in the filter chip 200 according to the fourth variation shown in FIG. 4. Although FIG. 42 shows simulation results of the electrostatic discharge tolerance of the first diode D1, it should be added that the results can also be applied to the second diode D2.

In FIG. 42, the vertical axis represents electrostatic discharge tolerances and the horizontal axis represents the total perimeter of the plurality of n-type diffusion regions 206A, 206B. Here, by changing the number of the bidirectional Zener diode elements De1, the total perimeter of the plurality of n-type diffusion regions 206A, 206B is made to vary. Here, the total perimeter of the plurality of n-type diffusion regions 206A, 206B is defined as the total value of perimeters of each n-type diffusion regions 206A, 206B with respect to the element forming surface 2a of the substrate 2.

Referring to FIG. 42, provided that the total perimeter of the plurality of n-type diffusion regions 206A, 206B is between 500 μm and 2000 μm, inclusive, it can be seen that the electrostatic discharge tolerance between 8 kV and 30 kV, inclusive, can be achieved. More specifically, provided that the total perimeter of the plurality of n-type diffusion regions 206A, 206B is 500 μm or greater, the electrostatic discharge tolerance no less than 8 kV can be achieved; provided that the total perimeter is 1000 μm or greater, the electrostatic discharge tolerance no less than 15 kV can be achieved; provided that the total perimeter is 1500 μm or greater, the electrostatic discharge tolerance no less than 25 kV can be achieved.

Figure 43:
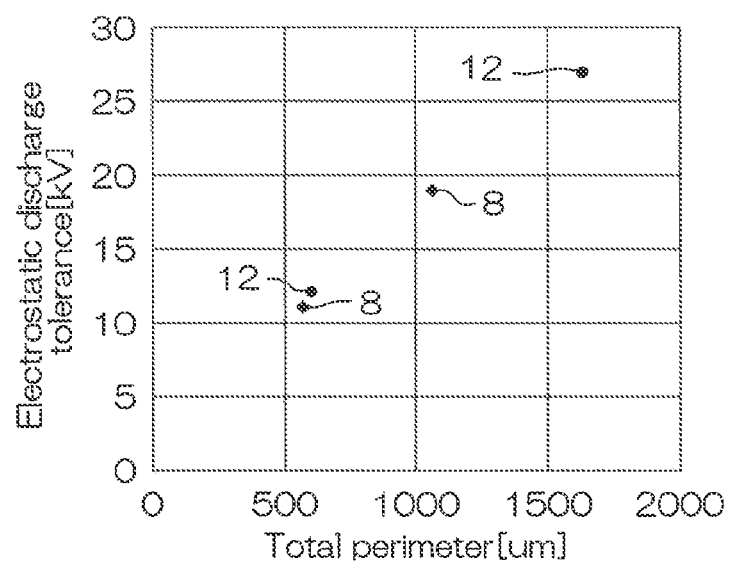
FIG. 43 is a graph illustrating simulation results of the electrostatic discharge tolerance of the first diode when changing the total perimeter while the number of Zener diode elements is fixed in the filter chip according to the fourth variation.

FIG. 43 is a graph illustrating simulation results of the electrostatic discharge tolerance of the first diode when changing the total perimeter of the plurality of n-type diffusion regions 206A, 206B while the number of Zener diode elements De1 is fixed in the filter chip 200 according to the fourth variation shown in FIG. 38. Although FIG. 43 shows simulation results of the electrostatic discharge tolerance of the first diode D1, it should be added that the results can also be applied to the second diode D2.

In FIG. 43, the vertical axis represents electrostatic discharge tolerances and the horizontal axis represents the total perimeter of the plurality of n-type diffusion regions 206A, 206B. FIG. 43 shows electrostatic discharge tolerances, when the total perimeter of the plurality of n-type diffusion regions 206A, 206B is made to vary with the number of the bidirectional Zener diode elements De1 set to 8. Further, FIG. 43 shows electrostatic discharge tolerances, when the total perimeter of the plurality of n-type diffusion regions 206A, 206B is made to vary with the number of the bidirectional Zener diode elements De1 set to 12.

Referring to FIG. 43, when the number of the bidirectional Zener diode elements De1 is set to 8, and the total perimeter of the plurality of n-type diffusion regions 206A, 206B is approximately 550 μm, the electrostatic discharge tolerance is 11 KV. When the total perimeter of the plurality of n-type diffusion regions 206A, 206B is increased from approximately 550 μm to approximately 1100 μm, the electrostatic discharge tolerance is increased from 11 KV to 19 kV.

Further, when the number of the bidirectional Zener diode elements De1 is set to 12, and the total perimeter of the plurality of n-type diffusion regions 206A, 206B is approximately 600 μm, the electrostatic discharge tolerance is 12 KV. When the total perimeter of the plurality of n-type diffusion regions 206A, 206B is increased from approximately 600 μm to approximately 1800 μm, the electrostatic discharge tolerance is increased from 12 KV to 27 kV.

When comparing the case where the number of the bidirectional Zener diode elements De1 is 8, and the total perimeter of the plurality of n-type diffusion regions 206A, 206B is approximately 550 μm with the case where the number of the bidirectional Zener diode elements De1 is 12, and the total perimeter of the plurality of n-type diffusion regions 206A, 206B is approximately 600 μm, there is not so much difference between these electrostatic discharge tolerances.

In contrast, when the total perimeter of the plurality of n-type diffusion regions 206A, 206B is increased, the electrostatic discharge tolerance is increased whether the number of the bidirectional Zener diode elements De1 is 8 or 12. From this, it can be seen that the electrostatic discharge tolerance of the diode D1 changes depending on the total perimeter of the plurality of n-type diffusion regions 206A, 206B rather than the number of the bidirectional Zener diode elements De1.

From the simulation results shown in FIGS. 41-43, it can be seen that the first diode D1 is preferably designed so that the total perimeter of the plurality of n-type diffusion regions 206A, 206B is 500 μm or greater, 1000 μm or greater, or 1500 μm or greater, and the number of the bidirectional Zener diode elements De1 is no less than 8 or no less than 12. According to this design, a favorable electrostatic discharge tolerance can be achieved.

Thus, the filter chip 200 according to this variation, the first ground electrode film 203 is formed in the region between the first input electrode film 201 and the first output electrode film 202 to cover the region therebetween. As such, the first ground electrode film 203 allows the region between the first input electrode film 201 and the first output electrode film 202 to provide a relatively wide current path, and thus even if a current flows into the first ground electrode film 203 from either one or both of the first diode D1 and the second diode D2, currents can be prevented from concentrating locally at the ground electrode film 203. Therefore, the occurrence of electric field concentration at the first ground electrode film 203 can be favorably suppressed, and thus the filter chip 200 capable of improving voltage resistance can be provided.

Figure 44:
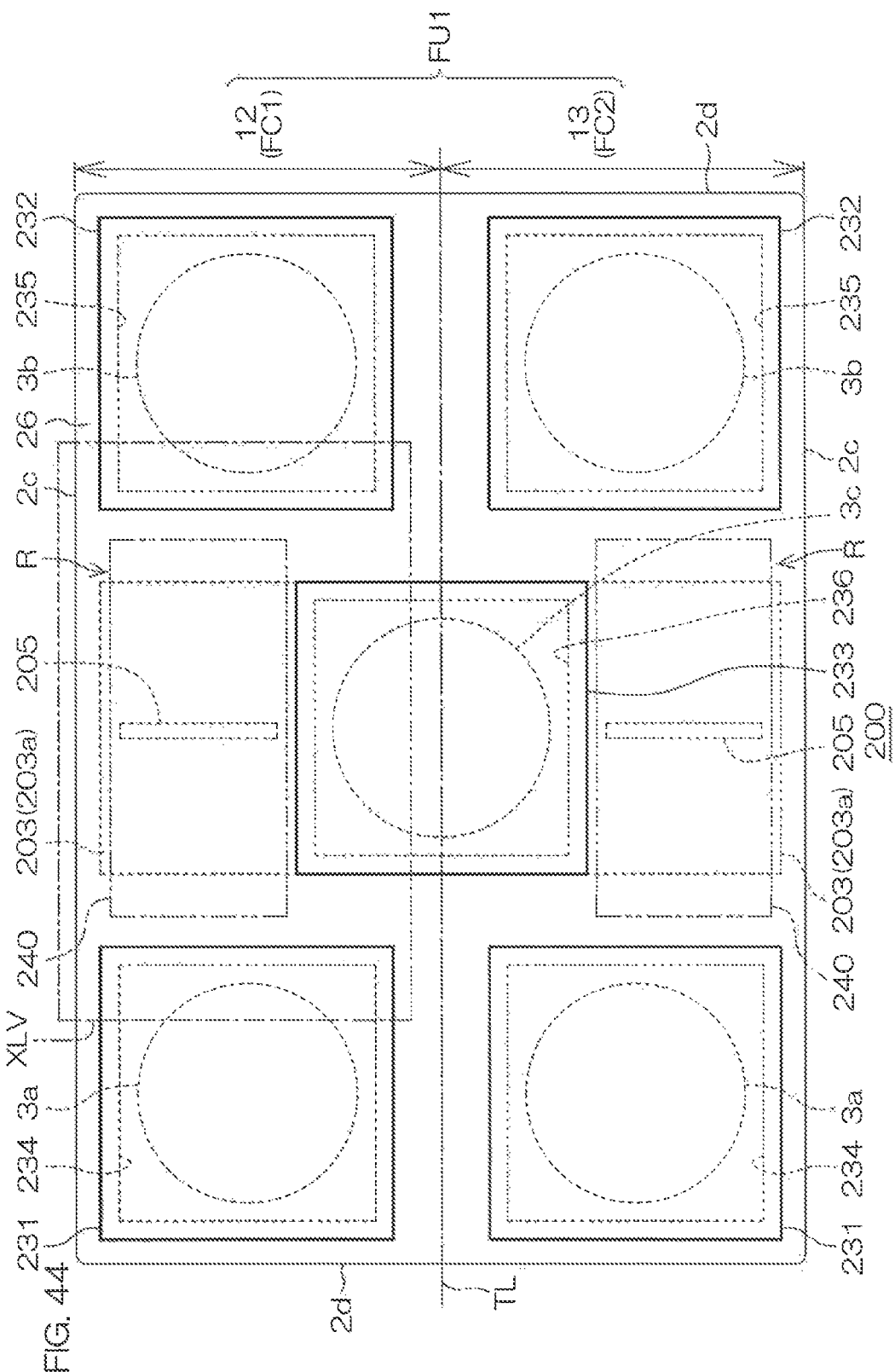
FIG. 44 is a schematic plan view illustrating the configuration on a second insulating film in the filter chip shown in FIG. 38.
Figure 45:
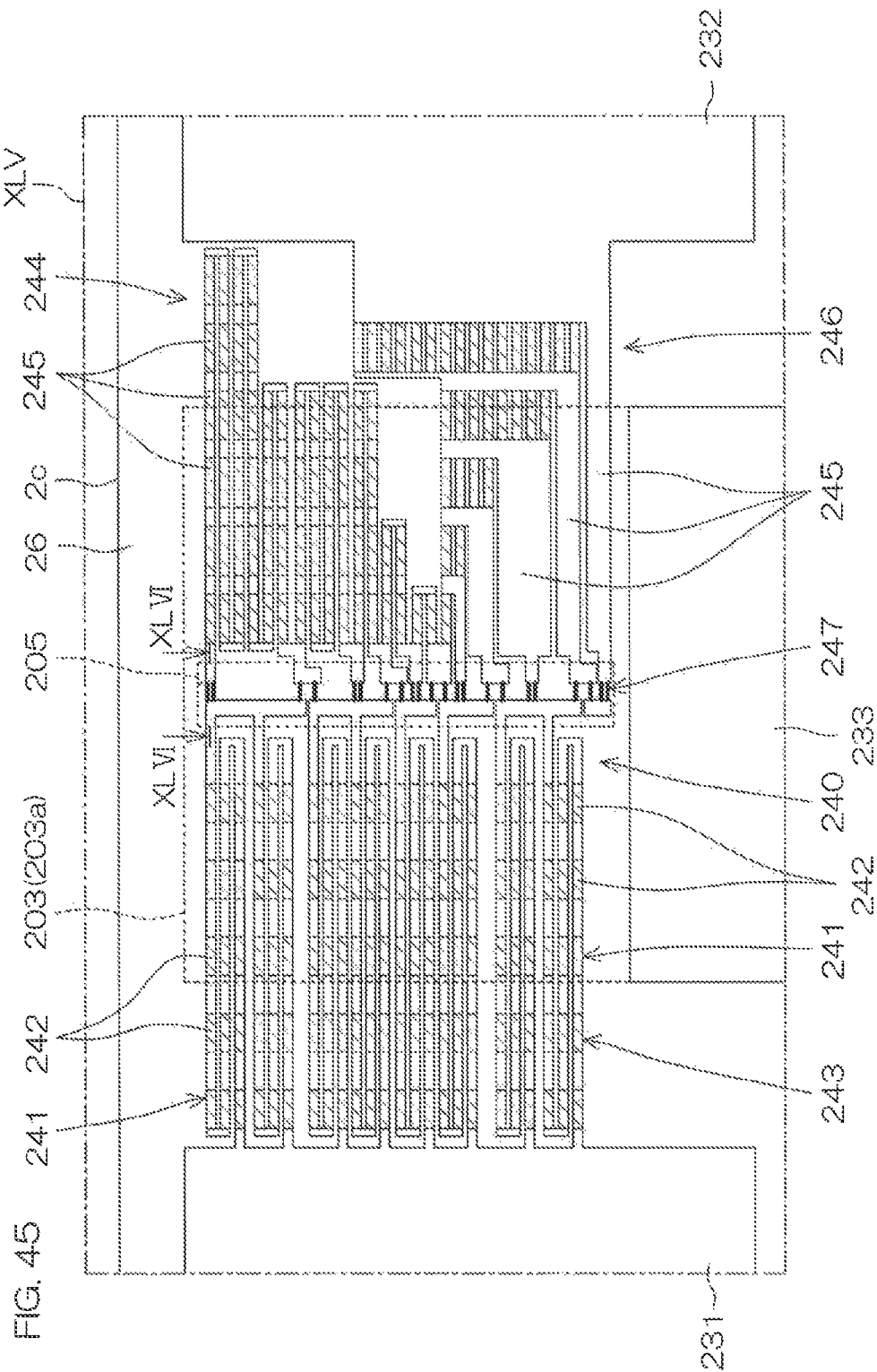
FIG. 45 is an enlarged view of a region surrounded by dashed-dotted lines XLV in FIG. 44.

Next, with reference to FIGS. 44, 45, the configuration of the second insulating film 26 covering the first insulating film 25 is described. FIG. 44 is a schematic plan view illustrating the configuration on the second insulating film 26 in the filter chip 200 shown in FIG. 38. FIG. 45 is an enlarged view of a region surrounded by dashed-dotted lines XLV in FIG. 44.

Referring to FIGS. 44, 45, the second insulating film 26 according to this variation is formed on the first insulating film 25 to cover the entire region of the first input electrode film 201, the first output electrode film 202 and the first ground electrode film 203. A pair of second input electrode films 231 (third electrode film) electrically connected to the previously described pair of input terminals 3a, a pair of second output electrode films 232 (fourth electrode film) electrically connected to the previously described pair of output terminals 3b, and a second ground electrode film 233 electrically connected to the previously described ground terminal 3c are formed on the second insulating film 26. The pair of second input electrode films 231 is disposed right below the pair of input terminals 3a; the pair of second output electrode films 232 is disposed right below the pair of output terminals 3b; and the second ground electrode film 233 is disposed right below the ground terminal 3c.

The pair of second input electrode films 231 in this variation is formed in a rectangular shape in plan view having four sides parallel to the longitudinal side surfaces 2c and the transversal side surfaces 2d of the substrate 2, and is formed spaced apart along the transversal side surface 2d at one end of the substrate 2 (left side end in FIG. 38). Each second input electrode film 231 is disposed right above the previously described first input electrode film 201. The pair of second output electrode films 232 in this variation is formed in a rectangular shape in plan view having four sides parallel to the longitudinal side surfaces 2c and the transversal side surfaces 2d of the substrate 2, and is formed spaced apart along the transversal side surface 2d at the other end of the substrate 2 (right side end in FIG. 38). Each second output electrode film 232 is disposed right above the previously described first output electrode film 202.

The second ground electrode films 233 in this variation is formed in a rectangular shape in plan view having four sides parallel to the longitudinal side surfaces 2c and the transversal side surfaces 2d of the substrate 2. The second ground electrode films 233 in this variation is disposed in the center region of the substrate 2 in plan view, that is, right above the second portion 203b of the previously described first ground electrode film 203. The second ground electrode films 233 faces the second input electrode film 231 and the second output electrode film 232 along the direction of the element forming surface 2a of the substrate 2.

Each second input electrode film 231 is electrically connected to the first input electrode film 201 right therebelow via a first contact hole 234 formed in the second insulating film 26. Also, each second output electrode film 232 is electrically connected to the first output electrode film 202 right therebelow via a second contact hole 235 formed in the second insulating film 26. Further, the second ground electrode films 233 is electrically connected to the first ground electrode film 203 right therebelow via a third contact hole 236 formed in the second insulating film 26.

The configurations of the first filter circuit forming region 12 and the configurations of the second filter circuit forming region 13 are substantially same even on the second insulating film 26. Hereinafter, the configurations of the first filter circuit forming region 12 are described as an example, and the description of the configurations of the second filter circuit forming region 13 is omitted by putting the same reference numeral as that of the configuration of the first filter circuit forming region 12 to each configuration of the second filter circuit forming region 13.

In the first filter circuit forming region 12, the second input electrode film 231 and the second output electrode film 232 are formed spaced apart from each other along the longitudinal side surfaces 2c of the substrate 2 and along the element forming surface 2a of the substrate 2.

Referring to FIG. 45, the resistor R is formed on the second insulating film 26 positioned between the second input electrode film 231 and the second output electrode film 232, including a resistive conductive film 240 electrically connected to the second input electrode film 231 and the second output electrode film 232. The resistive conductive film 240 in this variation is formed in the region partitioned by the second input electrode film 231, the second output electrode film 232 and the second ground electrode film 233, in the region between the second input electrode film 231 and the second output electrode film 232.

The resistive conductive film 240 is formed at a position overlapping the first ground electrode film 203 in plan view. The resistive conductive film 240 includes a first pattern 243 having a plurality of first resistor film lines 241 formed on the second insulating film 26 and a plurality of first conductor films 242 formed spaced apart from each other on the plurality of first resistor film lines 241. Further, the resistive conductive film 240 includes a second pattern 246 having a plurality of second resistor film lines 244 formed on the second insulating film 26 and a plurality of second conductor films 245 formed spaced apart from each other on the plurality of second resistor film lines 244.

Further, the resistive conductive film 240 according to this variation includes a fuse portion 247 cuttably provided to electrically connect a portion of the resistive conductive film 240 to the second input electrode film 231 and the second output electrode film 232 or to electrically separate a portion of the resistive conductive film 240 from the second input electrode film 231 and the second output electrode film 232. More specifically, the fuse portion 247 is positioned between the first pattern 243 and the second pattern 246 to separatably connect the first pattern 243 and the second pattern 246. The first pattern 243 and the second pattern 246 are connected in series with the fuse portion 247 interposed therebetween.

The configuration of the first resistor film line 241 and the first conductor film 242 in relation to the first pattern 243 and the configuration of the second resistor film line 244 and the second conductor film 245 in relation to the second pattern 246 are configuration elements corresponding to the resistor film line 52 and the conductor film 53 in the previously described first embodiment. Each configuration of the first resistor film line 241 and the first conductor film 242 in relation to the first pattern 243 and each configuration of the second resistor film line 244 and the second conductor film 245 in relation to the second pattern 246 are substantially the same as each configuration of the resistor film line 52 and the conductor film 53 in the previously described first embodiment except that aspects of formation and connection are different, and therefore the specific descriptions are omitted.

In the resistive conductive film 240, by selectively cutting the fuse portion 247, a portion of the first pattern 243 can be electrically connected to the second input electrode film 231 and the second output electrode film 232, or a portion of the first pattern 243 can be electrically separated from the second input electrode film 231 and the second output electrode film 232. Further, in the resistive conductive film 240, by selectively cutting the fuse portion 247, a portion of the second pattern 246 can be electrically connected to the second input electrode film 231 and the second output electrode film 232, or a portion of the second pattern 246 can be electrically separated from the second input electrode film 231 and the second output electrode film 232. In this way, the resistive conductive film 240 is configured to easily provide a wide range of resistance values from several ohms to several thousands of ohms.

Figure 46:
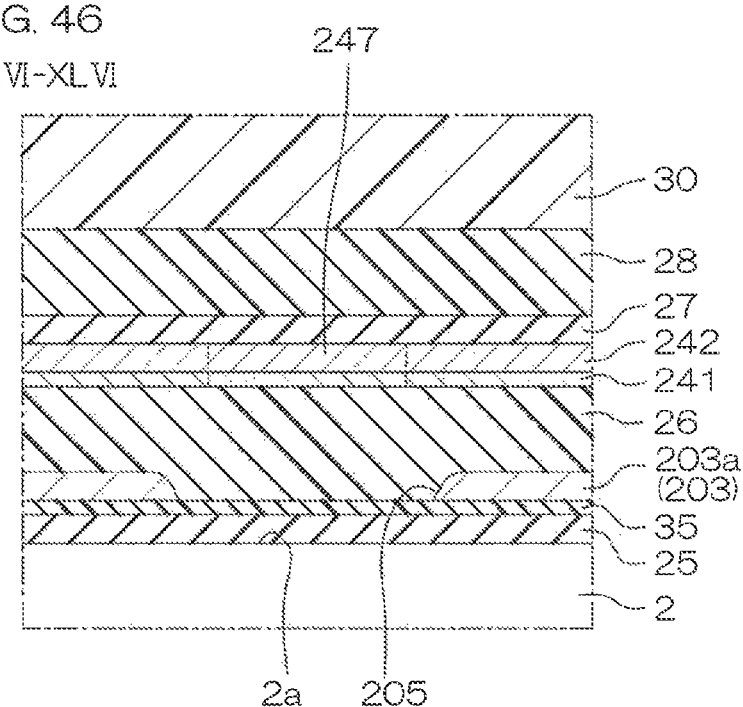
FIG. 46 is a vertical cross-sectional view along line XLVI-XLVI in FIG. 45, illustrating a state where a fuse portion is not cut.
Figure 47:
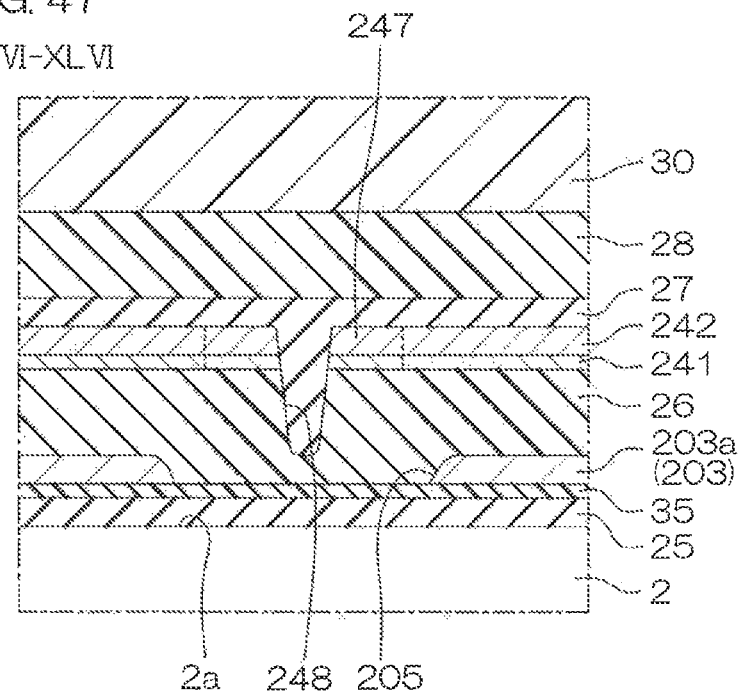
FIG. 47 is a vertical cross-sectional view of a portion corresponding to FIG. 46, illustrating a state where a fuse portion is cut.

Next, referring to FIGS. 46, 47 together, the arrangement of the fuse portion 247 of the resistive conductive film 240 is further specifically described. FIG. 46 is a vertical cross-sectional view along line XLVI-XLVI in FIG. 45, illustrating a state where the fuse portion 247 is not cut. FIG. 47 is a vertical cross-sectional view of a portion corresponding to FIG. 46, illustrating a state where the fuse portion 247 is cut.

Referring to FIG. 46, the second insulating film 26 is formed to fill the removal region 205 which is formed in the first portion 203a of the first ground electrode film 203 to thus cover the first portion 203a of the first ground electrode film 203. The fuse portion 247 of the resistive conductive film 240 is disposed at a position overlapping the previously described removal region 205 in plan view which is formed in the first portion 203a of the first ground electrode film 203.

Referring to FIG. 47, when the fuse portion 247 is melted by laser irradiation, since the first portion 203a of the first ground electrode film 203 does not exist in the region right below the fuse portion 247, the first portion 203a can be effectively prevented from being melted by the laser irradiation. Thereby, the area in plan view of the first portion 203a of the first ground electrode film 203 can be effectively prevented from being reduced by the melting of the first portion 203a, and thus the unwanted increase in the density of current that flows in the first portion 203a can be favorably avoided. Further, the previously described third insulating film 27 is formed on the second insulating film 26 so as to fill the melted portion 248 of the fuse portion 247 after the fuse portion 247 is melted, and thus a favorable insulating state between the first pattern 243 and the second pattern 246 can be maintained.

The first input electrode film 201 according to this variation is a configuration element corresponding to the first electrode film $20_{D1}$ according to the previously described first embodiment; the first output electrode film 202 according to this variation is a configuration element corresponding to the first electrode film $20_{D2}$ according to the previously described first embodiment; and the first ground electrode film 203 according to this variation is a configuration element corresponding to the second electrode films $21_{D2}$, $21_{D2}$ according to the previously described first embodiment. Further, the second input electrode film 231 according to this variation is a configuration element corresponding to the first electrode film $20_R$ according to the previously described first embodiment; and the second output electrode film 232 according to this variation is a configuration element corresponding to the second electrode film $21_R$ according to the previously described first embodiment.

Further, in this variation, the previously described first capacitor C1 is formed on the element forming surface 2a of the substrate 2 between the first input electrode film 201 and the first ground electrode film 203 so as to be electrically connected to the first input electrode film 201 and the first ground electrode film 203 via the first electrode film $20_{C1}$ and the second electrode film $20_{C2}$. Further, the previously described second capacitor C2 is formed on the element forming surface 2a of the substrate 2 between the first output electrode film 202 and the first ground electrode film 203 so as to be electrically connected to the first output electrode film 202 and the first ground electrode film 203 via the first electrode film $20_{C1}$ and the second electrode film $20_{C2}$.

It is to be understood that variations and modifications will be apparent to those skilled in the art without departing from the scope and spirit of the present invention. The following Features can be extracted from the specification and the drawings (FIGS. 38-47):

Item 1: A chip part including a substrate; a first electrode film and a second electrode film formed on the substrate spaced apart from each other so as to face each other in a direction along the surface of the substrate; a reference electrode film that covers a region between the first electrode film and the second electrode film, and is formed on the substrate so as to face the first electrode film and the second electrode film with a distance therebetween in a direction along the surface of the substrate; and a diode formed in the surface part of the substrate, interposed between at least either the first electrode film or the second electrode film and the reference electrode film, and electrically connected to the at least one electrode film and the reference electrode film.

In this chip part, the reference electrode film is formed in a region between the first electrode film and the second electrode film so as to cover the region between the first electrode film and the second electrode film. Therefore, the reference electrode film allows a relatively wide current path to be formed in the region between the first electrode film and the second electrode film, and thus even if electrical currents flow into the reference electrode film, such electrical currents can be prevented from concentrating locally at the reference electrode film. Thus, the occurrence of electric field concentration at the reference electrode film can be favorably suppressed, and thus a chip part capable of improving voltage resistance can be provided.

Item 2: A chip part described in item 1 wherein the reference electrode film covers a region outside the region between the first electrode film and the second electrode film in addition to the region between the first electrode film and the second electrode film.

Item 3: A chip part described in item 1 or 2, wherein the reference electrode film includes a first portion disposed in a region between the first electrode film and the second electrode film so as to cover the region between the first electrode film and the second electrode film, and a second portion disposed in a region outside the region between the first electrode film and the second electrode film, and the diode is formed in the surface part of the substrate between the at least one electrode film and the first portion of the reference electrode film.

Item 4: A chip part described in any one of items 1-3, wherein the diode includes a first impurity region of a first conductivity type formed in the surface part of the substrate, and a plurality of second impurity regions of a second conductivity type formed in the surface part of the first impurity region, arranged spaced apart from each other along a direction orthogonal to the facing direction between the first electrode film and the second electrode film.

Item 5: A chip part described in item 4, wherein the at least one electrode film includes a first belt-like portion extracted in a belt-like shape in plan view toward the reference electrode film so as to cover at least one of the plurality of second impurity regions, and the reference electrode film includes a second belt-like portion extracted toward the at least one electrode film so as to cover at least one second impurity region not covered by the first belt-like portion.

Item 6: A chip part described in item 5, wherein the at least one electrode film includes a plurality of the first belt-like portions extracted to cover a part of the plurality of second impurity regions, and the reference electrode film includes a plurality of the second belt-like portions extracted to cover a part of the plurality of second impurity regions, wherein the first belt-like portions of the at least one electrode film and the second belt-like portions of the reference electrode film are formed in a comb-like shape to engage with each other.

Item 7: A chip part described in any one of items 4-6, wherein the diode includes a first Zener diode formed by a p-n junction between the first impurity region and the second impurity region electrically connected to the at least one electrode film, and a second Zener diode formed by a p-n junction between the first impurity region and the second impurity region electrically connected to the reference electrode film and electrically connected to the first Zener diode via the first impurity region.

Item 8: A chip part described in item 7, wherein the diode includes a bidirectional Zener diode element formed along the orthogonal direction, and the bidirectional Zener diode element includes a pair of the first Zener diode and the second Zener diode formed adjacent to each other along the orthogonal direction.

Item 9: A chip part described in item 8, wherein eight or more of the bidirectional Zener diode elements are formed along the orthogonal direction.

Item 10: A chip part described in any one of items 4-9, wherein in the diode, the total perimeter of the plurality of second impurity regions defined by the total value of the perimeter of each second impurity region with respect to the surface of the substrate is 500 µm or greater.

Item 11: A chip part described in any one of items 1-10, wherein the electrostatic discharge tolerance of the diode is 8 kV or greater.

Item 12: A chip part described in any one of items 1-11, wherein a low-pass filter circuit is formed between the first electrode film and the second electrode film, the diode forms an overvoltage protection circuit for protecting the low-pass filter from an overvoltage.

Item 13: A chip part described in any one of items 1-12, further including an insulating film formed on the substrate so as to cover at least the reference electrode film, a third electrode film and a fourth electrode film formed on the insulating film spaced apart from each other, facing each other in a direction along the surface of the substrate, and a resistive conductive film formed on the insulating film to be electrically connected to the third electrode film and the fourth electrode film.

Item 14: A chip part described in item 13, wherein the resistive conductive film is formed to overlap the reference electrode film in plan view.

Item 15: A chip part described in 13 or 14, the resistive conductive film has a fuse portion cuttably provided to electrically connect a part of the resistive conductive film to the third electrode film and the fourth electrode film, or to electrically separate a part of the resistive conductive film from the third electrode film and the fourth electrode film.

Item 16: A chip part described in item 15, wherein a removal region from which a part of the electrode material of the reference electrode film is removed is selectively formed in the reference electrode film; the insulating film fills the removal region and covers the reference electrode film; and the fuse portion of the resistive conductive film is disposed at a position overlapping the removal region of the reference electrode film in plan view.

Item 17: A chip part described in item 16, wherein a ratio of the area that the removal region occupies in the reference electrode film in plan view is smaller than a ratio of the area that a region outside the removal region occupies in the reference electrode film in plan view.

Item 18: A chip part described in any one of items 15-17, wherein the resistive conductive film includes a first pattern including a first resistor film formed on the insulating film and a plurality of first conductor films formed spaced apart from each other on the first resistor film, and a second pattern including a second resistor film formed on the insulating film and a plurality of second conductor films formed spaced apart from each other on the second resistor film, wherein the first pattern and the second pattern are electrically connected to each other via the fuse portion.

Item 19: A chip part described in any one of items 13-18, wherein the third electrode film is electrically connected to the first electrode film via a first contact hole formed in the insulating film; the fourth electrode film is electrically connected to the second electrode film via a second contact hole formed in the insulating film; and the diode and the resistive conductive film are electrically connected to each other.

What is claimed is:

1. A filter chip comprising:
 a substrate;
 a plurality of external terminals formed on the substrate for external connection; and
 a plurality of passive element forming regions provided in regions between the plurality of external terminals in plan view when viewed along a direction normal to a surface of the substrate, the plurality of passive element forming regions including at least a resistor forming region where a resistor is formed,
 wherein the resistor forming region includes
  a resistive conductive film formed on the substrate with one end and another end thereof electrically connected to different ones of the external terminals, and
  a fuse portion integrally formed with the resistive conductive film, the fuse portion cuttably provided to electrically connect a part of the resistive conductive film to the external terminals, or to electrically separate the part of the resistive conductive film from the external terminals,
 wherein the resistive conductive film includes
  a resistor film formed on the substrate, and
  a plurality of conductor films formed on the resistor film with a distance therebetween, and
 wherein a portion of the resistor film exposed between conductor films of the plurality of conductor films which are adjacent to each other constitutes a resistive element.

2. A filter chip according to claim 1, wherein the resistive conductive film includes a portion formed in a zig-zag pattern.

3. A filter chip according to claim 1, wherein
 the resistor film includes a plurality of the resistive elements, and
 the fuse portion is provided to electrically connect at least one of the plurality of the resistive elements to at least one of the external terminals or to electrically separate at least one of the resistive elements from at least one of the external terminals.

4. A filter chip according to claim 3, wherein the plurality of the resistive elements each have the same resistance value and are arranged in a matrix on the substrate.

5. A filter chip according to claim 1, wherein
 the plurality of passive element forming regions includes a capacitor forming region where a capacitor is formed,
 the capacitor forming region including a dielectric film, and a lower electrode and an upper electrode provided to sandwich the dielectric film and being electrically connected to different ones of the external terminals.

6. A filter chip according to claim 5, wherein the upper electrode includes a plurality of electrode film portions separately formed to face the lower electrode with mutually different facing areas, and a capacitor-side fuse portion cuttably provided to electrically separate the electrode film portions from the external terminal.

7. A filter chip according to claim 5, wherein a low-pass filter including the resistor and the capacitor is formed.

8. A filter chip according to claim 5, wherein a high-pass filter including the resistor and the capacitor is formed.

9. A filter chip according to claim 1, wherein
 the plurality of passive element forming regions
 includes a coil forming region where a coil is formed,
 the coil forming region including a coil conductor formed in a spiral shape in plan view when viewed along a direction normal to the surface of the substrate with one end and another end thereof electrically connected to different ones of the external terminals.

10. A filter chip according to claim 9, wherein the coil conductor is embedded in a trench formed in the substrate in the spiral shape in plan view.

11. A filter chip according to claim 9, wherein the coil forming region includes a first electrode and a second electrode electrically connected to different ones of the external terminals and being formed spaced apart from each other to be electrically connected to the one end and the another end of the coil conductor,
 the first electrode including
  a plurality of extraction electrodes extracted toward a plurality of different portions of the coil conductor and connected to the plurality of different portions of the coil conductor, and a second fuse portion integrally formed with each of the extraction electrodes, cuttably provided to electrically separate the plurality of different portions of the coil conductor from each of the external terminals.

12. A filter chip according to claim 9, wherein a low-pass filter including the resistor and the coil is formed.

13. A filter chip according to claim 9, wherein a high-pass filter including the resistor and the coil is formed.

14. A filter chip according to claim 1, wherein the plurality of passive element forming regions includes a capacitor forming region where a capacitor is formed, and a coil forming region where a coil is formed.

15. A filter chip according to claim 14, wherein a low-pass filter including the resistor, the capacitor and the coil is formed.

16. A filter chip according to claim 14, wherein a high-pass filter including the resistor, the capacitor and the coil is formed.

17. A filter chip comprising:
a substrate;
a plurality of external terminals formed on the substrate for external connection; and
a plurality of passive element forming regions provided in regions between the plurality of external terminals in plan view when viewed along a direction normal to a surface of the substrate, the plurality of passive element forming regions including at least a capacitor forming region where a capacitor is formed and a resistor forming region where a resistor is formed,
wherein the capacitor forming region includes
a lower electrode electrically connected to an external terminal,
an upper electrode electrically connected to a second external terminal different from the external terminal to which the lower electrode is connected, the upper electrode including a plurality of electrode film portions, separately formed to face the lower electrode with mutually different facing areas, and a fuse portion cuttably provided to electrically separate each of the electrode film portions from the second external terminal, and
a dielectric film interposed between the lower electrode and the upper electrode,
wherein the resistor forming region includes
a resistive conductive film formed on the substrate with one end and another end thereof electrically connected to different ones of the external terminals, and
a fuse portion integrally formed with the resistive conductive film, the fuse portion cuttably provided to electrically connect a part of the resistive conductive film to the external terminals, or to electrically separate the part of the resistive conductive film from the external terminals,
wherein the resistive conductive film includes
a resistor film formed on the substrate, and
a plurality of conductor films formed on the resistor film with a distance therebetween, and
wherein a portion of the resistor film exposed between conductor films of the plurality of conductor films which are adjacent to each other constitutes a resistive element.

18. A filter chip comprising:
a substrate;
a plurality of external terminals formed on the substrate for external connection; and
a plurality of passive element forming regions provided in regions between the plurality of external terminals in plan view when viewed along a direction normal to a surface of the substrate, the plurality of passive element forming regions including at least a resistor forming region where a resistor is formed,
wherein the resistor forming region includes
a resistive conductive film formed on the substrate with one end and another end thereof electrically connected to different ones of the external terminals, and
a fuse portion integrally formed with the resistive conductive film, the fuse portion cuttably provided to electrically connect a part of the resistive conductive film to the external terminals, or to electrically separate the part of the resistive conductive film from the external terminals,
wherein the plurality of passive element forming regions includes a capacitor forming region where a capacitor is formed,
wherein the capacitor forming region including a dielectric film, and a lower electrode and an upper electrode provided to sandwich the dielectric film, electrically connected to different ones of the external terminals, and
wherein the resistor and the capacitor form at least a part of a high-pass filter.

19. A filter chip comprising:
a substrate;
a plurality of external terminals formed on the substrate for external connection; and
a plurality of passive element forming regions provided in regions between the plurality of external terminals in plan view when viewed along a direction normal to a surface of the substrate, the plurality of passive element forming regions including at least a resistor forming region where a resistor is formed,
wherein the resistor forming region includes
a resistive conductive film formed on the substrate with one end and another end thereof electrically connected to different ones of the external terminals, and
a fuse portion integrally formed with the resistive conductive film, the fuse portion cuttably provided to electrically connect a part of the resistive conductive film to the external terminals, or to electrically separate the part of the resistive conductive film from the external terminals,
wherein the plurality of passive element forming regions includes a capacitor forming region where a capacitor is formed,
wherein the capacitor forming region including a dielectric film, and a lower electrode and an upper electrode provided to sandwich the dielectric film and being electrically connected to different ones of the external terminals, and
wherein the resistor and the capacitor form at least a part of a low-pass filter.

* * * * *